US007358032B2

(12) United States Patent
Maemoto

(10) Patent No.: US 7,358,032 B2
(45) **Date of Patent: *Apr. 15, 2008**

(54) PLANOGRAPHIC PRINTING PLATE PRECURSOR

(75) Inventor: Kazuo Maemoto, Shizuoka-ken (JP)

(73) Assignee: FUJIFILM Corporation, Tokyo (JP)

(*) Notice: Subject to any disclaimer, the term of this patent is extended or adjusted under 35 U.S.C. 154(b) by 325 days.

This patent is subject to a terminal disclaimer.

(21) Appl. No.: 10/701,686

(22) Filed: Nov. 6, 2003

(65) Prior Publication Data

US 2004/0101780 A1 May 27, 2004

(30) Foreign Application Priority Data

| | | |
|---|---|---|
| Nov. 8, 2002 | (JP) | 2002-325280 |
| Nov. 8, 2002 | (JP) | 2002-325282 |
| Nov. 18, 2002 | (JP) | 2002-333942 |
| Feb. 3, 2003 | (JP) | 2003-025929 |

(51) Int. Cl.
*G03F 7/039* (2006.01)
*G03F 7/09* (2006.01)
*G03F 7/095* (2006.01)

(52) U.S. Cl. .............................. 430/271.1; 430/270.1; 430/302; 430/944; 430/906

(58) Field of Classification Search ............ 430/271.1, 430/302, 944

See application file for complete search history.

(56) References Cited

U.S. PATENT DOCUMENTS

| | | | | |
|---|---|---|---|---|
| 6,040,113 | A | 3/2000 | Van Damme et al. | |
| 6,153,353 | A | 11/2000 | Van Damme et al. | |
| 6,235,451 | B1 | 5/2001 | Damme et al. | |
| 6,238,838 | B1 * | 5/2001 | Gaschler et al. | 430/278.1 |
| 6,340,551 | B1 * | 1/2002 | Miyake et al. | 430/192 |
| 6,352,811 | B1 | 3/2002 | Patel et al. | |
| 6,352,812 | B1 | 3/2002 | Shimazu et al. | |
| 6,573,022 | B1 | 6/2003 | Miyake et al. | |
| 6,627,386 | B2 | 9/2003 | Aoshima | |
| 6,824,947 | B2 * | 11/2004 | Ishizuka et al. | 430/157 |
| 6,858,359 | B2 | 2/2005 | Kitson et al. | |
| 6,919,166 | B2 * | 7/2005 | Takamiya | 430/302 |

FOREIGN PATENT DOCUMENTS

| | | | |
|---|---|---|---|
| EP | 0 800 928 | A1 | 10/1997 |
| EP | 1-111-467 | A1 | 6/2001 |
| EP | 1 211 065 | A2 | 6/2002 |
| EP | 1 262 318 | A2 | 12/2002 |
| EP | 1 270 218 | A2 | 1/2003 |
| EP | 1 275 498 | A2 | 1/2003 |
| EP | 1 433 594 | A2 | 6/2004 |
| JP | 10-3165 | A | 1/1998 |
| JP | 11-218914 | A | 8/1999 |
| JP | 2001-133966 | A | 5/2001 |
| JP | 2002-229186 | * | 8/2002 |
| JP | 2002-278057 | A | 9/2002 |
| JP | 2002-357897 | * | 12/2002 |
| JP | 2003-5354 | A | 1/2003 |
| WO | WO 03/074287 | A1 | 9/2003 |

OTHER PUBLICATIONS

English abstract for JP 2002-357897 (by JPO).*
English abstract for JP 2002-229186 (by JPO).*

* cited by examiner

*Primary Examiner*—Sin Lee
(74) *Attorney, Agent, or Firm*—Sughrue Mion Pllc.

(57) ABSTRACT

A planographic printing plate precursor includes a support having disposed thereon a recording layer containing a water-insoluble and alkali-soluble resin, a development inhibitor and an infrared absorber and exhibiting enhanced solubility in an aqueous alkali solution through light exposure. The recording layer may have either a mono-layer construction or a multi-layer construction containing a lower layer and an upper layer. In the case of the multi-layer construction, a layer containing the water-insoluble and alkali-soluble resin is used as the lower layer, and a layer containing the water-insoluble and alkali-soluble resin and the development inhibitor and exhibiting enhanced solubility in an aqueous alkali solution through light exposure is used as the upper layer, and at least one of the lower layer and the upper layer contains the infrared absorber.

16 Claims, 4 Drawing Sheets

PLANOGRAPHIC PRINTING PLATE PRECURSOR

CROSS-REFERENCE TO RELATED APPLICATION

This application claims priority under 35 USC 119 from Japanese Patent Application Nos. 2002-325280, 2002-325282, 2002-333942 and 2003-25929, the disclosures of which are incorporated herein by reference.

BACKGROUND OF THE INVENTION

1. Field of the Invention

The present invention relates to a planographic printing plate precursor that can be used as an offset printing master, and more particularly, it relates to a so-called positive-type planographic printing plate precursor for direct plate-making capable of forming a printing plate directly from digital data of a computer or the like.

2. Description of the Related Art

Advances in laser technology have been remarkable in recent years, and in particular, solid lasers and semiconductor lasers that have near infrared to infrared emitting regions, and that have high power and are compact are readily available. These laser devices are significantly useful as exposure light sources for direct plate-making from digital data of a computer or the like in the field of planographic printing.

A positive-type planographic printing plate precursor used with an infrared laser contains, as essential components, an alkali-soluble binder resin and an IR dye or the like which generates heat through light absorption. The IR dye or the like functions as a development inhibitor, which substantially decrease solubility of the binder resin in a developer through interaction with the binder resin, in an unexposed portion (i.e., an image area), and on the other hand, the interaction between the IR dye or the like and the binder resin is diminished in an exposed portion (i.e., a non-image area) to make the IR dye or the like dissolve in the alkali developer, whereby a planographic printing plate is formed.

Since the image forming ability of the positive-type planographic printing plate precursor used with the infrared laser depends on heat generation caused by irradiation with the infrared laser on a surface of a recording layer, the amount of heat used for forming images, i.e., solubilization of the recording layer, is lowered due to heat diffusion to the support in the vicinity thereof, to thereby lower the sensitivity. Therefore, a problem arises in that an effect for losing development inhibiting function of the recording layer is not sufficiently obtained in the non-image area, and consequently, the difference between the image area and the non-image area decreases to cause insufficient reproducibility in highlight portion.

In order to solve the problem associated with reproducibility in highlight portion, it has been proposed to use a recording layer comprising a material that allows the non-image area to be readily developed, i.e., that exhibits good solubility in an aqueous alkali solution. However, such a recording layer becomes low in chemical ability even in the image area to thereby pose a problem of deteriorated chemical resistance, such as becoming susceptible to damage by the action of the developer as well as an ink cleaner and a plate cleaner used upon printing. Accordingly, there has been a strong demand for a resin material that is excellent in chemical resistance and durability of a film prepared therefrom in the non-exposed area, and excellent in developing ability after having undergone light exposure and thereby losing solubility inhibiting function.

It is difficult to solve the aforementioned problems when a mono-layer type recording layer is adopted by selecting the alkali-soluble resin and other components. Thus, a planographic printing plate precursor is disclosed that has a recording layer having a lower layer which is excellent in alkali-solubility due to inclusion of a polyvinylphenol resin and a upper layer which contains a water-insoluble and alkali-soluble resin and an infrared absorber, and which exhibits enhanced solubility in an aqueous alkali solution through light exposure (see, for example, Japanese Patent Application Laid-Open (JP-A) No. 10-250255). However, this planographic printing plate precursor is still insufficient in chemical resistance, although sensitivity thereof is improved. Furthermore, there remains a problem in that adhesiveness between the support and the recording layer is insufficient, and hence printing durability is poor.

A variety of improved techniques have been proposed in order to attain similar objects, including that of making an image forming material by laminating a lower layer which contains a copolymer having a particular monomer and a photosensitive upper layer on a support (see, for example, JP-A No. 11-218914), and that of a process for producing a printing plate using a planographic printing plate precursor formed by laminating a lower layer which contains an alkali-soluble resin and an infrared sensitive and alkali developable upper layer on a hydrophilic support (see, for example, JP-A No. 11-194483). However, the former has a problem in that the resin used in the lower layer, although having good sensitivity and excellent chemical resistance, is insufficient in film strength to leave room for improvement in printing durability, while the latter has a problem in that, due to low chemical resistance of the alkali-soluble resin used, the recording layer is eluted with a solvent component included in a plate cleaner, and the solvent component penetrates into the interface between the lower layer and the support to thereby impair adhesiveness between the recording layer and the substrate, facilitating peelability of the recording layer. Thus, it has been difficult to satisfy both printing durability, which depends on the film strength of the lower layer, and chemical resistance.

SUMMARY OF THE INVENTION

The present invention has been made in view of the aforementioned problems associated with the conventional art, and an object thereof is to provide a positive-type planographic printing plate precursor that can directly form a printing plate by scanning exposure based on digital data and is excellent both in printing durability and chemical resistance.

The inventor conducted extensive research and found that the above object may be achieved by providing, as a recording layer of a planographic printing plate precursor, a lower layer containing a polyurethane resin. The inventor also found that the above object may be achieved by selecting, as a component of the recording layer of the planographic printing plate precursor, a polyimide precursor resin having a particular structure, a water-insoluble and alkali-soluble resin having a urea bond in the polymer main chain, or a water-insoluble and alkali-soluble resin having an amide bond in the polymer main chain, and thereby accomplished the present invention.

A first aspect of the invention is a planographic printing plate precursor which comprises a support having disposed thereon a recording layer that includes a lower layer containing a water-insoluble and alkali-soluble polyurethane resin, and an upper layer containing a water-insoluble and alkali-soluble resin and a development inhibitor and exhibiting enhanced solubility in an aqueous alkali solution through light exposure, wherein at least one of the lower layer and the upper layer of the recording layer contains an infrared absorber.

A second aspect of the invention is a planographic printing plate precursor which comprises a support having disposed thereon a recording layer that contains a polyimide precursor resin containing a structural unit represented by the following formula (1) and exerting water-insolubility and alkali-solubility, a development inhibitor and an infrared absorber, and exhibits enhanced solubility in an aqueous alkali solution through light exposure:

Formula (1)

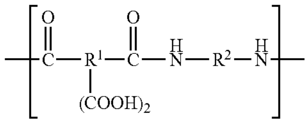

wherein $R^1$ represents a linking group containing at least one aromatic ring to which a —COOH group directly bonds; and $R^2$ represents an alkylene group, an arylene group or an aralkylene group.

A third aspect of the invention is a planographic printing plate precursor which comprises a support having disposed thereon a recording layer that includes a lower layer containing a polyimide precursor resin having a structural unit represented by formula (1) and exerting water-insolubility and alkali-solubility, and an upper layer containing a water-insoluble and alkali-soluble resin and a development inhibitor and exhibiting enhanced solubility in an aqueous alkali solution through light exposure, wherein at least one of the lower layer and the upper layer of the recording layer contains an infrared absorber.

A fourth aspect of the invention is a planographic printing plate precursor which comprises a support having disposed thereon a recording layer that contains a water-insoluble and alkali-soluble resin having a urea bond in a polymer main chain, a development inhibitor and an infrared absorber, and exhibits enhanced solubility in an aqueous alkali solution through light exposure.

A fifth aspect of the invention is a planographic printing plate precursor which comprises a support having disposed thereon a recording layer that includes a lower layer containing a water-insoluble and alkali-soluble resin having a urea bond in a polymer main chain, and an upper layer containing a water-insoluble and alkali-soluble resin and a development inhibitor and exhibiting enhanced solubility in an aqueous alkali solution through light exposure, wherein at least one of the lower layer and the upper layer of the recording layer contains an infrared absorber.

A sixth aspect of the invention is a planographic printing plate precursor which comprises a support having disposed thereon a recording layer that contains a water-insoluble and alkali-soluble resin having an amide bond in a polymer main chain, a development inhibitor and an infrared absorber, and exhibits enhanced solubility in an aqueous alkali solution through light exposure.

A seventh aspect of the invention is a planographic printing plate precursor which comprises a support having disposed thereon a recording layer that includes a lower layer containing a water-insoluble and alkali-soluble resin having an amide bond in a polymer main chain, and an upper layer containing a water-insoluble and alkali-soluble resin and a development inhibitor and exhibiting enhanced solubility in an aqueous alkali solution through light exposure, wherein at least one of the lower layer and the upper layer of the recording layer contains an infrared absorber.

While the exact mechanism by which the invention functions is not completely understood, it is presumed to be as follows.

The alkali-soluble resin used in the recording layer of the planographic printing plate precursor according to the invention (hereinafter, sometimes referred to as a "particular alkali-soluble resin") is excellent in film strength even in case where it is solely formed into a film, thus contributing to improved printing durability. Since the resin is also excellent in dissolving resistance in an organic solvent or the like as compared to conventionally known acrylic alkali-soluble resins, it is not susceptible to damage by the action of a plate cleaner or the like. Furthermore, in the area where the development inhibiting effect is lost through light exposure (i.e., the non-image area), excellent solubility of the resin material itself is manifested owing to presence of the alkali-soluble group, to thus allow formation of images having high quality without producing a residual film.

When the particular alkali-soluble resin is used in the lower layer of a multi-layered recording layer, high film strength and high chemical resistance are effectively exerted in the image area, i.e., the area where the upper layer of the recording layer exists as an alkali development resistive layer, whereby excellent printing durability and chemical resistance are exerted. In the non-image area, on the other hand, the resin is quickly dissolved and dispersed in the alkali developer owing to the alkali-solubility thereof after the upper layer has been removed. Therefore, undesired dissolution of the lower layer may be prevented by increasing the alkali resistance of the upper layer even when a resin having high alkali-solubility is used as a component of the lower layer.

Accordingly, in a case where the recording layer of the planographic printing plate precursor according to the invention has a multi-layer construction, it can exert higher sensitivity and excellent alkali resistance as compared with a mono-layer construction, and as a result, printing durability and chemical resistance, which are advantageous effects of the present invention, are significantly exhibited.

DETAILED DESCRIPTION OF THE INVENTION

Figure 1:
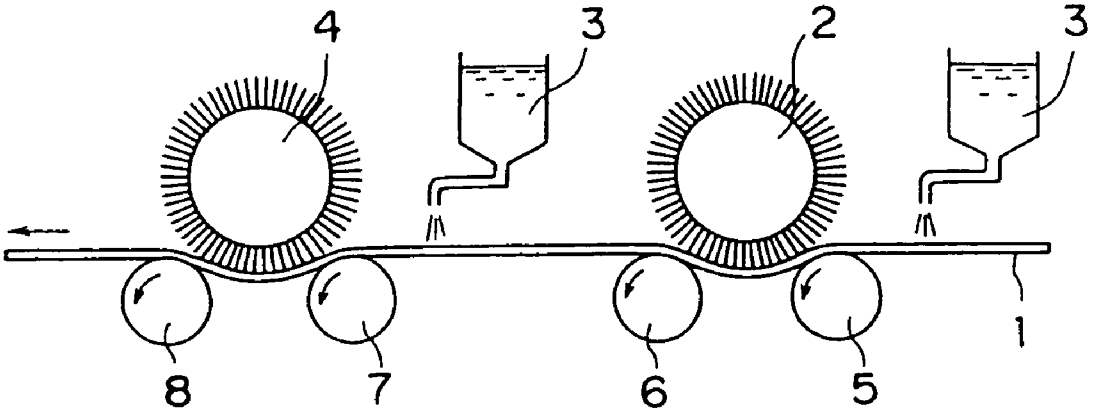
FIG. 1 is a schematic constitutional view showing an example of a mechanical surface-roughening apparatus used for producing a support of a planographic printing plate precursor according to the present invention.

A planographic printing plate precursor according to the present invention will be explained in detail below by referring to respective features characterizing each of the first to seventh aspects. Thereafter, characteristic features that are common to the planographic printing plate precursors according to all of the aspects will be described.

Planographic Printing Plate Precursor According to First Aspect

The planographic printing plate precursor according to the first aspect of the invention comprises a support having disposed thereon a recording layer that includes a lower layer containing a water-insoluble and alkali-soluble polyurethane resin, and an upper layer containing a water-insoluble and alkali-soluble resin and a development inhibitor and exhibiting enhanced solubility in an aqueous alkali solution through light exposure, wherein at least one of the lower layer and the upper layer of the recording layer contains an infrared absorber.

<Lower Layer Containing Water-insoluble and Alkali-soluble Polyurethane Resin>

The lower layer of the planographic printing plate precursor according to the first aspect contains a water-insoluble and alkali-soluble polyurethane resin. The polyurethane resin used herein is not particularly limited insofar as it is insoluble in water and soluble in an aqueous alkali solution. In particulaar, the polyurethane resin having a carboxyl group in the polymer main chain is preferred. Specific examples thereof include a polyurethane resin having, as a basic skeleton, a reaction product of a diisocyanate compound represented by the following formula (I) and a diol compound having a carboxyl group represented by the following formula (II) or (III):

Formula (I)

$$OCN—R^1—NCO$$

Formula (II)

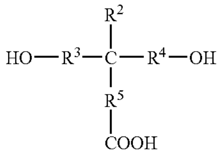

Formula (III)

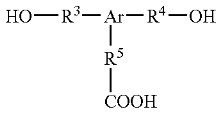

In the general formula (I), $R^1$ represents a divalent linking group. Examples of the divalent linking group include an aliphatic hydrocarbon, an alicyclic hydrocarbon and an aromatic hydrocarbon, and preferred examples thereof include an alkylene group having from 2 to 10 carbon atoms and an arylene group having from 6 to 30 carbon atoms. The arylene group may be one having two or more cyclic structures connected through a single bond or a divalent organic linking group, such as a methylene group, and one having a condensed polycyclic structure. The group represented by $R^1$ may have, depending on necessity, another functional group that does not react with the isocyanate group in formula (I), such as an ester group, an urethane group, an amide group and an ureido group.

The group represented by $R^1$ may have a substituent, and examples of the substituent that may be introduced include those inert with respect to the isocyanate group, such as a halogen atom (such as —F, —Cl, —Br or —I), an alkyl group, an alkoxy group, an alkyl ester group and a cyano group.

As the diisocyanate compound used in the planographic printing plate precursor according to the first aspect of the invention, compounds outside the scope of formula (I) may also be used, for example, a high molecular weight diisocyanate compound containing a polymer compound, such as an oligomer or a polymer containing a diol compound described later, with isocyanate groups bonded to both ends thereof.

In formula (II), $R^2$ represents an alkyl group, an aralkyl group, an aryl group, an alkoxy group or an aryloxy group. The group represented by $R^2$ may have a substituent, and examples of the substituent that may be introduced include a cyano group, a nitro group, a halogen atom (such as —F, —Cl, —Br or —I), $—CONH_2$, $—COOR^6$, $—OR^6$, $—NHCONHR^6$, $—NHCOOR^6$, $—NHCOR^6$, $—OCONHR^6$ and $—CONHR^6$ (wherein $R^6$ represents an alkyl group having from 1 to 10 carbon atoms or an aralkyl group having from 7 to 15 carbon atoms).

Preferred examples of the group represented by $R^2$ include an unsubstituted alkyl group having from 1 to 8 carbon atoms and an unsubstituted aryl group having from 6 to 15 carbon atoms.

In formulae (II) and (III), $R^3$, $R^4$ and $R^5$, which may be the same or different, each represents a single bond or a divalent linking group. Examples of the divalent linking group include an aliphatic hydrocarbon and an aromatic hydrocarbon. The groups represented by $R^3$, $R^4$ and $R^5$ may have a substituent, and examples of the substituent that may be introduced include an alkyl group, an aralkyl group, an aryl group, an alkoxy group and a halogen atom (such as —F, —Cl, —Br or —I).

Preferred examples of the groups represented by $R^3$, $R^4$ and $R^5$ include an unsubstituted alkylene group having from 1 to 20 carbon atoms and an unsubstituted arylene group having from 6 to 15 carbon atoms, and more preferred examples thereof include an unsubstituted alkylene group having from 1 to 8 carbon atoms. The groups represented by $R^3$, $R^4$ and $R^5$ may have, depending on necessity, another functional group that does not react with the isocyanate group, such as an ester group, an urethane group, an amide group, an ureido group and an ether group.

Two or three of the groups represented by $R^2$, $R^3$, $R^4$ and $R^5$ may be connected to each other to form a cyclic structure.

In formula (III), Ar represents a trivalent aromatic hydrocarbon, which may have a substituent, and preferably an arylene group having from 6 to 15 carbon atoms.

Specific examples of the diisocyanate compound represented by formula (I) include those described below, but the invention is not limited thereto.

Specific examples thereof include an aromatic diisocyanate compound, such as 2,4-tolylene diisocyanate, a dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; an aliphatic diisocyanate compound, such as hexamethylene diisocyanate, trimethylhexamethylene diisocyanate, lysine diisocyanate and dimer acid diisocyanate; an alicyclic diisocyanate, such as isophorone diisocyanate, 4,4'-methylene bis(cyclohexylisocyanate), methylcyclohexane-2,4(or 2,6)-diisocyanate and 1,3-(isocyanatemethyl)cyclohexane; and a diisocyanate compound as a reaction product of a diol and a diisocyanate, such as an adduct of 1 mole of 1,3-butylene glycol and 2 mole of tolylene diisocyanate.

Among these, those having an aromatic ring, such as 4,4'-diphenylmethane diisocyanate, xylylene diisocyanate and tolylene diisocyanate, are preferred from the standpoint of printing durability.

Specific examples of the diol compound having a carboxyl group represented by formula (II) or (III) include those described below, but the invention is not limited thereto.

Specific examples thereof include 3,5-dihydroxybenzoic acid, 2,2-bis(hydroxymethyl)propionic acid, 2,2-bis(hydroxyethyl)propionic acid, 2,2-bis(3-hydroxypropyl)propionic acid, 2,2-bis(hydroxymethyl) acetic acid, bis(4-hydroxyphenyl)acetic acid, 4,4-bis(4-hydroxyphenyl)pentanoic acid and tartaric acid.

Among these, 2,2-bis(hydroxymethyl)propionic acid and 2,2-bis(hydroxyethyl)propionic acid are preferred from the standpoint of reactivity with the isocyanate.

The polyurethane resin used in the planographic printing plate precursor according to the first aspect may be one produced using two or more kinds each of the diisocyanate compounds represented by formula (I) and the diol compounds having a carboxyl group represented by formula (II) or (III).

In addition to the diol compound having a carboxyl group represented by formula (II) or (III), another diol compound, which has no carboxyl group but may have a substituent that does not react with the diisocyanate group in the compound represented by formula (I), may be used in such an amount that does not impair the alkali developing property.

Specific examples of the diol compound include those listed below.

Specific examples thereof include ethylene glycol, propylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrated bisphenol A, hydrated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrated bisphenol A, a propylene oxide adduct of hydrated bisphenol A, hydroquinone hydroxyethyl ether, p-xylylene glycol, dihydroxyethylsulfone, bis(2-hydroxyethyl)-2,4-tolylenedicarbamate, 2,4-tolylene-bis(2-hydroxyethylcarbamide), bis(2-hydroxyethyl)-m-xylylenecarbamate and bis(2-hydroxyethyl)phthalate.

The polyurethane resin used in the planographic printing plate precursor according to the first aspect may be synthesized in such a manner that the diisocyanate compound and the diol compound are heated in an aprotic solvent in the presence of a known catalyst that has an activity corresponding to the reactivity thereof.

The molar ratio of the isocyanate compound and the diol compound used herein is preferably from 0.8/1 to 1.2/1. In case where an isocyanate group remains at one end of the resulting polymer, it is treated with an alcohol or an amine to finally obtain a polymer having no isocyanate group remained.

The polyurethane resin used in the planographic printing plate precursor according to the first aspect preferably has an aromatic skeleton from the standpoint of chemical resistance.

The polyurethane resin preferably has a molecular weight in terms of weight average of 1,000 or more, and more preferably in a range of from 5,000 to 100,000. The polyurethane resin may be used singly or in combination of two or more thereof.

The content of the polyurethane resin present in the components of the lower layer of the planographic printing plate precursor according to the first aspect is generally about from 50 to 99.5% by mass, and preferably about from 55 to 95% by mass, based on the total solid content.

In the components of the lower layer of the planographic printing plate precursor according to the first aspect, another resin may be used in combination in such an extent that does not impair the effect of the invention. Since the lower layer itself must exert alkali-solubility in the non-image area, it is necessary to select the resin so as to prevent the characteristics from being impaired. Examples of the resin that may be used in combination from such a standpoint include a water-insoluble and alkali-soluble resin. While ordinary water-insoluble and alkali-soluble resins will be described in detail later, preferred examples among these include a polyamide resin, an epoxy resin, a polyacetal resin, an acrylic resin, a methacrylic resin, a polystyrene resin and a novolak type phenol resin.

The mixing amount thereof is preferably 50% by mass or less relative to the polyurethane resin.

Planographic Printing Plate Precursor According to Second and Third Aspects

The planographic printing plate precursor according to the second and third aspects of the invention comprises a support having disposed thereon a recording layer that contains a polyimide precursor resin having a structural unit represented by formula (1) and exerting water-insolubility and alkali-solubility, a development inhibitor and an infrared absorber, and exhibits enhanced solubility in an aqueous alkali solution through light exposure:

Formula (1)

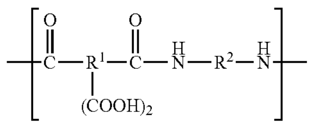

wherein $R^1$ represents a linking group containing at least one aromatic ring to which a —COOH group directly bonds; and $R^2$ represents an alkylene group, an arylene group or an aralkylene group.

<Polyimide Precursor Resin Containing Structural Unit represented by Formula (1) and Exerting Water-insolubility and Alkali-solubility>

The recording layer of the planographic printing plate precursor according to the second and third aspects contains a polyimide precursor resin that has a structural unit represented by formula (1) and is water-insoluble and alkali-soluble (hereinafter referred to as a "particular polyimide precursor resin"). In case where the recording layer has a single layer structure, a development inhibitor for exerting such characteristics that the solubility in an aqueous alkali solution is increased through exposure, and an infrared absorber for improving the recording sensitivity are necessarily used in combination. Furthermore, it is preferred to mix a novolak resin, which is an alkali-soluble resin, as an arbitrary component. The mixing proportion of the novolak resin is preferably 60% or less based on the total alkali-soluble resin.

In case where the particular polyimide precursor resin is used in the lower layer of the recording layer having a multi-layer structure, the particular polyimide precursor resin may be solely used, or alternatively, an ordinary water-insoluble and alkali-soluble resin may be used in combination from the standpoint of improvement in film property.

Among these constitutions, the particular polyimide precursor resin is preferably used as a component of the lower layer of the recording layer having a multi-layer structure, from the standpoint of the effect.

The particular polyimide precursor resin used in the planographic printing plate precursor according to the second and third aspects is not particularly limited insofar as it contains a structural unit represented by formula (1) and is water-insoluble and alkali-soluble.

In formula (1), $R^1$ represents a linking group containing at least one aromatic ring, and each of the two —COOH groups directly bonds to the aromatic ring. In case where $R^1$ contains two or more aromatic rings, the aromatic rings may be connected through a single bond or a linking group, or may be condensed to form a condensed polycyclic structure. Furthermore, —COOH is connected to the aromatic ring that is directly connected to the amide group, and in this case, it is generally connected to the amide group at the ortho position.

Specific examples of the linking group represented by $R^1$ and —COOH include the following, but the invention is not limited thereto.

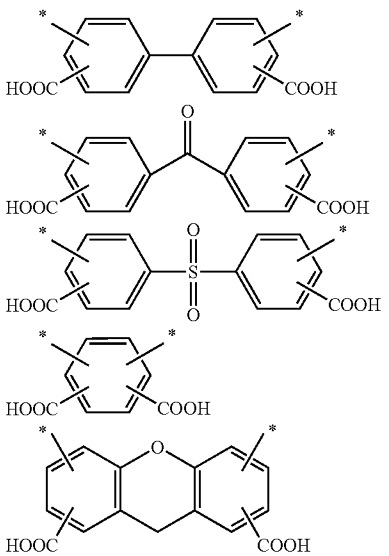

* denotes a connecting site to a main chain

In formula (1), $R^2$ represents an alkylene group, an arylene group or an aralkylene group.

While the alkylene group, the arylene group and the aralkylene group are not particularly limited, an alkylene group having from 2 to 10 carbon atoms is preferred as the alkylene group, and the arylene group may be one containing two or more cyclic structures connected through a single bond or a linking group. Examples of the aralkylene group include those obtained by arbitrarily combining the alkylene group and the arylene group.

Specific examples of the linking group represented by $R^2$ include the following, but the invention is not limited thereto.

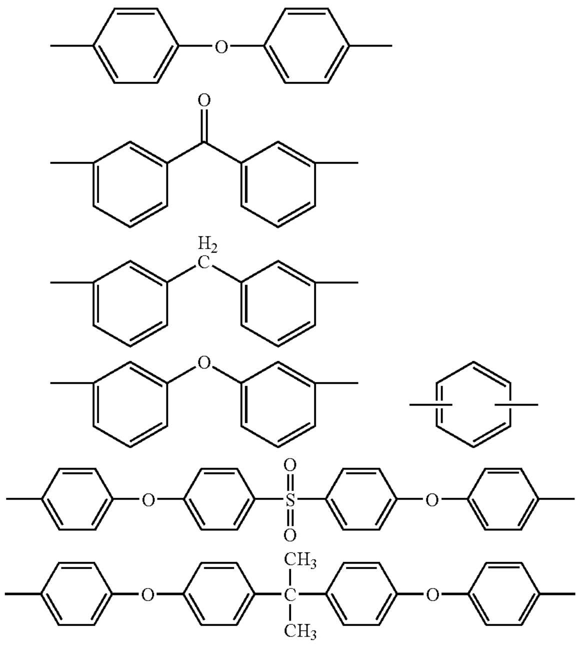

The particular polyimide precursor resin may generally be produced by causing a polymerization reaction of an aromatic tetracarboxylic dianhydride and a diamine through a known process.

Examples of the aromatic tetracarboxylic dianhydride used for synthesizing the particular polyimide precursor resin include dianhydrides of pyromellitic acid, 3,3',4,4'-benzophenonetetracarboxylic acid, 2,3,3',4'-biphenyltetracarboxylic acid, 2,3,6,7-naphthalenetetracarboxylic acid, 4,4'-sulfonyltetracarboxylic acid and 3,3',4,4'-diphenyl ether tetracarboxylic acid.

Examples of the diamine include p-xylenediamine, m-phenylenediamine, p-phenylenediamine, 4,4'-diaminodiphenylpropane, 4,4'-diaminodiphenylmethane, 4,4'-diaminodiphenyl ether, 4,4'-diaminodiphenylsulfone, 3,3'-dimethyl-4,4'-diaminodiphenylmethane, 4,4'-diaminodiphenyl, 1,5-diaminonaphthalene, 1,4-diaminoanthraquinone, 2,6-diaminoathraquinone, o-anididine, 2,6-diaminopyridine, 4,6-diamino-2-mercaptopyridine and 1,6-diaminohexane.

The polymerization ratio of the aromatic tetracarboxylic dianhydride and the diamine is preferably from 60/40 to 40/60, and more preferably from 55/45 to 45/55.

Preferred examples of the combination thereof include dianhydride of 3,3',4,4'-benzophenonetetracarboxylic acid as the aromatic tetracarboxylic dianhydride and 4,4'-diaminodiphenyl ether as the diamine from the standpoint of chemical resistance.

The particular polyimide precursor resin used in the planographic printing plate precursor according to the second and third aspects may be those produced using two or more kinds of each of the tetracarboxylic dianhydride and the diamine. An aliphatic diamine may be used in combination for improving solubility in a solvent for coating.

The particular polyimide precursor resin preferably has a weight average molecular weight (Mw) in a range of from 3,000 to 100,000, and more preferably in a range of from 5,000 to 50,000. The particular polyimide precursor resin may be used solely or in combination of two or more of them as a mixture.

The content of the particular polyimide precursor resin present in the components of the recording layer is preferably about from 20 to 90% by mass, and more preferably about from 30 to 80% by mass, based on the total solid content, in case of the recording layer having the single layer structure. In case where the particular polyimide precursor resin is used in the lower layer of the recording layer having the multi-layer structure, the content thereof is preferably about from 40 to 90% by mass, and more preferably about from 60 to 85% by mass, based on the total solid content in the components of the lower layer.

The planographic printing plate precursor having a recording layer having the multi-layer structure according to the third aspect, which is a preferred embodiment of the invention, will be described below. In this case, the particular polyimide precursor resin is added to the lower layer.

<Lower Layer Containing Particular Polyimide Precursor Resin>

The lower layer of the planographic printing plate precursor according to the third aspect contains the particular polyimide precursor resin. The particular polyimide precursor resin used herein is not particularly limited insofar as it is insoluble in water and soluble in an aqueous alkali solution.

In addition to the particular polyimide precursor resin, other resins may be used in combination in the components of the lower layer in such an extent that does not impair the effect of the invention. Preferred examples of the resin that may be used in combination in the lower layer include the similar water-insoluble and alkali-soluble resins as in the first aspect. Specifically, examples thereof include a polyamide resin, an epoxy resin, a polyacetal resin, an acrylic resin, a methacrylic resin, a polystyrene resin and a novolak type phenol resin. The mixing amount thereof is preferably 50% by mass or less based on the amount of the particular polyimide precursor resin.

Planographic Printing Plate Precursor According to Fourth and Fifth Aspects

The planographic printing plate precursor according to the fourth and fifth aspects comprises a support having disposed thereon a recording layer, which contains a water-insoluble and alkali-soluble resin having a urea bond in a polymer main chain, a development inhibitor and an infrared absorber, and exhibits enhanced solubility in an aqueous alkali solution through exposure.

<Water-insoluble and Alkali-soluble Resin Having Urea Bond in Polymer Main Chain>

The recording layer of the planographic printing plate precursor according to the fourth and fifth aspects contains a water-insoluble and alkali-soluble resin having a urea bond in a polymer main chain (hereinafter referred to as a "particular urea bond resin"). In case where the recording layer has a single layer structure, a development inhibitor for exerting such characteristics that solubility in an aqueous alkali solution is increased through exposure, and an infrared absorber for improving the recording sensitivity are necessarily used in combination. Furthermore, it is preferred to mix a novolak resin, which is an alkali-soluble resin, as an arbitrary component. The mixing proportion of the novolak resin is preferably 85% or less, and more preferably 60% by mass or less, based on the total alkali-soluble resin.

In case where the particular urea bond resin is used in the lower layer of the recording layer having a multi-layer structure, the particular urea bond resin may be solely used, or alternatively, an ordinary water-insoluble and alkali-soluble resin may be used in combination from the standpoint of improvement in film property.

Among these constitutions, the particular urea bond resin is preferably used as a component of the lower layer of the recording layer having a multi-layer structure, from the standpoint of effects.

The particular urea bond resin used in the planographic printing plate precursor according to the fourth and fifth aspects is not particularly limited insofar as it is water-insoluble and alkali-soluble and has a urea bond in the polymer main chain thereof.

The term "urea bond" generally refers to —NH—CO—NH—, but the urea bond as used herein is defined as encompassing such structures in that the hydrogen atom of —NH— in the aforementioned structure is replaced with an arbitrary substituent.

Examples of the urea bond in the invention include those represented by the following formula (a):

Formula (a)

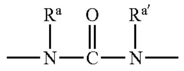

wherein $R^a$ and $R^{a'}$ each independently represent a hydrogen atom, an alkyl group, an aryl group or an aralkyl group. It is preferable in the invention that $R^a$ and $R^{a'}$ are both hydrogen atoms.

In case where $R^a$ and $R^{a'}$ each represent an alkyl group, the alkyl group preferably has about from 1 to 20 carbon atoms, and more preferably about from 1 to 6 carbon atoms.

In case where $R^a$ and $R^{a'}$ each represent an aryl group, the aryl group preferably has about from 6 to 24 carbon atoms, and more preferably about from 6 to 15 carbon atoms.

In case where $R^a$ and $R^{a'}$ each represent an aralkyl group, the aralkyl group preferably has about from 7 to 24 carbon atoms, and more preferably about from 7 to 15 carbon atoms.

At least one of the substituents represented by $R^a$ and $R^{a'}$ and another bond of the nitrogen atom bonded to the substituent may be connected to form a cyclic structure. For example, the bond represented by the following structural formula is also encompassed in the urea bond in the invention:

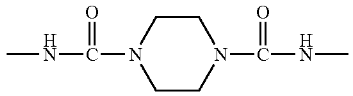

As a method for introducing the urea bond into a polymer main chain, a method of allowing an isocyanate group to react with a primary or secondary amine is exemplified. Such a polymer compound is preferred in the invention that has, as a basic skeleton, a reaction product formed using at least one kind of a diisocyanate compound represented by the followin formula (I), at least one kind of a diol compound having a carboxylic group represented by the following general formulae (II), (III) and (IV), and at least one kind of a compound capable of introducing the urea bond to a polymer main chain, such as a compound having a primary or secondary amine.

Formula (I)

$$OCN—R^1—NCO$$

Formula (II)

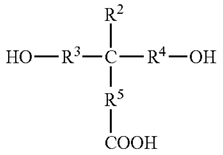

Formula (III)

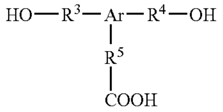

Formula (IV)

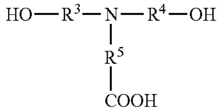

In formula (I), $R^1$ represents a divalent linking group. Examples of the linking group include an aliphatic hydrocarbon, an alicyclic hydrocarbon and an aromatic hydrocarbon. Preferred examples thereof include an alkylene group having from 2 to 12 carbon atoms and an arylene group having from 6 to 20 carbon atoms. The arylene group may be one having two or more cyclic structures connected through a single bond or a divalent organic linking group, such as a methylene group, and one having a condensed polycyclic structure. The group represented by $R^1$ may have, depending on necessity, another functional group that does not react with the isocyanate group, such as an ester group, an urethane group and an amide group.

The group represented by $R^1$ may have a substituent, and examples of the substituent that may be introduced include an alkyl group, an aralkyl group, an aryl group, an alkoxy group and a halogen atom (such as —F, —Cl, —Br or —I).

As the diisocyanate compound used in the invention, compounds outside the scope of the general formula (I) may also be used, for example, a high molecular weight diisocyanate compound containing a polymer compound, such as an oligomer or a polymer containing a diol compound descried later, with isocyanate groups bonded to both ends thereof.

Specific examples of the diisocyanate compound include those described below, but the invention is not limited to them.

Specific examples thereof include an aromatic diisocyanate compound, such as 2,4-tolylene diisocyanate, a dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; an aliphatic diisocyanate compound, such as hexamethylene diisocyanate, trimethylhexamethylene diisocyanate, lysine diisocyanate and dimer acid diisocyanate; an alicyclic diisocyanate compound, such as isophorone diisocyanate, 4,4'-methylene bis(cyclohexylisocyanate), methylcyclohexane-2,4(or 2,6)-diisocyanate and 1,3-(isocyanatemethyl)cyclohexane; and a diisocyanate compound as a reaction product of a diol and a diisocyanate, such as an adduct of 1 mole of 1,3-butylene glycol and 2 mole of tolylene diisocyanate.

Among these, 4,4'-diphenylmethane diisocyanate, p-xylylene diisocyanate and 3,3'-dimethylbiphenyl-4,4'-diisocyanate are preferred from the standpoint of printing durability and chemical resistance.

In formula (II), $R^2$ represents a hydrogen atom, an alkyl group, an aralkyl group, an aryl group, an alkoxy group or an aryloxy group. The group represented by $R^2$ may have a substituent, and examples of the substituent that may be introduced include a cyano group, a nitro group, a halogen atom (such as —F, —Cl, —Br or —I), $—CONH_2$, $—COOR^6$, $—OR^6$, $—NHCONHR^6$, $—NHCOOR^6$, $—NHCOR^6$, $—OCONHR^6$ and $—CONHR^6$ (wherein $R^6$ represents an alkyl group having from 1 to 10 carbon atoms or an aralkyl group having from 7 to 15 carbon atoms).

Preferred examples of the group represented by $R^2$ include a hydrogen atom and an unsubstituted alkyl group having from 1 to 8 carbon atoms and an unsubstituted aryl group having from 6 to 15 carbon atoms.

In formulae (II), (III) and (IV), $R^3$, $R^4$ and $R^5$, which may be the same or different, each represent a single bond or a divalent linking group. Examples of the divalent linking group include an aliphatic hydrocarbon and an aromatic hydrocarbon. The groups represented by $R^3$, $R^4$ and $R^5$ may have a substituent, and examples of the substituent that may be introduced include an alkyl group, an aralkyl group, an aryl group, an alkoxy group and a halogen atom (such as —F, —Cl, —Br or —I).

Preferred examples of the groups represented by $R^3$, $R^4$ and $R^5$ include an unsubstituted alkylene group having from 1 to 20 carbon atoms and an unsubstituted arylene group having from 6 to 15 carbon atoms, and more preferred examples thereof include an unsubstituted alkylene group having from 1 to 8 carbon atoms. The groups represented by $R^3$, $R^4$ and $R^5$ may have, depending on necessity, another functional group that does not react with the isocyanate group, such as an ester group, an urethane group, an amide group, an ureido group and an ether group.

Two or three of the groups represented by $R^2$, $R^3$, $R^4$ and $R^5$ may be connected to each other to form a cyclic structure.

In formula (III), Ar represents a trivalent aromatic hydrocarbon, which may have a substituent, and preferably an arylene group having from 6 to 15 carbon atoms.

Specific examples of the diol compound having a carboxyl group represented by formula (II), (III) or (IV) include those described below, but the invention is not limited thereto.

Specific examples thereof include 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid, tartaric acid and N,N-dihydroxyethylglycin.

Among these, 3,5-dihydroxybenzoic acid and 2,2-bis(hydroxymethyl)propionic acid are preferred from the standpoint of synthesis.

The compound capable of introducing the urea bond to a polymer main chain used in the planographic printing plate precursor according to the fourth and fifth aspects is not particularly limited, and examples thereof include a compound having at least one primary or secondary amine in one molecule, such as an aliphatic diamine compound, an aromatic diamine compound, a heterocyclic diamine compound, an aminoalcohol compound and an aminophenol compound, and a compound having the urea bond having been previously introduced (hereinafter, sometimes referred to as a "urea compound").

Among these, an aliphatic primary diamine and an aromatic primary diamine are particularly preferred from the standpoint of printing durability.

Specific examples of the compounds include the following, but the invention is not limited thereto.

Examples of the aliphatic diamine compound include ethylene diamine, propylene diamine, tetramethylene diamine, pentamethylene diamine, hexamethylene diamine, heptamethylene diamine, octamethylene diamine, dodecamethylene diamine, propane-1,2-diamine, bis(3-aminopropyl) methylamine, 1,3-bis(aminopropyl)tetramethylsiloxane, piperazine, 2,5-dimethylpiperazine, N-(2-aminoethyl) piperazine, 4-amino-2,2,6,6-tetramethylpiperidine, N,N-dimethylethylene diamine, lysine and L-cystine, and among these, ethylene diamine, propylene diamine, tetramethylene diamine and hexamethylene diamine are particularly preferred.

Examples of the aromatic diamine compound include o-phenylene diamine, m-phenylene diamine, p-phenylene diamine, 2,4-tolylene diamine, benzidine, o-ditoluidine, o-dianisidine, 4-nitro-m-phenylene diamine, 2,5-dimethoxy-p-phenylene diamine, bis(4-aminophenyl)sulfone, 4-carboxy-o-phenylene diamine, 3-carboxy-m-phenylene diamine, 4,4'-diaminodiphenyl ether and 1,8-naphthalene diamine, and among these m-phenylene diamine and 4,4'-diaminodiphenyl ether are particularly preferred.

Examples of the heterocyclic amine compound include 2-aminoimidazole, 3-aminotriazole, 5-amino-1H-tetrazole, 4-aminopyrazole, 2-aminobenzimidazole, 2-amino-5-carboxytriazole, 2,4-diamino-6-methyl-S-triazine, 2,6-diaminopyridine, L-histidine, DL-tryptophan and adenine.

Examples of the aminoalcohol or aminophenol compound include ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycin, 2-aminobenzyl alcohol, 4-aminophenethyl alcohol, 2-carboxy-5-amino-1-naphthol and L-tyrosine. Among these, m-aminophenol and 4-aminophenethyl alcohol are particularly preferred.

The urea compound used in the invention is not particularly limited insofar as it is such a compound that has at least one urea bond in one molecule and is capable of introducing a urea bond to the polymer main chain upon synthesis of the polymer.

Specific examples thereof include 2,4-tolylene-bis(2-hydroxyethylcarbamide), m-xylylene-bis(2-hydroxyethylcarbamide), hexamethylene-bis(2-hydroxyethylcarbamide), 4,4'-diphenylmethane-bis(2-hydroxyethylcarbamide) and 1,5-naphthalene-bis(2-hydroxyethylcarbamide). Among these, hexamethylene-bis(2-hydroxyethylcarbamide) and 4,4'-diphenylmethane-bis(2-hydroxycarbamide) are particularly preferred.

Other diol compounds than those represented by formulae (II) to (IV) may be introduced to the main chain in such an extent that does not impair the effects of the invention.

Specific examples of the other diol compounds include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrated bisphenol A, hydrated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrated bisphenol A, a propylene oxide adduct of hydrated bisphenol A, hydroquinone dihydroxyethyl ether, p-xylene glycol, dihydroxyethylsulfone, bis(2-hydroxyethyl)-2,4-tolylenedicarbamate, bis(2-hydroxyethyl)-m-xylylenedicarbamate and bis(2-hydroxyethyl)isophthalate.

The particular urea bond resin used in the planographic printing plate precursor according to the fourth and fifth aspects may be synthesized in such a manner that the aforementioned components are dissolved in a non-protonic solvent and heated in the presence of a known catalyst that has an activity corresponding to the reactivity thereof.

The molar ratio of the total amount of the diol compound represented by formulae (II) to (IV) and the compound having a primary or secondary amine and/or the compound having a urea bond with respect to the diisocyanate compound used is preferably from 0.8/1 to 1.2/1. In case where an isocyanate group remains at an end of the resulting polymer, it is treated with an alcohol or an amine to obtain a final polymer having no isocyanate group remained.

The molar ratio of the compound having a primary or secondary amine and/or the compound having a urea bond with respect to the diol compound represented by formulae (II) to (IV) is preferably from 95/5 to 0/100, more preferably from 90/10 to 10/90, and further preferably from 80/20 to 20/80.

The particular urea bond resin used in the invention preferably has a molecular weight in terms of weight average of 1,000 or more, and more preferably in a range of from 3,000 to 200,000. The particular urea bond resin may be used singly or may be used in combination of two or more of them.

The content of the particular urea bond resin in the total alkali-soluble resin present in the recording layer in the invention is preferably more than 10% by mass, and more preferably more than 50% by mass, in both cases where it is used in the recording layer having the single layer structure and used in the lower layer of the recording layer having the multi-layer structure.

The planographic printing plate precursor having a recording layer having the multi-layer structure according to the fifth aspect, which is a preferred embodiment of the invention, will be described below. In this case, the particular urea bond resin is added to the lower layer.

<Lower Layer Containing Particular Urea Bond Resin>

The lower layer of the planographic printing plate precursor according to the fifth aspect contains the particular urea bond resin. The particular urea bond resin used herein is not particularly limited insofar as it has a urea bond on a polymer main chain and is insoluble in water and soluble in an aqueous alkali solution.

In addition to the particular urea bond resin, other resins may be used in combination in the components of the lower layer in such an extent that does not impair the effect of the invention. Preferred examples of the resin that may be used in combination in the lower layer include the water-insoluble and alkali-soluble resins as described above, such as a polyamide resin, an epoxy resin, a polyacetal resin, an acrylic resin, a methacrylic resin, a polystyrene resin and a novolak type phenol resin. The mixing amount thereof is preferably 50% by mass or less based on the amount of the particular urea bond resin.

In the components of the lower layer in the invention, an infrared absorber and other additives may be used depending on necessity in addition to the alkali-soluble resin. Examples of the other additives include a development accelerator, a surfactant, a printing-out/ coloring agent, a plasticizer and a wax. The details, such as species and contents, of the infrared absorber and the other additives are the same as those described later for the components of the upper layer.

Planographic Printing Plate Precursor According to Sixth and Seventh Aspects

The planographic printing plate precursor according to the sixth and seventh aspects comprises a support having disposed thereon a recording layer, which contains a water-insoluble and alkali-soluble resin having an amide bond in a polymer main chain, a development inhibitor and an infrared absorber, and exhibits enhanced solubility in an aqueous alkali solution through exposure.

<Water-insoluble and Alkali-soluble Resin having Amide Bond in Polymer Main Chain>

The recording layer of the planographic printing plate precursor according to the sixth and seventh aspects contains a water-insoluble and alkali-soluble resin having an amide bond in a polymer main chain (hereinafter referred to as a "particular alkali-soluble resin").

In case where the recording layer has a single layer structure, a development inhibitor for exerting such characteristics that solubility in an aqueous alkali solution is increased through exposure, and an infrared absorber for improving the recording sensitivity are necessarily used in combination with the particular alkali-soluble resin. Furthermore, it is preferred to mix a novolak resin, which is an alkalisoluble resin, as an arbitrary component. The mixing proportion of the novolak resin is preferably 95% or less, more preferably 85% by mass or less, and particularly preferably 60% by mass or less, based on the total alkali-soluble resin.

In case where the recording layer has the multi-layer structure, the particular alkali-soluble resin is used in the lower layer of the recording layer having the multi-layer structure. In this case, the particular alkali-soluble resin may solely be used, or alternatively, an ordinary water-insoluble and alkali-soluble resin may be used in combination from the standpoint of improvement in film property.

In the planographic printing plate precursor according to the sixth and seventh aspects, it is preferred that the particular alkalisoluble resin is used as a component of the lower layer of the recording layer having the multi-layer structure, from the standpoint of the effect. The particular alkali-soluble resin used in the planographic printing plate precursor according to the sixth and seventh aspects is not particularly limited insofar as it is water-insoluble and alkali-soluble and has an amide bond in the polymer main chain thereof. Examples of the particular alkali-soluble resin of the invention include a polyacrylamide resin and a poly(urethane-amide) resin, with a poly(urethane-amide) resin being particularly preferred.

As one method for introducing an amide bond into the polymer main chain in the particular alkali-soluble resin in the planographic printing plate precursor according to the sixth and seventh aspect, for example, a method of allowing an isocyanate compound to react with a diol compound having an alkali-solubilizing group in the structure thereof and a diol compound having an amide bond in the structure thereof is exemplified.

For example, as the particular alkali-soluble resin of the planographic printing plate precursor according to the sixth and seventh aspect, such a polymer compound is preferred that has, as a basic skeleton, a reaction product formed using at least one kind of a diisocyanate compound represented by the following formula (I), at least one kind of a diol compound having a carboxylic group represented by the following formulae (II), (III) and (IV), and at least one kind of a diol compound represented by the following formulae (V) and (VI).

Formula (I)

$$OCN—R^1—NCO$$

Formula (II)

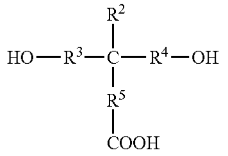

Formula (III)

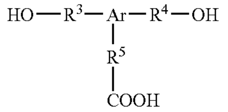

Formula (IV)

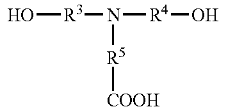

Formula (V)

$$HO—R^6—HNOC—R^7—CONH—R^6—OH$$

Formula (VI)

$$HO—R^7—CONH—R^6—OH$$

In formula (I), $R^1$ represents a divalent linking group. Examples of the linking group include an aliphatic hydrocarbon, an alicyclic hydrocarbon and an aromatic hydrocarbon. Preferred examples thereof include an alkylene group having from 2 to 12 carbon atoms and an arylene group having from 6 to 20 carbon atoms. The arylene group may be one having two or more cyclic structures connected through a single bond or a divalent organic linking group, such as a methylene group, and one having a condensed polycyclic structure. The group represented by $R^1$ may have, depending on necessity, another functional group that does not react with the isocyanate group, such as an ester group, a urethane group and an amide group.

The group represented by $R^1$ may have a substituent, and examples of the substituent that may be introduced include an alkyl group, an aralkyl group, an aryl group, an alkoxy group and a halogen atom (such as —F, —Cl, —Br or —I).

As the diisocyanate compound used in the planographic printing plate precursor according to the sixth and seventh aspects, compounds outside the scope of formula (I) may also be used, for example, a high molecular weight diisocyanate compound containing a polymer compound, such as an oligomer or a polymer containing a diol compound descried later, with isocyanate groups bonded to both ends thereof.

Specific examples of the diisocyanate compound include those described below, but the invention is not limited thereto.

Specific examples thereof include an aromatic diisocyanate compound, such as 2,4-tolylene diisocyanate, a dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; an aliphatic diisocyanate compound, such as hexamethylene diisocyanate, trimethylhexamethylene diisocyanate, lysine diisocyanate and dimer acid diisocyanate; an alicyclic diisocyanate, such as isophorone diisocyanate, 4,4'-methylene bis(cyclohexylisocyanate), methylcyclohexane-2,4(or 2,6)-diisocyanate and 1,3-(isocyanatemethyl)cyclohexane; and a diisocyanate compound as a reaction product of a diol and a diisocyanate, such as an adduct of 1 mole of 1,3-butylene glycol and 2 mole of tolylene diisocyanate.

Among these, 4,4'-diphenylmethane diisocyanate, p-xylylene diisocyanate and 3,3'-dimethylbiphenyl-4,4'-diisocyanate are preferred from the standpoint of printing durability and chemical resistance.

In formula (II), $R^2$ represents a hydrogen atom, an alkyl group, an aralkyl group, an aryl group, an alkoxy group or an aryloxy group. The group represented by $R^2$ may have a substituent, and examples of the substituent that can be introduced include a cyano group, a nitro group, a halogen atom (such as —F, —Cl, —Br and —I), $—CONH_2$, $—COOR^8$, $—OR^8$, $—NHCONHR^8$, $—NHCOOR^8$, $—NHCOR^8$, $—OCONHR^8$ and $—CONHR^8$ (wherein $R^8$ represents an alkyl group having from 1 to 10 carbon atoms or an aralkyl group having from 7 to 15 carbon atoms).

Preferred examples of the group represented by $R^2$ include an unsubstituted alkyl group having from 1 to 8 carbon atoms and an unsubstituted aryl group having from 6 to 15 carbon atoms.

In formulae (II), (III) and (IV), $R^3$, $R^4$ and $R^5$, which may be the same or different, each represents a single bond or a divalent linking group. Examples of the divalent linking group include an aliphatic hydrocarbon and an aromatic hydrocarbon. The groups represented by $R^3$, $R^4$ and $R^5$ may have a substituent, and examples of the substituent that can be introduced include an alkyl group, an aralkyl group, an aryl group, an alkoxy group and a halogen atom (such as —F, —Cl, —Br or —I).

Preferred examples of the groups represented by $R^3$, $R^4$ and $R^5$ include an unsubstituted alkylene group having from 1 to 20 carbon atoms and an unsubstituted arylene group having from 6 to 15 carbon atoms, and more preferred examples thereof include an unsubstituted alkylene group having from 1 to 8 carbon atoms. The groups represented by $R^3$, $R^4$ and $R^5$ may have, depending on necessity, another functional group that is not reacted with the isocyanate group, such as an ester group, an urethane group, an amide group, an ureido group and an ether group.

Two or three of the groups represented by $R^2$, $R^3$, $R^4$ and $R^5$ may be connected to each other to form a cyclic structure.

In formula (III), Ar represents a trivalent aromatic hydrocarbon, which may have a substituent, and preferably an arylene group having from 6 to 15 carbon atoms.

Specific examples of the diol compound having a carboxyl group represented by formula (II), (III) or (IV) include those described below, but the invention is not limited thereto.

Specific examples thereof include 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid, tartaric acid and N,N-dihydroxyethylglycin.

Among these, 3,5-dihydroxybenzoic acid and 2,2-bis(hydroxymethyl)propionic acid are preferred from the standpoint of synthesis.

In formulae (V) and (VI), $R^6$ and $R^7$, which may be the same or different, each represent a divalent linking group and may be bonded to each other to form a cyclic structure. Examples of the divalent linking group include an aliphatic hydrocarbon, an alicyclic hydrocarbon and an aromatic hydrocarbon. The group represented by $R^6$ and $R^7$ may have a substituent, and examples of the substituent that may be introduced include an alkyl group, an aralkyl group, an aryl group, an alkoxy group and a halogen atom (such as —F, —Cl, —Br or —I). The group represented by $R^6$ and $R^7$ may have, depending on necessity, another functional group that does not react with the isocyanate group, such as a carbonyl group, an ester group, an urethane group, an amide group and an ureido group.

Preferred examples of the group represented by $R^6$ and $R^7$ include an unsubstituted alkylene group having from 1 to 20 carbon atoms, an unsubstituted arylene group having from 6 to 15 carbon atoms and a heterocyclic hydrocarbon group having 4 or more carbon atoms. More preferred examples the group represented by $R^6$ and $R^7$ include an unsubstituted alkylene group having from 1 to 8 carbon atoms.

Specific examples of the compound represented by formulae (V) or (VI) are shown below (No. 1 to No. 28), but the invention is not limited thereto.

(No. 1)

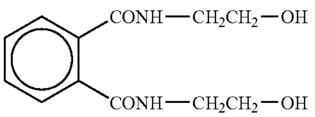

(No. 2)

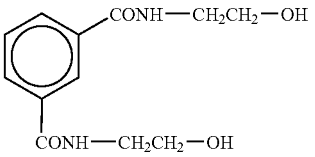

(No. 3)

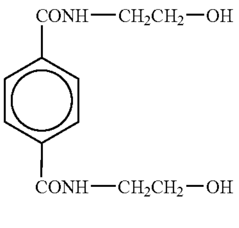

(No. 4)

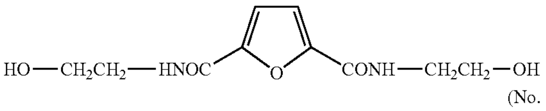

(No. 5)

$HO—CH_2CH_2—HNOC—CH{=}CH—CONH—CH_2CH_2—OH$ (No. 6)

$HO—CH_2CH_2—HNOC—(CH_2)_2—CONH—CH_2CH_2—OH$ (No. 7)

$HO—CH_2CH_2—HNOC—(CH_2)_4—CONH—CH_2CH_2—OH$ (No. 8)

$HO—CH_2CH_2—HNOC—(CH_2)_8—CONH—CH_2CH_2—OH$

-continued (No. 9)

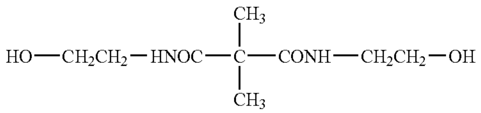

(No. 10)

$HO-CH_2CH_2-HNOC-C\equiv C-CONH-CH_2CH_2-OH$ (No. 11)

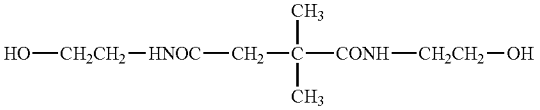

(No. 12)

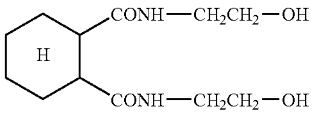

(No. 13)

$HO-H_2CH_2C-CONH-CH_2-O-CH_2-CONH-CH_2CH_2-OH$ (No. 14)

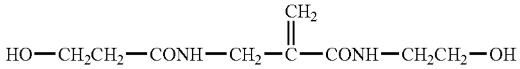

(No. 15)

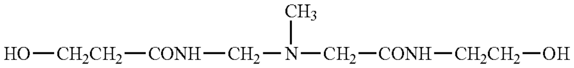

(No. 16)

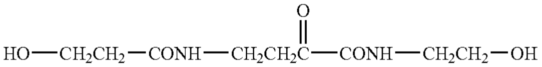

(No. 17)

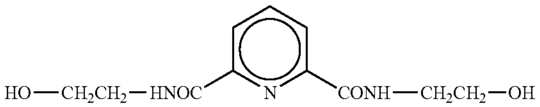

(No. 18)

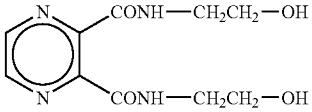

(No. 19)

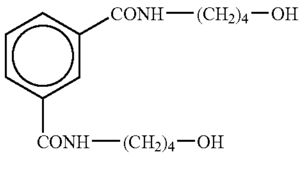

(No. 20)

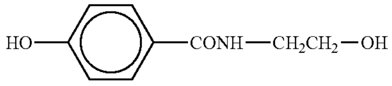

(No. 21)

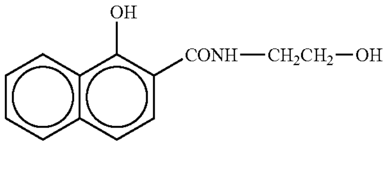

-continued (No. 22)

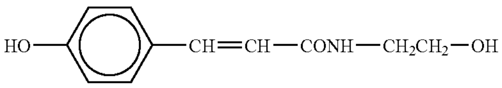

(No. 23)

$HO-CH_2CH_2-CONH-CH_2CH_2-OH$ (No. 24)

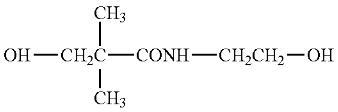

(No. 25)

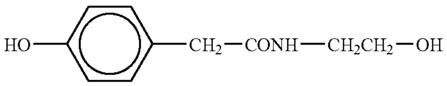

(No. 26)

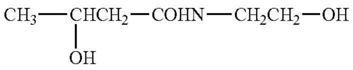

(No. 27)

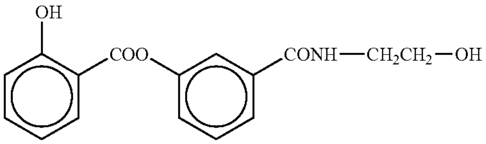

(No. 28)

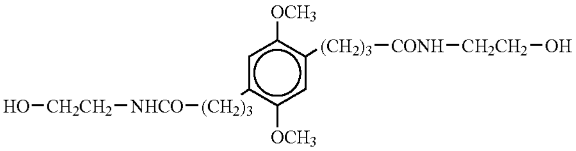

In the planographic printing plate precursor according to the sixth and seventh aspects, another diol compound that neither has a carboxyl group nor an ester group and does not react with an isocyanate group may be introduced to the main chain of the particular alkalisoluble resin in such an extent that does not impair the alkali developing property.

Specific examples of the other diol compounds include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrated bisphenol A, hydrated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrated bisphenol A, a propylene oxide adduct of hydrated bisphenol A, hydroquinone dihydroxyethyl ether, p-xylylene glycol, dihydroxyethylsulfone, bis(2-hydroxyethyl)-2,4-tolylenedicarbamate, 2,4-tolylene-bis(hydroxyethylcarbamide) and bis(2-hydroxyethyl)-m-xylylenedicarbamate.

The particular alkali-soluble resin used in the planographic printing plate precursor according to the sixth and seventh aspects may be synthesized in such a manner that the aforementioned components are dissolved in an aprotic solvent and heated in the presence of a known catalyst that has an activity corresponding to the reactivity thereof.

The molar ratio of the total amount of the diol compound represented by formulae (II), (III) and (IV) and the compound represented by formula (V) and/or (VI) to the diisocyanate compound represented by formula (I) is preferably from 0.8/1 to 1.2/1. In case where an isocyanate group remains at an end of the resulting polymer, it is treated with an alcohol or an amine to obtain a final polymer having no isocyanate group remained.

The molar ratio of the compound represented by formula (IV) and/or (VI) to the diol compound represented by formula (I) is preferably 1% by mole or more, and more preferably from 5 to 70% by mole.

The particular alkali-soluble resin used in the planographic printing plate precursor according to the sixth and seventh aspects preferably has a molecular weight in terms of weight average of 1,000 or more, and more preferably in a range of from 5,000 to 200,000.

The particular alkali-soluble resin may be used singly or in combination of two or more thereof.

The content of the particular alkali-soluble resin in the total alkali-soluble resin is preferably 5% by mass or more, more preferably 10% by mass or more, and more further preferably 50% by mass or more.

The planographic printing plate precursor having a recording layer having the multi-layer structure according to the seventh aspect, which is a preferred embodiment of the invention, will be described below. In this case, the particular alkali-soluble resin is added to the lower layer.

<Lower Layer Containing Particular Alkali-soluble Resin>

The lower layer of the planographic printing plate precursor according to the seventh aspect contains the particular alkali-soluble resin. The particular alkali-soluble resin used herein is not particularly limited insofar as it is insoluble in water and soluble in an aqueous alkali solution as described supra.

In addition to the particular alkali-soluble resin, other resins may be used in combination in the components of the lower layer in such an extent that does not impair the effect of the invention. Examples of the resin that may be used in combination in the lower layer include water-insoluble and alkali-soluble resins such as a polyamide resin, an epoxy resin, a polyacetal resin, an acrylic resin, a methacrylic resin, a polystyrene resin, a novolak type phenol resin and a polyurethane resin.

In the components of the lower layer in the invention, an infrared absorber and other additives may be used depending on necessity. Examples of the other additives include a development accelerator, a surfactant, a printing-out/coloring agent, a plasticizer and a wax. The details of these components are the same as those described later for the components of the upper layer.

The upper layer constituting the planographic printing plate precursor of the invention will be described in detail below.

<Upper Layer containing Water-insoluble and Alkali-soluble Resin and Development Inhibitor and Exhibits Enhanced Solubility in Aqueous Alkali Solution through Exposure>

The upper layer, which is a constitutional element that is common to the planographic printing plate precursors according to the first, third, fifth and seventh aspect of the invention, contains a water-insoluble and alkali-soluble resin (hereinafter, sometimes referred to as an "alkali-soluble resin") and a development inhibitor, and exhibits enhanced solubility in an aqueous alkali solution through exposure. The components of the upper layer in the invention will be described below.

<Water-insoluble and Alkali-soluble Resin>

The alkali-soluble resin that may be used in the upper layer of the invention is not particularly limited insofar as it has such characteristics of being soluble in an alkali developer upon contact therewith, and preferable examples are a homopolymer containing an acidic group in a main chain and/or a side chain of the polymer and a copolymer or a mixture thereof. The particular alkali-soluble resin and the particular urea bond resin, which have been described above, are encompassed therein. In particular, it is preferred to use a novolak resin in combination with a development inhibitor described later from the standpoint of improvement in discrimination.

Examples of the alkali-soluble resin having an acidic group include a polymer compound containing, in the molecule thereof, one of the functional group of (1) a phenolic hydroxyl group, (2) a sulfonamide group and (3) an active imide group. Specific examples thereof include the following, but the invention is not limited thereto.

Examples of the polymer compound having a phenolic hydroxyl group (1) include a novolak resin, such as a phenol formaldehyde resin, an m-cresol formaldehyde resin, a p-cresol formaldehyde resin, an m-/p-mixed cresol formaldehyde resin, a phenol/cresol (either m-, p- or m-/p-mixture) formaldehyde resin, and a pyrogallol acetone resin. Other preferred examples of the polymer compound having a phenolic hydroxyl group include a polymer compound having a phenolic hydroxyl group on a side chain thereof. Examples of the polymer compound having a phenolic hydroxyl group on a side chain include a polymer compound obtained by homopolymerizing a polymerizable monomer containing a low molecular weight compound having at least one phenolic hydroxyl group and at least one polymerizable unsaturated bond, and a polymer compound obtained by copolymerizing the monomer and other polymerizable monomer.

Examples of the polymerizable monomer having a phenolic hydroxyl group include acrylamide, methacrylamide, an acrylate, a methacrylate and hydroxystyrene, which have a phenolic hydroxyl group. Preferred examples thereof include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenhl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2- (2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate and 2-(4-hydroxyphenyl)ethyl methacrylate. The resin having a phenolic hydroxyl group may be used in combination of two or more kinds thereof. Furthermore, a copolymer of phenol having an alkyl group having from 3 to 8 carbon atoms as a substituent and formaldehyde, such as a t-butylphenol formaldehyde resin and an octylphenol formaldehyde resin, as described in U.S. Pat. No. 4,123,279 may be used in combination.

Examples of the alkali-soluble resin having a sulfonamide group (2) include a polymer compound obtained by homopolymerizing a polymerizable monomer having a sulfonamide group and a polymer compound obtained by copolymerizing the monomer with other polymerizable monomers. Examples of the monomer having a sulfonamide group include a polymerizable monomer containing a low molecular weight compound having at least one sulfonamide group —NH—$SO_2$— in which at least one hydrogen atom is connected to a nitrogen atom, and at least one polymerizable unsaturated bond. Among the monomers, a low molecular weight compound having an acryloyl group, an allyl group or a vinyloxy group, and a substituted or monosubstituted aminosulfonyl group or a substituted sulfonylimino group is preferred.

The alkali-soluble resin having an active imide group (3) is preferably those having an active imide group in the molecule thereof. Examples of the polymer compound include a polymer compound obtained by homopolymerizing a polymerizable monomer containing a low molecular weight compound having at least one active imide group and at least one polymerizable unsaturated bond in one molecule, and a polymer compound obtained by copolymerizing the monomer with other polymerizable monomers.

Preferred examples of the compound include N-(p-toluenesulfonyl)methacrylamide and N-(p-toluenesulfonyl) acrylamide.

The alkali-soluble resin used in the invention is preferably a polymer compound obtained by polymerizing two or more kinds selected from the polymerizable monomer having a phenolic hydroxyl group, the polymerizable monomer having a sulfonamide group and the polymerizable monomer having an active amide group. There is no particular limitation in the copolymerization ratio of the polymerizable monomers and the combination of the polymerizable monomers. In particular, in case where the polymerizable monomer having a phenolic hydroxyl group is copolymerized with the polymerizable monomer having a sulfonamide group and/or the polymerizable monomer having an active imide group, the copolymerization ratio of these components is preferably in a range of from 50/50 to 5/95, and more preferably in a range of from 40/60 to 10/90.

The alkali-soluble resin used in the invention is further preferably a polymer compound obtained by copolymerizing another polymerizable monomer in addition to the polymerizable monomer of one kind or two or more kinds selected from the polymerizable monomer having a phenolic hydroxyl group, the polymerizable monomer having a sulfonamide group and the polymerizable monomer having an active amide group. The copolymerization ratio in this case is preferably in such a case that the monomer imparting alkali-solubility is contained in an amount of 10% by mole or more, and more preferably contained in an amount of 20% by mole or more. In case where the amount of the copolymerization component derived from the monomer imparting alkali-solubility is less than 10% by mole, alkali-solubility is liable to be insufficient, and thus there is such a tendency that the developing property is deteriorated.

Examples of the other polymerizable monomer that may be used include the following compounds (m1) to (m12), but the invention is not limited thereto.

(m1) an acrylate and a methacrylate having an aliphatic hydroxyl group, such as 2-hydroxyethyl acrylate and 2-hydroxyethyl methacrylate;

(m2) an alkyl acrylate, such as methyl acrylate, ethyl acrylate, propyl acrylate, butyl acrylate, amyl acrylate, hexyl acrylate, octyl acrylate, benzyl acrylate, 2-chloroethyl acrylate and glycidyl acrylate;

(m3) an alkyl methacrylate, such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate and glycidyl methacrylate;

(m4) an acrylamide compound and a methacrylamide compound, such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide and N-ethyl-N-phenylacrylamide;

(m5) a vinyl ether, such as ethyl vinyl ether, 2-chloroethyl vinyl ether, hydroxyethyl vinyl ether, propyl vinyl ether, butyl vinyl ether, octyl vinyl ether and phenyl vinyl ether;

(m6) a vinyl ester, such as vinyl acetate, vinyl chloroacetate, vinyl butyrate and vinyl benzoate;

(m7) a styrene compound, such as styrene, α-methylstyrene, methylstyrene and chloromethylstyrene;

(m8) a vinyl ketone, such as methyl vinyl ketone, ethyl vinyl ketone, propyl vinyl ketone and phenyl vinyl ketone;

(m9) an olefin, such as ethylene, propylene, isobutylene, butadiene and isoprene;

(m10) N-vinylpyrrolidone, acrylonitrile and methacrylonitrile;

(m11) an unsaturated imide, such as maleimide, N-acryloylacrylamide, N-aectylmethacrylamide, N-propionylmethacrylamide and N-(p-chlorobenzoyl)methacrylamide; and (m12) an unsaturated carboxylic acid, such as acrylic acid, methacrylic acid, maleic anhydride and itaconic acid.

In case where the alkali-soluble resin used in the invention is a homopolymer or a copolymer of the polymerizable monomer having a phenolic hydroxyl group, the polymerizable monomer having a sulfonamide group and the polymerizable monomer having an active imide group, it preferably has a weight average molecular weight of 2,000 or more and a number average molecular weight of 500 or more. More preferably, it has a weight average molecular weight of from 5,000 to 300,000, a number average molecular weight of from 800 to 250,000 and a dispersion degree (weight average molecular weight/number average molecular weight) of from 1.1 to 10.

In case where the alkali-soluble resin used in the invention is a phenol formaldehyde resin or a cresol aldehyde resin, it particularly preferably has a weight average molecular weight of from 500 to 20,000 and a number average molecular weight of from 200 to 10,000.

The alkali-soluble resin is preferably a resin having a phenolic hydroxyl group from the standpoint of capable of forming strong hydrogen bond property in an unexposed area, but readily releasing a part of hydrogen bonds in an exposed area. In particular, a novolak resin is preferred as the resin having a phenolic hydroxyl group.

Furthermore, two or more kinds of alkali-soluble resins, which have different dissolving rates in an aqueous alkali solution, may be used as a mixture, and the mixing ratio thereof is not particularly limited. As an alkali-soluble resin that is preferably mixed with the resin having a phenolic hydroxyl group, an acrylic resin is preferred since it has a low compatibility with the resin having a phenolic hydroxyl group, and an acrylic resin having a sulfonamide group is more preferred.

The content of the alkali-soluble resin in the total solid content of the upper layer in the invention is preferably from 50 to 98% by mass. In case where the amount of the alkali-soluble resin is less than 50% by mass, the recording layer is deteriorated in durability, and in case where it exceeds 98% by mass, there arise some cases where both sensitivity and durability are deteriorated. In case where two or more kinds of alkali-soluble resins are used, the mixing ratio thereof may arbitrarily be determined.

Upper Layer Containing Water-insoluble and Alkali-soluble Resin and Development Inhibitor and Exhibiting Enhanced Solubility in Aqueous Alkali Solution Through Light Exposure <Development Inhibitor>

It is necessary that a development inhibitor is contained in the upper layer of the invention for enhancing the inhibition (solubilization inhibiting function).

The development inhibitor used in the invention is not particularly limited insofar as it causes an interaction with the alkalisoluble resin, whereby the solubility of the alkali-soluble resin in a developer solution is substantially lowered in an unexposed area, and in an exposed area, the interaction is reduced to become soluble in the developer. In particular, a quaternary ammonium salt and a polyethylene glycol compound are preferably used. There are such compounds that can function as a development inhibitor among an infrared absorber and an image coloring agent, which will be described later, and they may also be preferably exemplified.

The quaternary ammonium salt is not particularly limited, and examples thereof include a tetraalkylammonium salt, a trialkylarylammonium salt, a dialkyldiarylammonium salt, an alkyltriarylammonium salt, a tetraarylammonium salt, a cyclic ammonium salt and a bicyclic ammonium salt.

Specific examples thereof include tetrabutylammonium bromide, tetrapentylammonium bromide, tetrahexylammonium bromide, tetraoctylammonium bromide, tetralaurylammonium bromide, tetraphenylammonium bromide, tetranaphthylammonium bromide, tetrabutylammonium chloride, tetrabutylammonium iodide, tetrastearylammonium bromide, lauryltrimethylammonium bromide, stearyltrimethylammonium bromide, behenyltrimethylammonium bromide, lauryltriethylammonium bromide, phenyltrimethylammonium bromide, 3-trifluoromethylphenyltrimethylammonium bromide, benzyltrimethylammonium bromide, dibenzyldimethylammonium bromide, distearyldimethylammonium bromide, tristearylmethylammonium bromide, benzyltriethylammonium bromide, hydroxyphenyltrimethylammonium bromide and N-methylpyridinium bromide. In particular, quaternary ammonium salts described in Japanese Patent Application Nos. 2001-226297, 2001-370059 and 2001-398047 are preferred.

The addition amount of the quaternary ammonium salt is preferably from 0.1 to 50% by mass, and more preferably from 1 to 30% by mass, based on the total solid content of the upper layer. In case where it is less than 0.1% by mass, there arise some cases where the development inhibiting effect is lowered. In case where it exceeds 50% by mass, there are some cases where the film forming property of the alkali-soluble resin is adversely affected.

The polyethylene glycol compound is not particularly limited, and examples thereof include those having a structure represented by the following formula (2):

$$R^{11}—(—O—(R^{13}—O—)_m—R^{12})_n \quad (2)$$

In formula (2), $R^{11}$ represents a polyhydric alcohol residues or a polyhydric phenol residue, $R^{12}$ represents a hydrogen atom, an alkyl group having from 1 to 25 carbon atoms, which may have a substituent, an alkenyl group, an alkynyl group, an alkyloyl group, an aryl group or an aryloyl group, $R^{13}$ represents an alkylene group, which may have a substituent, m represents an integer of 10 or more in terms of average, and n represents an integer of from 1 to 4.

Examples of the polyethylene glycol compound represented by formula (2) include a polyethylene glycol compound, a polypropylene glycol compound, a polyethylene glycol alkyl ether, a polypropylene glycol alkyl ether, a polyethylene glycol aryl ether, a polypropylene glycol aryl ether, a polyethylene glycol alkyl aryl ether, a polypropylene glycol alkyl aryl ether, a polyethylene glycol glycerin ester, a polypropylene glycol glycerin ester, a polyethylene sorbitol ester, a polypropylene glycol sorbitol ester, a polyethylene glycol aliphatic acid ester, a polypropylene glycol aliphatic acid ester, a polyethylene glycolated ethylenediamine, a polypropylene glycolated ethylenediamine, a polyethylene glycolated diethylenetriamine and a polypropylene glycolated diethylenetriamine.

Specific examples thereof include polyethylene glycol 1000, polyethylene glycol 2000, polyethylene glycol 4000, polyethylene glycol 10000, polyethylene glycol 20000, polyethylene glycol 5000, polyethylene glycol 100000, polyethylene glycol 200000, polyethylene glycol 500000, polypropylene glycol 1500, polypropylene glycol 3000, polypropylene glycol 4000, polyethylene glycol methyl ether, polyethylene glycol ethyl ether, polyethylene glycol phenyl ether, polyethylene glycol dimethyl ether, polyethylene glycol diethyl ether, polyethylene glycol diphenyl ether, polyethylene glycol lauryl ether, polyethylene glycol dilauryl ether, polyethylene glycol nonyl ether, polyethylene glycol cetyl ether, polyethylene glycol stearyl ether, polyethylene glycol distearyl ether, polyethylene glycol behenyl ether, polyethylene glycol dibehenyl ether, polypropylene glycol methyl ether, polypropylene glycol ethyl ether, polypropylene glycol phenyl ether, polypropylene glycol dimethyl ether, polypropylene glycol diethyl ether, polypropylene glycol diphenyl ether, polypropylene glycol lauryl ether, polypropylene glycol dilauryl ether, polypropylene glycol nonyl ether, polyethylene glycol acetyl ester, polyethylene glycol diacetyl ester, polyethylene glycol benzyl ester, polyethylene glycol lauryl ester, polyethylene glycol dilauryl ester, polyethyelen glycol nonyl ester, polyethylene glycol cetyl ester, polyethylene glycol stearoyl ester, polyethylene glycol distearoyl ester, polyethylene glycol behenyl ester, polyethylene glycol dibehenyl ester, polypropylene glycol acetyl ester, polypropylene glycol diacetyl ester, polypropylene glycol benzyl ester, polypropylene glycol dibenzyl ester, polypropylene glycol lauryl ester, polypropylene glycol dilauryl ester, polypropylene glycol nonyl ester, polyethylene glycol glycerin ether, polypropylene glycol glycerin ester, polyethylene glycol sorbitol ether, polypropylene glycol sorbitol ether, polyethylene glycolated ethylenediamine, polypropylene glycolated ethylenediamine, polyethylene glycolated diethylenetriamine, polypropylene glycolated diethylenetriamine and polyethylene glycolated pentamethylenehexamine.

The addition amount of the polyethylene glycol compound is preferably from 0.1 to 50% by mass, and more preferably from 1 to 30% by mass, based on the total solid content in the upper layer. In case where it is less than 0.1% by mass, there arise some cases where the development inhibiting effect is lowered. In case where the compound is added in an amount exceeding 50% by mass, there are some cases where the polyethylene glycol compound accelerates penetration of a developer owing to the fact that it cannot cause an interaction with the alkali-soluble resin, whereby the image forming property is adversely affected.

In case where such a measure is adopted to increase the inhibition (solubilization inhibiting function) as described supra, there arise cases where the sensitivity is lowered. In these cases, the addition of a lactone compound to the upper layer is effective to suppress the decrease in sensitivity. It is considered that, in the case where a lactone compound is added, when a developer solution is penetrated into a recording layer in an exposed area, i.e., an area where the inhibition is lost, the lactone compound is readily allowed to react with the developer, and hence a carboxylic acid compound is newly formed to accelerate dissolution of the recording layer in the exposed area, to thereby improve sensitivity. The lactone compound in an unexposed area causes an interaction with a polar group in the alkali-soluble resin, for example, a hydroxyl group in a novolak resin, and is stably present in the film owing to the bulky structure having a cyclic structure. Therefore, even in case where the alkali developer is in contact with the surface of the unexposed area, the rapid ring-opening reaction of the lactone ring during the developing treatment is suppressed, whereby the developing resistance of the area is not lowered. The interaction is readily released due to exposure or heating more easily than the inhibiting function of the solubility inhibiting agent, the ring-opening reaction of the lactone compound in the exposed area quickly proceeds.

The lactone compound is not particularly limited, and examples thereof include a compound represented by the following formulae (L-I) and (L-II):

Formula (L-I)

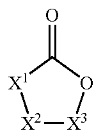

Formula (L-II)

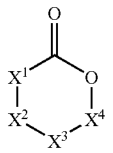

In formulae (L-I) and (L-II), $X^1$, $X^2$, $X^3$ and $X^4$, which may be the same or different, each represent a divalent non-metallic atom or a non-metallic atomic group to constitute a ring. These may independently have a substituent. Furthermore, at least one of $X^1$, $X^2$ and $X^3$ in formula (L-I) and $X^1$, $X^2$, $X^3$ and $X^4$ in formula (L-II) are preferably an electron withdrawing substituent or a substituent replaced with an electron withdrawing substituent.

The non-metallic atom or non-metallic atomic group is preferably an atom or an atomic group selected from a methylene group, a sulfinyl group, a carbonyl group, a thiocarbonyl group, a sulfonyl group, a sulfur atom, an oxygen atom and a selenium atom, and more preferably an atomic group selected from a methylene group, a carbonyl group and a sulfonyl group.

The electron withdrawing substituent as used herein is a group having a positive-type value of the Hammett's substituent constant σp. With respect to the Hammett's substituent constant, reference can be made to Journal of Medical Chemistry, Vol. 16, No. 11, p. 1207-1216 (1973) or the like. Examples of an electron withdrawing substituent having a positive-type Hammett's substituent constant up include a halogen atom (such as a fluorine atom (σp: 0.06), a chlorine atom (σp:0.23), a bromine atom (σp: 0.23) and an iodine atom (σp: 0.18)), a trihaloalkyl group (such as a tribromomethyl group (σp: 0.29), a trichloromethyl group (σp: 0.33) and a trifluoromethyl group (σp: 0.54)), a cyano group (σp: 0.66), a nitro group (σp: 0.78), an aliphatic, aryl or heterocyclic sulfonyl group (such as a methanesulfonyl group (σp: 0.72)), an aliphatic, aryl or heterocyclic acyl group (such as an acetyl group (σp: 0.50) and a benzoyl group (σp: 0.43)), an alkynyl group (such as a C≡CH group (σp: 0.23)), an aliphatic, aryl or heterocyclic oxycarbonyl group (such as a methoxycarbonyl group (σp: 0.45 and a phenoxycarbonyl group (σp: 0.44)), a carbamoyl group (σp: 0.36), a sulfamoyl group (σp: 0.57), a sulfoxide group, a heterocyclic group, an oxo group and a phosphoryl group.

Preferred examples of the electron withdrawing group include an amide group, an azo group, a nitro group, a fluoroalkyl group having from 1 to 5 carbon atoms, a nitrile group, an alkoxycarbonyl group having from 1 to 5 carbon atoms, an acyl group having from 1 to 5 carbon atoms, an alkylsulfonyl group having from 1 to 9 carbon atoms, an arylsulfonyl group having from 6 to 9 carbon atoms, an alkylsulfinyl group having from 1 to 9 carbon atoms, an arylsulfinyl group having from 6 to 9 carbon atoms, an arylcarbonyl group having from 6 to 9 carbon atoms, a thiocarbonyl group, a fluorine-containing alkyl group having from 1 to 9 carbon atoms, a fluorine-containing aryl group having from 6 to 9 carbon atoms, a fluorine-containing allyl group having from 3 to 9 carbon atoms, an oxo group and a halogen atom. More preferred examples thereof include a nitro group, a fluoroalkyl group having from 1 to 5 carbon atoms, a nitrile group, an alkoxycarbonyl group having from 1 to 5 carbon atoms, an acyl group having from 1 to 5 carbon atoms, an arylsulfonyl group having 6 to 9 carbon atoms, an arylcarbonyl group having from 6 to 9 carbon atoms, an oxo group and a halogen atom.

Specific examples of the compound represented by formulae (L-I) and (L-II) include the following compounds (L-I-1) to (L-1-24) and (L-II-1) to (L-II-2), but the invention is not limited thereto.

(L-I-1)

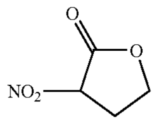

(L-I-2)

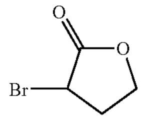

(L-I-3)

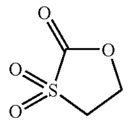

(L-I-4)

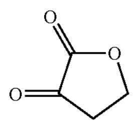

(L-I-5)

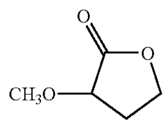

(L-I-6)

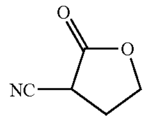

-continued
(L-I-7)
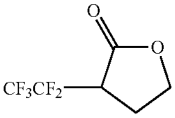
(L-I-8)
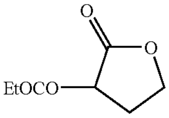
(L-I-9)
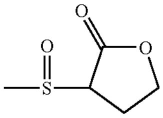
(L-I-10)
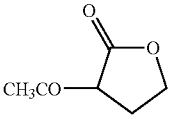
(L-I-11)
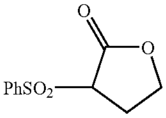
(L-I-12)
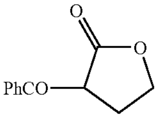
(L-I-13)
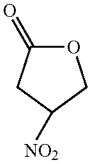
(L-I-14)
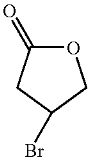
(L-I-15)
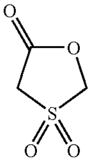
(L-I-16)
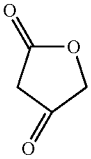
-continued
(L-I-17)
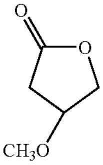
(L-I-18)
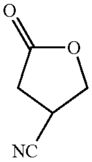
(L-I-19)
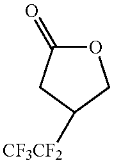
(L-I-20)
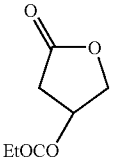
(L-I-21)
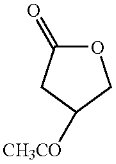
(L-I-22)
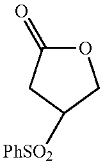
(L-I-23)
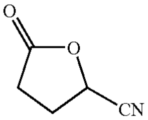
(L-I-24)
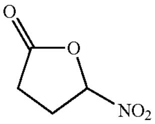
(L-II-1)
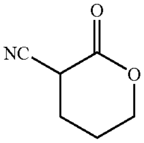

-continued (L-II-2)

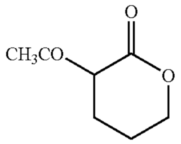

The addition amount of the compound represented by formulae (L-I) and (L-II) is preferably from 0.1 to 50% by mass, and more preferably from 1 to 30% by mass, based on the total solid content of the upper layer. In case where it is less than 0.1% by mass, insufficient effect is obtained, and in case where it is added in an amount exceeding 50% by mass, there arise some cases where the image forming property is impaired.

The lactone compound used in the invention may be used solely or in combination of two or more kinds thereof. In case where two or more kinds of the compounds represented by the general formula (L-I) or two or more kinds of the compounds represented by formula (L-II) are used, the compounds may be used in combination at an arbitrary proportion so long as the total addition amount is within the aforementioned range.

It is preferred in the invention that such a substance that is thermally decomposable and substantially lowers the solubility of the alkali-soluble resin in the undecomposed state, such as an onium salt, an o-quinonediazide compound, an aromatic sulfone compound and an aromatic sulfonate ester compound, is preferably used in combination with the development inhibitor for improving the inhibition to a developer in an image area.

Examples of the onium salt used in the invention include a diazonium salt, an ammonium salt, a phosphonium salt, an iodonium salt, a sulfonium salt, a selenonium salt and an arsonium salt. Particularly preferred examples thereof include diazonium salts described in S. I. Schlesinger, Photogr. Sci. Eng., vol. 18, p. 387 (1974), T. S. Bal, et al., Polymer, vol. 21, p. 423 (1980) and JP-A No. 5-158230, ammonium salts described in U.S. Pat. Nos. 4,069,055 and 4,069,056, and JP-A No. 3-140140, phosphonium salts described in D. C. Necker, et al., Macromolecules, vol. 17, p. 2468 (1984), C. S. Wen, et al., Teh. Proc. Conf. Rad. Curing ASIA, p. 478, Tokyo, Oct of 1988, and U.S. Pat. Nos. 4,069,055 and 4,069,056; iodonium salts described in J. V. Crivello, et al., Macromolecules, vol. 10(6), p. 1307 (1977), Chem & Eng. News, Nov. 28, p. 31 (1988), European Patent No. 104,143, U.S. Pat. Nos. 5,041,358 and 4,491,628, JP-A Nos. 2-150848 and 2-296514, sulfonium salts described in J. V. Crivello, et al., Polymer J., vol. 17, p. 73 (1985), J. V. Crivello, et al., J. Org. Chem., vol.43, p.3055 (1978), W. R. Watt, et al., J. Polymer Sci., Polymer Chem. Ed., vol. 22, p. 1789 (1984), J. V. Crivello, et al., Polymer Bull., vol. 14, p. 279 (1985); J.V. Crivello, et al, Macromolecules, vol. 14(5), p. 1141 (1981), J. V. Crivello, et al., J. Polymer Sci., Polymer Chem. Ed., vol. 17, p. 2877 (1979), European Patent Nos. 370,693, 233,567, 297,443 and 297,442, U.S. Pat. Nos. 4,933,377, 3,902,114, 4,491,628, 4,760,013, 4,734,444 and 2,833,827, and German Patent Nos. 2,904,626, 3,604,580 and 3,604,581; selenonium salts described in J. V. Crivello, et al., Macromolecules, vol. 10(6), p. 1307 (1977) and J. V. Crivello, et al., J. Polymer Sci., Polymer Chem. Ed., vol. 17, p. 1047 (1979), and arsonium salts described in C. S. Wen, et al., Teh. Proc. Conf. Rad. Curing ASIA, p. 478, Tokyo, October of 1988.

Among the foregoing onium salts, a diazonium salt is particularly preferred. Particularly preferred examples of a diazonium salt include those described in JP-A No. 5-158230.

Examples of a counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphtol-5-sulfonic acid, 2-methoxy-4-hydroxy-5-benzoylbenzenesulfonic acid and p-toluenesulfonic acid. Among these, hexafluorophosphoric acid and an alkylaromatic sulfonic acid, such as triisopropylnaphthalenesulfonic acid and 2,5-dimethylbenzenesulfonic acid, are particularly preferred.

Preferred examples of the quinonediazide include an o-quinonediazide compound. The o-quinonediazide compound used in the invention is a compound that has at least one o-quinonediazide group and acquires increased alkali-solubility through thermal decomposition, and those having various structures may be used. The compound assists the solubility of the upper layer through both effects, i.e., that o-quinonediazide loses inhibition as a development inhibitor through thermal decomposition, and o-quinonediazide itself transforms to an alkali-soluble substance.

As the o-quinonediazide compound, for example, compounds described in Jaromir Kosar, Light-sensitive Systems (John Wiley & Sons, Inc.), p. 339 to 352 can be used, and in particular, a sulfonate ester and a sulfonic amide of the o-quinonediazide obtained as the reaction product with various kinds of aromatic polyhydroxy compounds or aromatic amino compounds are preferred. Also preferably used include an ester of benzoquinone-(1,2)-diazidesulfonic acid chloride or naphthoquinone-(1,2)-diazide-5-sulfonic acid chloride with a pyrogallol acetone resin described in JP-B No. 43-28403, and an ester of benzoquinone-(1,2)-diazidesulfonic acid chloride or naphthoquinone(1,2)-diazide-5-sulfonic acid chloride with a phenol formaldehyde resin described in U.S. Pat. Nos. 3,046,120 and 3,188,210.

An ester of naphthoquinone-(1,2)-diazide-4-sulfonic acid chloride with a phenol formaldehyde resin or a cresol formaldehyde resin and an ester of naphthoquinone-(1,2)-diazide-4-sulfonic acid chloride with a pyrogallol acetone resin can also be preferably used. Other useful o-quinonediazide compounds have been reported in publications, and examples thereof include those described in JP-A Nos. 47-5303, 48-63802, 48-63803, 48-96575, 49-38701 and 48-13354, JP-B Nos. 41-11222, 45-9610 and 49-17481, U.S. Pat. Nos. 2,797,213, 3,454,400, 3,544,323, 3,573,917, 3,674,495 and 3,785,825, British Patent Nos. 1,227,602, 1,251,345, 1,267,005, 1,329,888 and 1,330,932, and German Patent No. 854,890.

The addition amount of the o-quinonediazide compound is preferably from 1 to 50% by mass, more preferably from 5 to 30% by mass, and particularly preferably from 10 to 30% by mass, based on the total solid content of the upper layer. The compound may be used solely or in combination of plural kinds thereof.

An alkali-soluble resin having been at least partially esterified described in JP-A No. 11-288089 may also be contained.

In order to strengthen the inhibition on the surface of the recording layer and to strengthen scratch resistance on the surface, it is preferred to use a polymer formed with, as a polymerization component, a (meth)acrylate monomer having two or three perfluoroalkyl groups having from 3 to 20 carbon atoms in the molecule described in JP-A No. 2000-187318, in combination.

The addition amount of the polymer is preferably from 0.1 to 10% by mass, and more preferably from 0.5 to 5% by mass, based on the total solid content of the upper layer.

<Infrared Absorber>

It is necessary in the planographic printing plate precursor of the invention that an infrared absorber is added to at least one of the lower layer and the upper layer of the recording layer. The infrared absorber is not particularly limited insofar as it is such a dye that absorbs an infrared ray and generates heat, and various kinds of dyes known as infrared absorbers may be used.

As the infrared absorber for use in the invention, commercially available dyes and those known in the art described in literatures (for example, Senryo Binran (Dyes Handbook), edited by The Society of Synthetic Organic Chemistry, Japan (1970)) are employable. Specific examples thereof include an azo dye, a metallic complex azo dye, a pyrazolone azo dye, an anthraquinone dye, a phthalocyanine dye, a carbonium dye, a quinonimine dye, a methine dye and a cyanine dye. Those absorbing an infrared ray or a near infrared ray among these are preferred in the invention since they may suitably be used with a laser emitting an infrared ray or a near infrared ray.

Examples of the dye absorbing an infrared ray or a near infrared ray include cyanine dyes described in JP-A Nos. 58-125246, 59-84356, 59-202829 and 60-78787, methine dyes described in JP-A Nos. 58-173696, 58-181690 and 58-194595, naphthoquinone dyes described in JP-A Nos. 58-112793, 58-224793, 59-48187, 59-73996, 60-52940 and 60-63744, a squalirium dye described in JP-A No. 58-112792, and a cyanine dye described in British Patent No. 434,875.

An infrared absorbing sensitizing agent described in U.S. Pat. No. 5,156,938 is also preferably used as the dye, and also preferably used include an arylbenzo(thio)pyrylium salt described in U.S. Pat. No. 3,881,924, a trimethinethiapyrilium salt described in JP-A No. 57-142645 (U.S. Pat. No. 4,327,169), pyrylium compounds described in JP-A Nos. 58-181051, 58-220143, 59-41363, 59-84248, 59-84249, 59-146063 and 59-146061, a cyanine dye described in JP-A No. 59-216146, a pentamethinethiopyrilium salt described in U.S. Pat. No. 4,283,475, and pyrylium compounds described in JP-B Nos. 5-13514 and 5-19702, and also includes, as commercially available products, EPOLIGHT III-178, EPOLIGHT III-130 and EPOLIGHT III-125, produced by Epolin, Inc.

Other preferred examples of the dye include infrared absorbing dyes as described as the formulae (I) and (II) in U.S. Pat. No. 4,756,993.

The infrared absorber is preferably added to the upper layer of the recording layer or to the vicinity thereof from the standpoint of sensitivity. In particular, in case where a dye having a solubility inhibiting function, such as a cyanine dye, is added in combination with the alkali-soluble resin, high sensitivity is obtained, and simultaneously, alkali-solubility resistance may be imparted to an unexposed part. The infrared absorber may be added to the lower layer or to both the upper layer and the lower layer. When it is added to the lower layer, higher sensitivity is obtained. In case where the infrared absorber is added to both the upper layer and the lower layer, the same compound may be added thereto, or alternatively, different compounds may be added thereto, respectively.

The infrared absorber may be added to the same layer as the recording layer, or alternatively, may be added to another layer separately provided. In case where it is added to the separate layer, it is preferably added to the layer adjacent to the recording layer.

In case where the infrared absorber is a compound having a solubility inhibiting function, it is preferably added to the same layer as the alkali-soluble resin since the infrared absorber not only exerts the photothermally conversing function but also functions as the development inhibitor.

The addition amount of the infrared absorber to the upper layer is generally from 0.01 to 50% by mass, preferably from 0.1 to 30% by mass, and particularly preferably from 1.0 to 30% by mass, based on the total solid content of the upper layer. In case where the addition amount is less than 0.01% by mass, there arise some cases where sensitivity is lowered, and it exceeds 50% by mass, there are some case where uniformity of the upper layer of the recording layer is impaired to deteriorate durability of the upper layer of the recording layer.

In case where the infrared absorber is added to the lower layer, the addition amount thereof is generally from 0 to 20% by mass, preferably from 0 to 10% by mass, and particularly preferably from 0 to 5% by mass, based on the total solid content of the lower layer.

In case where the infrared absorber is added to the lower layer, solubility of the lower layer is lowered the infrared absorber having the solubility inhibiting function is used, but the infrared absorber generates heat upon exposure to infrared laser light, and an increase in solubility of the lower layer may be expected owing to the generated heat. Therefore, the species and the amount of the compound to be added should be determined in view of the balance of the functions. In an area having a thickness of from 0.2 to 0.3 μm in the vicinity of the support, it is difficult to obtain an increase in solubility due to diffusion of heat generated upon exposure to the support, and a decrease in solubility of the lower layer caused by addition of the infrared absorbing dye may cause a decrease in sensitivity. Therefore, even in the aforementioned ranges of the addition amount, an addition amount to provide a dissolution rate of the lower layer to a developer (at 25 to 30° C.) below 30 nm/sec is not preferred.

<Other Additives>

Upon forming the lower layer and the upper layer of the recording layer of the invention, in addition to the aforementioned essential components, various kinds of additives may further be added depending on necessity unless the effect of the invention is impaired. Examples of the additives are shown below, which may be added only to the lower layer, only to the upper layer, or to both the layers.

<Development Accelerator>

An acid anhydride, a phenol compound and an organic acid may be added to the upper layer and/or the lower layer of the recording layer of the invention to improve sensitivity.

As the acid anhydride, a cyclic acid anhydride is preferred. Specific examples of the cyclic acid anhydride include phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, a-phenylmaleic anhydride, succinic anhydride and pyromellitic anhydride as described in U.S. Pat. No. 4,115,128. Examples of an acyclic acid anhydride include acetic anhydride.

Examples of the phenol compound include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane.

Examples of the organic acid include a sulfonic acid compound, a sulfinic acid compound, an alkylsulfuric acid compound, a phosphonic acid compound, a phosphate ester compound and a carboxylic acid compound described in JP-A Nos. 60-88942 and 2-96755. Specific examples thereof include p-toluenesulfonic acid, dodecylbenzenesulfonic acid, p-toluenesulfinic acid, ethylsulfuric acid, phenylphosphonic acid, phenylphophinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid.

The content of the acid anhydride, the phenol compound and the organic acid is preferably from 0.05 to 20% by mass, more preferably from 0.1 to 15% by mass, and particularly preferably from 0.1 to 10% by mass, based on the total solid content of the lower layer or the upper layer.

<Surfactant>

A surfactant may be added to the upper layer and/or the lower layer of the recording layer of the invention to improve coating property and to enhance stability of processing with respect to developing conditions. Examples of the surfactant include nonionic surfactants described in JP-A Nos. 62-251740 and 3-208514, amphoteric surfactants described in JP-A No.s 59-121044 and 4-13149, a siloxane compound described in EP-A No. 950,517, and copolymers of fluorine-containing monomers described in JP-A Nos. 62-170950 and 11-288093 and Japanese Patent Application No. 2001-247351.

Specific examples of the nonionic surfactant include sorbitan tristearate, sorbitan mono palmitate, sorbitan trioleate, stearic monoglyceride and polyoxyethylene nonyl phenyl ether. Specific examples of the amphoteric surfactant include alkyldi(aminoethyl) glycine, alkylpolyaminoethylglycine hydrochloride, 2-alkyl-N-carboxyethyl—N-hydroxyethylimidazoliumbetaine and N-tetradecyl-N,N-betaine type (for example, AMOGEN K, a trade name, produced by Dai-ichi Kogyo Seiyaku Co., Ltd.).

The siloxane compound is preferably a block copolymer of dimethylsiloxane and polyalkylene oxide, and specific examples thereof include a polyalkylene oxide-modified silicone, such as DBE-224, DBE-621, DBE-712, DBP-732 and DBP-534, produced by Chisso Corp., and TEGO GLIDE 100, produced by Tego Chemie Service GmbH, Germany.

The content of the nonionic surfactant and the amphoteric surfactant in the lower layer or the upper layer is preferably from 0.01 to 15% by mass, more preferably from 0.1 to 5.0% by mass, and further preferably from 0.05 to 2.0% by mass, based on the total solid content in the lower layer or the upper layer.

<Printing-out Agent/Image Coloring Agent>

The upper layer and/or the lower layer of the recording layer of the invention may contain a printing-out agent for obtaining a visible image immediately after heating by exposure, and a dye and a pigment as an image coloring agent.

Representative examples of the printing-out agent include a combination of a compound to release an acid through heating by exposure (a photo acid releasing agent) and an organic dye capable of forming a salt. Specific examples thereof include a combination of o-naphthoquinonediazide-4-sulfonic acid halogenide and a salt-forming organic dye described in JP-A Nos. 50-36209 and 53-8128, and a combination of a trihalomethyl compound and a salt-forming organic dye described in JP-A Nos. 53-36223, 54-74728, 60-3626, 61-143748, 61-151644 and 63-58440. Examples of the trihalomethyl compound include an oxazole compound and a triazine compound, both of which are excellent in time-lapse stability and provide a clear printing-out image.

As the image coloring agent, other dyes may be used in addition to the aforementioned salt-forming organic dye. Preferred examples of the dye encompassing the salt-forming organic dye include an oil soluble dye and a basic dye. Specific examples thereof include OIL YELLOW #101, OIL YELLOW #103, OIL PINK #312, OIL GREEN BG, OIL BLUE BOS, OIL BLUE #603, OIL BLACK BY, OIL BLACK BS, and OIL BLACK T-505, produced by Orient Chemical Co., Ltd., Victoria Pure Blue, Crystal Violet Lactone, Crystal Violet (CI 42555), Methyl Violet (CI 42535), Ethyl Violet, Rhodamine B (CI 145170B), Malachite Green (CI 42000) and Methylene Blue (CI 52015). A dye described in JP-A No. 62-293247 is particularly preferred.

The dye may be added to the lower layer and/or the upper layer in an amount of from 0.01 to 10% by mass, and preferably from 0.1 to 3% by mass, based on the total solid content in the lower layer or the upper layer.

<Plasticizer>

The upper layer and/or the lower layer of the recording layer of the invention may contain a plasticizer for imparting flexibility to a coated film. Examples thereof include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate and an oligomer or a polymer of acrylic acid or methacrylic acid.

The plasticizer may be added to the lower layer and/or the upper layer in an amount of from 0.5 to 10% by mass, and preferably from 1.0 to 5% by mass, based on the total solid content of the lower layer or the upper layer.

<Wax>

The upper layer of the recording layer of the invention may contain such a compound that lowers a static friction coefficient of the surface (wax) to impart scratch resistance. Specific examples of the compound include compounds having an ester of a long-chain alkyl carboxylic acid described in U.S. Pat. No. 6,117,913 and Japanese Patent Application Nos. 2001-261627, 2002-32904 and 2002-165584, which are proposed by the inventor. The addition amount of the wax in the upper layer is preferably from 0.1 to 10% by mass, and more preferably from 0.5 to 5% by mass.

Formation of Recording Layer

The lower layer and the upper layer of the recording layer of the planographic printing plate precursor according to the invention may be formed by dissolving the aforementioned components in a solvent, and applying a coating on an appropriate support.

Examples of the solvent that may be used herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, y-butyrolactone and toluene, but the invention is not limited to them. The solvent may be used solely or in combination of two or more thereof.

The lower layer and the upper layer are basically preferably formed separately from each other.

Examples of the method for forming the two layers separately include such a method that utilizes a difference in solubility in the solvent between the components contained in the lower layer and the components contained in the upper layer, and such a method that the upper layer is coated and then quickly dried to remove the solvent.

The methods will be described below, but the method for coating the two layers separately is not limited thereto.

In the method utilizing the difference in solubility in the solvent between the components contained in the lower layer and the components contained in the upper layer, a solvent system that does not dissolve all the components contained in the lower layer is employed for coating the coating composition for the upper layer. According to the method, the two layers may clearly separately be formed into coated films even when conducting a double-layer coating.

For example, components that are insoluble in a solvent capable of dissolving the alkali-soluble resin, which is the component of the upper layer, such as methyl ethyl ketone and 1-methoxy-2-propanol, are employed as the components of the lower layer, and the lower layer is coated and dried by using a solvent system that dissolves the components of the lower layer. Thereafter, the components of the upper layer containing the alkali-soluble resin as a main component are dissolved, coated and dried by using a solvent that does not dissolve the lower layer, such as methyl ethyl ketone and 1-methoxy-2-propanol, whereby the two layers are separately formed.

Examples of the method of quickly drying the solvent after coating the upper layer include a method of blowing high-pressure air from a slit nozzle disposed substantially perpendicular to the running direction of the web, a method of applying heat energy to the lower surface of the web through a roll (heating roll), to which a heating medium, such as steam, is internally fed, and a method combining these methods.

In order to impart another function, it is possible to render the lower layer and the upper layer to be partial mutual soluble with each other in such an extent that the effect of the invention is sufficiently exerted. In this case, partial mutual solubility is enabled by controlling the difference in solubility in the solvent, the drying rate after coating of the solvent of the upper layer, and the like.

The concentration of the components other than the solvent (total solid content including the additives) in the coating compositions for the lower layer and the upper layer to be coated on the support is preferably from 1 to 50% by mass.

The method for coating the coating composition on the support may be various kinds of methods. Examples thereof include bar coater coating, spin coating, spray coating, curtain coating, dip coating, air knife coating, blade coating and roll coating.

In order to prevent the lower layer from being damaged upon coating the upper layer, the coating method is preferably a non-contact coating method. Bar coater coating, which is generally used for coating a solvent system coating composition, may be used while it is a contact coating, and in this case, it is preferred that the coating is effected by forward rotation for preventing damages of the lower layer.

In the invention, the coated amount after drying of the lower layer coated on the support is preferably in a range of from 0.5 to 4.0 $g/m^2$, and more preferably in a range of from 0.6 to 2.5 $g/m^2$. In the case where it is less than 0.5 $g/m^2$, it is not preferred since there are some cases where it causes deterioration in printing durability, and in case where it exceeds 4.0 $g/m^2$, it is also not preferred since there are some cases where the image reproducibility is deteriorated, and the sensitivity is lowered.

The coated amount after drying of the upper layer is preferably in a range of from 0.05 to 1.0 $g/m^2$, and more preferably in a range of from 0.08 to 0.7 $g/m^2$. In the case where it is less than 0.05 $g/m^2$, it is not preferred since it causes deterioration in development latitude and scratch resistance, and in the case where it exceeds 1.0 $g/m^2$, it is also not preferred since sensitivity is lowered.

The total coated amount after drying of the lower layer and the upper layer is preferably in a range of from 0.6 to 4.0 $g/m^2$, and more preferably in a range of from 0.7 to 2.5 $g/m^2$. In case where it is less than 0.6 $g/m^2$, it is not preferred since there are some cases where it causes deterioration in printing durability, and in the case where it exceeds 4.0 $g/m^2$, it is also not preferred since there arise some cases where image reproducibility is deteriorated, and sensitivity is lowered.

The case where the recording layer of the planographic printing plate precursor according to the invention has the single layer structure will be described.

In case where the planographic printing plate precursor according to the invention has a recording layer having the single layer structure (i.e., the planographic printing plate precursors according to the second, fourth and sixth aspects), the recording layer contains the particular alkali-soluble resin, the development inhibitor and the infrared absorber, and other arbitrary components may be used in combination unless the effects of the invention are impaired. The details of the components are the same as those described for the components used in the upper layer of the recording layer having the multi-layer structure.

As described in the foregoing, the content of the particular alkali-soluble resin in the total alkali-soluble resin contained in the recording layer having the single layer structure is preferably more than 10% by mass, and more preferably more than 50% by mass. Examples of the alkali-soluble resin that may be used in combination are the same as those of the alkali-soluble resin that may be used in the upper layer of the recording layer having the multi-layer structure.

With respect to preferred contents of the components in the recording layer having the single layer structure, the total content of the alkali-soluble resin containing the particular alkali-soluble resin is preferably about from 20 to 90% by mass, and more preferably about from 30 to 80% by mass, the content of the development inhibitor is preferably about from 1 to 30% by mass, and more preferably about from 3 to 25% by mass, and the content of the infrared absorber is preferably about from 0.5 to 30% by mass, and more preferably about from 2 to 10% by mass.

The coated amount of the recording layer having the single layer structure is preferably in a range of from 0.6 to 4.0 $g/m^2$, and more preferably in a range of from 0.8 to 3.0 $g/m^2$. In case where the coated amount is too small, there is such a tendency that the film property is deteriorated to lower the printing durability although the apparent sensitivity is improved.

Support

The support used in the planographic printing plate precursor according to the invention is not particularly limited insofar as it is a dimensionally stable plate-shaped material having a necessary strength and durability. Examples thereof include paper, paper laminated with plastics (such as polyethylene, polypropylene and polystyrene), a metallic plate (such as aluminum, zinc and copper), a plastic film (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinylacetal), and paper or a plastic film having the metal laminated or vapor-deposited.

Among these, a polyester film and an aluminum plate are preferred in the invention. Particularly, an aluminum plate, which is good in dimensional stability and is relatively inexpensive, is preferred. Preferred examples of the aluminum plate include a pure aluminum plate and an alloy plate containing aluminum as a major component with a small amount of hetero-element, and a plastic film laminated or deposited with aluminum is also included. Examples of the heteroelement contained in the aluminum alloy include silicon, iron, manganese, copper, magnesium chromium, zinc, bismuth, nickel and titanium. The content of the hetero-element is at most 10% by mass or less.

Aluminum used in the invention is particularly preferably pure aluminum, but because it is difficult to obtain completely pure aluminum under the current refining technique, aluminium containing a minute amount of a foreign element may be used.

As described herein, the aluminum plate used in the invention is not limited in composition, and an aluminum plate produced from a known aluminum material may be appropriately utilized. The aluminum plate used in the invention generally has a thickness of about 0.1 to 0.6 mm, preferably about from 0.15 to 0.4 mm, and particularly preferably from 0.2 to 0.3 mm.

The aluminum plate may be subjected, depending on necessity, to a surface treatment, such as a surface roughening treatment and an anodic oxidation treatment. The surface treatment will be described below.

Before roughening the surface of the aluminum plate, a degreasing treatment with a surfactant, an organic solvent or an aqueous alkali solution for removing a rolling oil on the surface is carried out depending on necessity. Examples of the surface roughening treatment of the aluminum plate include a method of mechanically roughening, a method of electrochemically dissolving and roughening the surface, and a method of selectively dissolving the surface chemically. Examples of the mechanical method include such known methods as a ball grinding method, a brush grinding method, a blast grinding method and a buff grinding method. Examples of the electrochemical method include a method employed in a hydrochloric acid or nitric acid electrolytic solution by applying an alternating current or a direct current. Furthermore, a method combining these methods as described in JP-A No. 54-63902 may also be utilized.

The aluminum plate thus roughened is subjected, depending on necessity, to an alkali etching treatment and a neutralizing treatment, and then subjected to an anodic oxidation treatment for improving water retention and wear resistance of the surface, depending on desire. As an electrolyte used for the anodic oxidation treatment of the aluminum plate, various kinds of electrolytes that form a porous oxidized film may be used, and in general, sulfuric acid, phosphoric acid, oxalic acid, chromic acid or a mixed acid thereof is used. The concentration of the electrolyte is appropriately determined depending on the species of the electrolyte.

The conditions for anodic oxidation cannot generally be determined since they vary depending on the species of the electrolyte. Usually, the concentration of the electrolyte is from 1 to 80% by mass, the solution temperature is from 5 to 70° C., the electric current density is from 5 to 60 $A/dm^2$, the voltage is from 1 to 100 V, and the electrolysis time is from 10 seconds to 5 minutes. In case where the amount of the anodic oxidized film is less than 1.0 $g/m^2$, printing durability becomes insufficient, and the non-image area of the planographic printing plate is susceptible to damages, whereby so-called “stain due to scratch”, where an ink is attached to a scratched part upon printing, is liable to occur.

After subjecting the anodic oxidation treatment, the surface of the aluminum plate is subjected to a hydrophilic treatment, as necessary.

Examples of the hydrophilic treatment employed in the invention include an alkali metal silicate method (for example, using an aqueous sodium silicate solution) described in U.S. Pat. Nos. 2,714,066, 3,181,461, 3,280,734 and 3,902,734. In this method, the support is dipped in a sodium silicate aqueous solution or subjected to electrolysis performed therein. In addition, a method for treating in polyvinylsulfonic acid described in U.S. Pat. Nos. 3,276,868, 4,153,461 and 4,689,272 may also be used.

<Undercoating Layer>

In the planographic printing plate precursor of the invention, an undercoating layer may be provided, as necessary, between the support and the recording layer.

Various kinds of organic compounds are used as a component of the under coating layer. Examples thereof include carboxymethyl cellulose, dextrin, gum arabic, an organic phosphonic acid, such as phosphonic acid having an amino group, e.g., 2-aminoethylphosphonic acid, phenylphosphonic acid, which may have a substituent, napththylphosphonic acid, an alkylphosphonic acid, glycerophosphonic acid, methylenediphosphonic acid and ethylenediphosphonic acid, an organic phosphoric acid, such as phenylphosphoric acid, which may have a substituent, naphthylphosphoric acid, an alkylphosphoric acid and glycerophosphoric acid, an organic phosphinic acid, such as phenylphosphinic acid, which may have a substituent, naphthylphosphinic acid, an alkylphosphinic acid and glycerophosphinic acid, an amino acid, such as glycine and β-alanine, and a hydrochlorate of an amine having a hydroxyl group, such as triethanolamine, which may be used in combination as a mixture of two or more kinds thereof.

It is also preferred that the organic undercoating layer contains a compound having an onium group. The compound having an onium group is described in detail in JP-A Nos. 2000-10292 and 2000-108538. Furthermore, at least one compound selected from polymer compounds having a structural unit of poly(p-vinylbenzoic acid) in the molecule may be used. Specific examples thereof include a copolymer of p-vinylbenzoic acid and vinylbenzyltriethylammonium salt and a copolymer of p-vinylbenzoic acid and vinylbenzyltrimethylammonium chloride.

The organic undercoating layer may be provided in the following method. The aforementioned organic compound is dissolved in water or an organic solvent, such as methanol, ethanol and methyl ethyl ketone, to form a solution, which is coated on an aluminum plate, followed by drying, or in alternative, the aforementioned organic compound is dissolved in water or an organic solvent, such as methanol, ethanol and methyl ethyl ketone, in which an aluminum plate is dipped to adsorb the organic compound thereon. In the former method, a solution of the organic compound having a concentration of from 0.005 to 10% by mass may be coated in various methods. In the latter method, the concentration of the solution is generally from 0.01 to 20% by mass, and preferably from 0.05 to 5% by mass, the dipping temperature is generally from 20 to 90° C., and preferably from 25 to 50° C., and the dipping time is generally from 0.1 second to 20 minutes, and preferably from 2 seconds to 1 minute. The solution used herein may be adjusted to pH of from 1 to 12 with a basic substance, such as ammonia, triethylamine and potassium hydroxide, and an acidic substance, such as hydrochloric acid and phosphoric acid. A yellow dye may also be added to improve the tone reproducibility of the planographic printing plate precursor.

The coated amount of the organic undercoating layer is suitably from 2 to 200 mg/$m^2$, and preferably from 5 to 100 mg/$m^2$. In case where the coated amount is less than 2 mg/$m^2$ or exceeds 200 mg/$m^2$, sufficient printing durability may not be obtained.

The planographic printing plate precursor thus produced is imagewise exposed to light and then subjected to a developing treatment.

<Backcoating Layer>

A backcoating layer may be provided, depending on necessity, on a back surface of the support of the planographic printing plate precursor according to the invention. As the backcoating layer, a coated layer that contains an organic polymer compound described in JP-A No. 5-45885, or a metallic oxide obtained by hydrolysis and polycondensation of an organic or inorganic metallic compound described in JP-A No. 6-35174 is preferably used. An alkoxy compound of silicon, such as $Si(OCH_3)_4$, $Si(OC_2H_5)_4$, $Si(OC_3H_7)_4$ and $Si(OC_4H_9)_4$, is inexpensive and readily available, and thus, a coated layer of a metallic oxide obtained therefrom is particularly preferred due to its excellent resistance to a developer.

Exposure

A light source for active light used as exposure light for the planographic printing plate precursor according to the invention is preferably a light source having an emitting wavelength in the region of from a near infrared region to an infrared region, and a solid laser and a semiconductor laser are particularly preferred.

Developing Treatment

A developer that may be applied to a developing treatment of the planographic printing plate precursor according to the invention is the developer having a pH of from 9.0 to 14.0, and preferably from 12.0 to 13.5. As the developer (hereinafter, a replenisher will be inclusively referred to as a developer), conventionally known aqueous alkali solutions may be used. Examples for use as the developer include an inorganic alkali salt, such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. Examples thereof also include an organic alkali agent, such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine. The aqueous alkali solution may be used solely or in combination of two or more kinds thereof.

Among the aqueous alkali solutions, one of such developers that exert the effect of the invention is a so-called silicate developer as an aqueous solution having a pH of 12 or more, which contains an alkali silicate as a base or contains an alkali silicic acid formed by mixing a silicon compound with a base, and still more preferred one is a so-called non-silicate developer, which contains no alkali silicate but contains a nonreducing sugar (an organic compound having a buffering function) and a base.

In the former case, it is possible to control developing property by adjusting the mixing ratio (a molar ratio of $(SiO_2)/M_2O)$) and the concentration of silicon oxide $SiO_2$ and a metallic oxide $M_2O$ in an aqueous solution of an alkali metal silicate salt. For example, an aqueous solution of sodium silicate having a molar ratio of $SiO_2/Na_2O$ of from 1.0 to 1.5 (i.e., $(SiO_2)/(Na_2O)$ is from 1.0 to 1.5) and a content of $SiO_2$ of from 1 to 4% by mass described in JP-A No. 54-62004, and an aqueous solution of an alkali metal silicate salt having a ratio $(SiO_2)/(M)$ of from 0.5 to 0.75 (i.e., $(SiO_2)/(M_2O)$ is from 1.0 to 1.5) and a concentration of $SiO_2$ of from 1 to 4% by mass, in which the developer contains at least 20% of potassium based on the total gram atom of the alkali metal present therein, are preferably used.

A so-called non-silicate developer, which contains no alkali silicate but contains a nonreducing sugar and a base, is preferably applied to development of the planographic printing plate precursor according to the invention. In case where development of the planographic printing plate precursor is carried out using this developer, the surface of the recording layer is not deteriorated, and inking on the recording layer may sufficiently be maintained.

The developer contains, as main components, at least one compound selected from nonreducing sugars and at least one kind of bases, and it preferably has a pH in a range of from 9.0 to 13.5. The nonreducing sugar is a saccharide having no free aldehyde group or ketone group and exhibiting no reducing property, and is classified into a trehalose oligosaccharides in which reducing groups are bonded to each other, a glycoside in which a reducing group of a sugar and a non-sugar compound are bonded to each other, and a sugar alcohol in which a sugar is reduced by hydrogenation, all of which are preferably used. Examples of the trehalose oligosaccharides include saccharose and trehalose, and examples of the glycoside include an alkyl glycoside, a phenol glycoside and a mustard oil glycoside. Examples of sugar alcohol include D,L-arabit, ribit, xylit, D,L-sorbit, D,L-mannit, D,L-idit, D,L-talit, dulcit and allodulcit. Furthermore, maltitol obtained by hydrogenation of a disaccharide and a reduced product obtained by hydrogenation of oligosaccharide (reduced starch syrup) are preferably used. Particularly preferred nonreducing sugars among these are a sugar alcohol and saccharose, and in particular, D-sorbit, saccharose and reduced starch syrup are preferred since they have a buffering action in an appropriate pH range and are inexpensive.

The nonreducing sugar may be used solely or in combination of two or more kinds thereof, and the proportion thereof in the developer is preferably from 0.1 to 30% by mass, and more preferably from 1 to 20% by mass.

A sufficient buffering action cannot be obtained below the range, and at a concentration higher than the range, a higher concentration of the developer is difficult, and the cost is adversely increased. In case where a reducing sugar and a base are used in combination, there arises a problem in that the solution is discolored to turn brown with the lapse of time, and the pH is gradually decreased, whereby developing property is lowered.

As the base to be combined with the nonreducing sugar may be a conventionally known alkali agent. Examples thereof include inorganic alkali salts, such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate and ammonium borate. Examples thereof also include organic alkali agents, such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

The alkali agent may be used solely or in combination of two or more kinds thereof. Among these, sodium hydroxide and potassium hydroxide are preferred because the pH may be adjusted in a wide pH range by adjusting the amount thereof relative to the nonreducing sugar. Trisodium phosphate, tripotassium phosphate, sodium carbonate and potassium carbonate are also preferred since they have a buffering action by themselves.

The alkali agent is added to provide the pH of the developer in a range of from 9.0 to 13.5, and the addition amount thereof is determined depending on the intended pH range and the species and the amount of the nonreducing sugar. The pH range is more preferably from 10.0 to 13.2.

In the developer solution, an alkali buffer solution formed with a weak acid and a strong base other than saccharides may be used in combination. The weak acid used in the buffer solution is preferably those having a dissociation constant (pKa) of from 10.0 to 13.2.

The weak acid may be selected from those described in IONISATION CONSTANTS OF ORGANIC ACIDS IN AQUEOUS SOLUTION, published by Pergamon Press, Inc. Specific examples thereof include an alcohol, such as 2,2,3,3-tetrafluoropropanol-1 (pKa: 12.74), trifluoroethanol (pKa: 12.37) and trichloroethanol (pKa: 12.24), an aldehyde, such as pyridine-2-aldehyde (pKa: 12.68) and pyridine4-aldehyde (pKa: 12.05), a compound having a hydroxyl group, such as salicylic acid (pKa: 13.0), 3-hydroxy-2-naphthoic acid (pKa: 12.84), catechol (pKa: 12.6), gallic acid (pKa: 12.4), sulfosalicylic acid (pKa: 11.7), 3,4-dihydroxysulfonic acid (pKa: 12.2), 3,4-dihydroxybenzoic acid (pKa: 11.94), 1,2,4-trihydroxybenzene (pKa: 11.82), hydroquinone (pKa: 11.56), pyrogallol (pKa: 11.34), o-cresol (pKa: 10.33), resorcinol (pKa: 11.27), p-cresol (pKa: 10.27) and m-cresol (pKa: 10.09), an oxime, such as 2-butanoxime (pKa: 12.45), acetoxime (pKa: 12.42), 1,2-cycloheptanoxime (pKa: 12.3), 2-hydroxybenzaldehydoxime (pKa: 12.10), dimethylglyoxime (pKa: 11.9), ethanediamidedioxime (pKa: 11.37) and aectophenoneoxime (pKa: 11.35), a nucleic acid relating substance, such as adenosine (pKa: 12.56), inosine (pKa: 12.5), guanine (pKa: 12.3), cytosine (pKa: 12.2), hypoxanthine (pKa: 12.1) and xanthine (pKa: 11.9), and a weak acid, such as, diethylaminomethylphosphonic acid (pKa: 12.32), 1-amino-3,3,3-trifluorobenzoic acid (pKa: 12.29), isopropylidenediphosphonic acid (pKa: 12.10), 1,1-ethylidenediphosphonic acid (pKa: 11.54), 1,1-ethylidenediphosphonic acid 1-hydroxy (pKa: 11.52), benzimidazole (pKa: 12.86), thiobenzamide (pKa: 12.8), picolinthioamide (pKa: 12.55) and barbituric acid (pKa: 12.5).

Among these weak acids, sulfosalicylic acid and salicylic acid are preferred. As a base to be used in combination with the weak acid, sodium hydroxide, ammonium hydroxide, potassium hydroxide and lithium hydroxide are preferably used. The alkali agent may be used solely or in combination of two or more kinds thereof. The alkali agent is used such that the pH can be adjusted to a preferred range by adjusting the concentration and the combination thereof.

Various kinds of surfactants and various kinds of organic solvents may be added to the developer in order to accelerate development property, dispersion of development scum, and improvement in affinity to an ink. Preferred examples of the surfactant include anionic, cationic, nonionic and amphoteric surfactants. Preferred examples of the surfactant include a nonionic surfactant, such as a polyoxyethylene alkyl ether compound, a polyoxyethylene alkyl phenyl ether compound, a polyoxyethylene polystyryl phenyl ether compound, a polyoxyethylene polyoxypropylene alkyl ether compound, a glycerin fatty acid partial ester compound, a sorbitan fatty acid partial ester compound, a pentaerythritol fatty acid partial ester compound, a propylene glycol monofatty acid ester compound, a sucrose fatty acid partial ester compound, a polyoxyethylene sorbitan fatty acid partial ester compound, a polyoxyethylene sorbitol fatty acid partial ester compound, a polyethylene glycol fatty acid ester compound, a polyglycerin fatty acid partial ester compound, a polyoxyethylenated ricinus compound, a polyoxyethylene glycerin fatty acid partial ester compound, a fatty acid diethanolamide compound, an N,N-bis-2-hydroxylamine compound, polyoxyethylenealkylamine, a triethanolamine fatty acid ester and a trialkylamine oxide, an anionic surfactant, such as a fatty acid salt, an abietic acid salt, a hydroxyalkanesulfonic acid salt, an alkanesulfonic acid salt, a dialkylsulfosuccinic acid ester salt, a linear alkylbenzenesulfonic acid salt, a branched alkylbenzenesulfonic acid salt, an alkylnaphthalenesulfonic acid salt, an alkylphenoxypolyoxyethylene propylsulfonic acid salt, a polyoxyethylenealkyl sulfophenyl ether salt, an N-methyl-N-oelyltaurine sodium salt, an N-alkylsulfosuccinic acid monoamide disodium salt, a petroleum sulfonic acid salt, a sulfated beef tallow oil, a sulfate ester salt of an fatty acid alkyl ester, an alkyl sulfate ester salt, a polyoxyethylene alkyl ether sulfate ester salt, a fatty acid monoglyceride sulfate ester salt, a polyoxyethylene alkyl phenyl ether sulfate ester salt, a polyoxyethylene styryl phenyl ether sulfate ester salt, an alkyl phosphate ester salt, a polyoxyethylene alkyl ether phosphate ester salt, a polyoxyethylene alkyl phenyl ether phosphate ester salt, a partial saponified product of a styrene-maleic anhydride copolymer, a partial saponified product of an olefin-maleic anhydride copolymer and a naphthalene sulfonate salt formalin condensed product, a cationic surfactant, such as an alkylamine salt, a quaternary ammonium salt of tetrabutylammonium bromide, a polyoxyethylene alkylamine compound and a polyethylene polyamine derivative, and an amphoteric surfactant, such as a carboxybetaine compound, an aminocarboxylic acid compound, a betaine sulfone compound, an aminosulfate ester compound and an imidazoline compound. Among the surfactants, the term “polyoxyethylene” may exchangeably used with “polyoxyalkylene”, such as polyoxymethylene, polyoxypropylene and polyoxybutylene, and these are also encompassed herein.

More preferred examples of the surfactant include a fluorine-type surfactant containing a perfluoroalkyl group in the molecule. Examples of the fluorine-type surfactant include an anionic type, such as a perfluoroalkyl carboxylic acid salt, a perfluoroalkyl sulfonic acid salt and a perfluoroalkyl phosphoric acid ester, an amphoteric type, such as a perfluoroalkylbetaine, a cationic type, such as a perfluoroalkyltrimethylammonium salt, and a nonionic type, such as a perfluoroalkylamine oxide, a perfluoroalkyl ethyleneoxide adduct, a perfluoroalkyl group and hydrophilic group-containing oligomer, a perfluoroalkyl group and oleophilic group containing oligomer, a perfluoroalkyl group, hydrophilic group and oleophilic group-containing oligomer, and a perfluoroalkyl group and oleophilic group-containing urethane. The surfactant may be used solely or in combination of two or more kinds thereof and is preferably added to the developer in an amount in a range of from 0.001 to 10% by mass, and more preferably in a range of from 0.01 to 5% by mass.

Various kinds of development stabilizer may be used in the developer. Preferred examples thereof include a polyethylene glycol adduct of a sugar alcohol described in JP-A No. 6-282079, a tetraalkylammonium salt, such as tetrabutylammonium hydroxide, a phosphonium salt, such as tetrabutylphosphonium bromide, and an iodonium salt, such as diphenyliodonium chloride. Furthermore, examples thereof include an anionic surfactant or an amphoteric surfactant described in JP-A No. 50-51324, a water soluble cationic polymer described in JP-A No. 55-95946, and a water soluble amphoteric polymer electrolyte described in JP-A No. 56-142528.

Furthermore, examples thereof also include an organic boron compound added with alkylene glycol described in JP-A No. 59-84241, a polyoxyethylene-polyoxypropylene block polymer type water soluble surfactant described in JP-A No. 60-111246, an alkylenediamine compound substituted with polyoxyethylene-polyoxypropylene described in JP-A No. 60-129750, polyethylene glycol having a weight average molecular weight of 300 or more described in JP-A No. 61-215554, a fluorine-type surfactant having a cationic group described in JP-A No. 63-175858, and a water soluble ethylene oxide adduct compound obtained by adding 4 mole or more of ethylene oxide to an acid or an alcohol described in JP-A No. 2-39157, and a water-soluble polyalkylene compound.

An organic solvent may be added to the developer depending on necessity. The organic solvent preferably has a solubility in water of about 10% by mass or less, and more preferably 5% by mass or less. Examples thereof include 1-phenylethanol, 2-phenylethanol, 3-phenyl-1-propanol, 4-phenyl-1-butanol, 4-phenyl-2-butanol, 2-phneyl-1-butanol, 2-phenoxyethanol, 2-benzyloxyethanol, o-methoxybenzyl alcohol, m-methoxybenzyl alcohol, p-methoxybenzyl alcohol, benzyl alcohol, cylcohexanol, 2-methylcyclohexanol, 3-methylcyclohexanol, 4-methylcyclohexanol, N-phenylethanolamine and N-phenyldiethanolamine.

The content of the organic solvent is generally from 0.1 to 5% by mass based on the total mass of the solution. The using amount thereof is closely related with the using amount of the surfactant, and in the case where the amount of the organic solvent is increased, the amount of the surfactant is preferably increased. This is because in case where the amount of the surfactant is small, and the amount of the organic solvent is large, the organic solvent is not completely dissolved, and therefore, excellent developing property cannot be secured.

A reducing agent may further be added to the developer for preventing the printing plate from being stained. Preferred examples of the organic reducing agent include a phenol compound, such as thiosalicylic acid, hydroquinone, metol, methoxyquinone, resorcin and 2-methylresorcin, and an amine compound, such as phenylenediamine and phenylhydrazine. Preferred examples of the inorganic reducing agent include a sodium salt, a potassium salt and an ammonium salt of an inorganic acid, such as sulfurous acid, hydrogensulfurous acid, phosphorous acid, hydrogenphosphorous acid, bihydrogensulfurous acid, thiosulfuric acid and dithionous acid.

Among these, the reducing agent that is particularly excellent in preventing stains is a sulfite. The reducing agent is preferably contained in the developer, when used, in an amount of from 0.05 to 5% by mass.

An organic carboxylic acid may further be added to the developer. Preferred examples of the organic carboxylic acid is an aliphatic carboxylic acid and an aromatic carboxylic acid each having from 6 to 20 carbon atoms. Specific examples of the aliphatic carboxylic acid include caproic acid, enanthylic acid, caprylic acid, lauric acid, myristic acid, palmitic acid and stearic acid, with an alkanoic acid having from 8 to 12 carbon atoms being particularly preferred. An unsaturated fatty acid having a double bond in the carbon chain, and those having a branched carbon chain may also be used. Examples of the aromatic carboxylic acid include compounds having a benzene ring, a naphthalene ring or an anthracene ring having a carboxyl group substituted thereon. Specific examples thereof include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphtoic acid and 2-naphthoic acid, with hydroxynaphtoic acid being particularly effective.

The aliphatic and aromatic carboxylic acids are preferably used as a sodium salt, a potassium salt or an ammonium salt in order to increase water-solubility thereof. The content of the organic carboxylic acid in the developer used in the invention is not particularly limited, but in the case where it is less than 0.1% by mass, sufficient effects may not be obtained, and in case where it exceeds 10% by mass, no further improvement in effects may not be obtained, and furthermore, it sometimes inhibits dissolution of another additive. Therefore, the addition amount is preferably from 0.1 to 10% by mass, and more preferably from 0.5 to 4% by mass, based on the amount of the developer upon using.

The developer may further contain, depending on necessity, an antiseptic, a coloring agent, a thickener, a defoaming agent and a hard water softening agent. Examples of the hard water softening agent include polyphosphoric acid and a sodium salt, a potassium salt and an ammonium salt thereof, an aminopolycarboxylic acid, such as ethylenediaminetetraacetic acid, diethylenediaminepentaacetic acid, triethylenetetraminehexaacetic acid, hydroxyethylethylenediamintriacetic acid, nitrolotriacetic acid, 1,2-diaminocyclohexanetetraacetic acid and 1,3-diamino-2-propanoltetraacetic acid, and a sodium salt, a potassium salt and an ammonium salt thereof, and aminotri(methylenesulfonic acid), ethylenediaminetetra(methylenesulfonic acid), diethylenetriaminepenta(methylenesulfonic acid), triethylenetetraminehexa(methylenesulfonic acid), hydroxyethylethylenediaminetri(methylenesulfonic acid) and 1-hydroxyethane-1,1-diphosphonic acid, and a sodium salt, a potassium salt and an ammonium salt thereof.

The optimum use amount of the hard water softening agent varies depending on chelation thereof, hardness of the hard water to be used, and the amount of the hard water. The use amount thereof is generally from 0.01 to 5% by mass, and preferably from 0.01 to 0.5% by mass, based on the amount of the developer solution upon using. In case where the addition amount is below the range, the desired object cannot be sufficiently attained, and in case where the addition amount exceeds the range, adverse affects such as discoloration may occur in the image area. The balance of the developer solution is water. The developer has previously been prepared as a concentrated liquid containing a smaller amount of water than that upon using, and it is diluted with water when it is used, since it is advantageous for transportation. The degree of concentration is preferably such an extent that the components are not separated or deposited.

A developer described in JP-A No. 6-282079 may also be used as the developer in the invention. This is a developer containing a watersoluble ethylene oxide adduct compound obtained by adding 5 mole or more ethylene oxide to a silicic acid alkali metal salt having a molar ratio $SiO_2/M_2O$ (where M represents an alkali metal) of from 0.5 to 2.0 and a sugar alcohol having four or more hydroxyl groups. A sugar alcohol is a polyhydric alcohol obtained by reducing an aldehyde group and a ketone group of a sugar to make a primary and secondary alcohol groups, respectively. Representative examples of the sugar alcohol include D,L-threit, erythrit, D,L-arabit, ribit, xylit, D,L-sorbit, D,L-mannit, D,L-idit, D,L-talit, dulcit and allodulcit, and di-, tri-, tetra-, penta- and hexaglycerin formed by condensing sugar alcohols are also included. The water-soluble ethylene oxide adduct compound can be obtained by adding 5 mole or more of ethylene oxide to one mole of the sugar alcohol. The ethylene oxide adduct compound may be block-copolymerized, depending on necessity, with propylene oxide in such an extent that the solubility allows. The ethylene oxide adduct compound may be used solely or in combination of two or more kinds thereof.

The addition amount of the water soluble ethylene oxide adduct compound is suitable from 0.001 to 5% by mass, and more preferably from 0.001 to 2% by mass, based on the amount of the developer (used solution).

The developer solution may further contain various kinds of surfactants and organic solvents described above, depending on necessity, in order to accelerate developing property, dispersion of development scum, and improvement in ink affinity in the image area of the printing plate.

The planographic printing plate precursor after undergone a developing treatment with the developer having the aforementioned composition is then subjected to a post-treatment with washing water, a rinsing solution containing a surfactant, and a finisher or a protective gum solution containing gum arabic and a starch derivative as a main component. These treatments may be carried out in combination with a post-treatment for the planographic printing plate precursor according to the invention.

An automatic developing machine for a planographic printing plate (PS plate) is being widely used in recent years for rationalization and standardization of the prepress process in the field of prepress and printing industries. The automatic developing.machine is generally composed of a developing section and a post-treatment section and also has a device for conveying a PS plate, baths for treating solutions, and spray devices therefor, in which an exposed PS plate is horizontally conveyed, to which the treating solutions drawn by pumps are sprayed from nozzles to effect development and the post-treatment. In recent years, furthermore, there are known such a method in that the PS plate is conveyed as being dipped in a bath filled with the treating solution with submerged guide rolls to cause development, and a method in that a small amount of washing water is supplied to the surface of the plate after development, and waste water thus obtained is reused as water for diluting a concentrated solution of the developer.

The automatic treatment may be carried out while replenishers for the treating solutions are supplied corresponding to the treating amounts and the operating time of the treating solutions. A so-called single-round treating method where the treatment is effected with substantially virgin treating solutions may also be applied.

In the planographic printing plate precursor according to the invention, in case where a planographic printing plate obtained through imagewise exposure, development, water washing and/or rinsing and/or gumming as described above has a unnecessary image area (e.g., a scar of a film edge of an original copy film), deletion of the unnecessary image area is carried out. Such a deletion may preferably be carried out in such a manner that a deleting solution is coated on the unnecessary image area and allowed to stand for a prescribed period of time, followed by washing with water, as described in JP-B No. 2-13293. Such a method may also be employed when the unnecessary image area is irradiated with activation light guided with an optical fiber and then developed as described in JP-A No. 59-174842.

The planographic printing plate that is obtained from the planographic printing plate precursor according to the invention is coated with desensitizing gum depending on necessity, and then it may be subjected to a printing process. In case where a planographic printing plate having higher printing durability is desired, a print-out treatment is further carried out. In case where the planographic printing plate is subjected to print-out, it is preferably treated with a surface adjusting solution described in JP-B Nos. 61-2518 and 55-28062 and JP-A Nos. 62-31856 and 61-159655 before print-out.

Examples of the method therefor include such a method in that a surface adjusting solution is coated on the surface of the planographic printing plate with sponge or absorbent cotton impregnated therewith, a method that a surface adjusting solution is coated by dipping the planographic printing plate in a vat filled with the solution, and a method of coating the solution using an automatic coater. More preferred results are obtained when the coated amount of the solution is uniformized with a squeegee or a squeegee roller.

The coated amount of the surface adjusting solution is suitably from 0.03 to 0.8 $g/m^2$ (dry mass). The planographic printing plate coated with the surface adjusting solution is dried depending on necessity, and then heated to a high temperature with a print-out processor (e.g., a print-out processor, BP-1300, available from Fuji Photo Film Co., Ltd.). The heating temperature and the heating time in this case are preferably in a range of from 180 to 300° C., and a range of from 1 to 20 minutes, respectively, while they depend on the species of the components to form an image.

The planographic printing plate after undergone the print-out treatment may be subjected to conventionally known treatment depending on necessity, such as water washing and gumming. In case where a surface adjusting solution containing a water-soluble polymer compound is used, the desensitizing treatment, such as gumming, may be obviated. The planographic printing plate after undergone the aforementioned treatments is then charged in an offset printing machine to print a large number of sheets.

EXAMPLES

The invention will be described with reference to the following examples, but the invention is not construed as being limited thereto.

1. Synthesis of Polyurethane Resin

Synthesis Example 1

125 g of 4,4'-diphenylmethanediisocyanate and 67 g of 2-bis(hydroxymethyl)propionate were dissolved in 290 mL of dioxiane in a 500-mL three-neck flask. After adding 1 g of N,N-diethylaniline thereto, the mixture was stirred for 6 hours under reflux. After completing the reaction, the mixture was gradually added to a solution containing 4 L of water and 40 cc of acetic acid to precipitate a polymer. The resulting solid was dried under vacuum to obtain 185 g of a polyurethane resin (1). The acid content thereof was 2.47 meq/g. Determination of molecular weight using GPC revealed that the weight average molecular weight (polystyrene standard) was 28,000.

Synthesis Examples 2 to 13

The same procedures as in Synthesis Example 1 were repeated, except that the starting materials were changed to the diisocyanate compounds and the diol compounds shown in Table 1 below to obtain polyurethane resins (2) to (13).

TABLE 1

| No. | Diisocyanate Compound | Diol Compound | Acid Value (meq/g) |
|---|---|---|---|
| (2) | 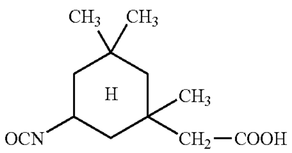 | 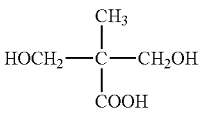 | 2.44 |
| (3) | 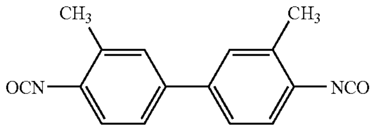 | 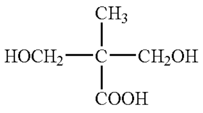 | 2.25 |
| (4) | $OCN—(CH_2)_6—NCO$ | 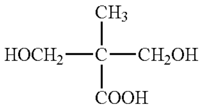 | 3.07 |
| (5) | 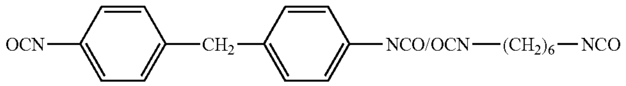 Compositional Ratio = 70 mol %/30 mol % | 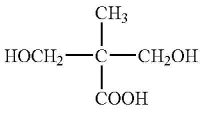 | 2.64 |
| (6) | 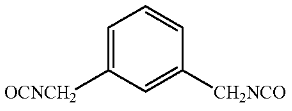 | 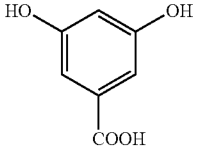 | 2.11 |
| (7) | 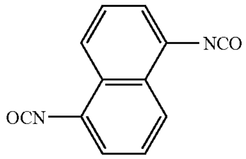 | 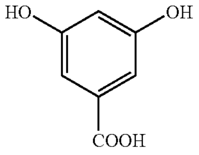 | 2.33 |

TABLE 2
| | | |
|---|---|---|
| (8) | 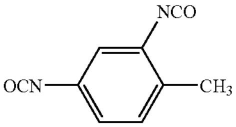 | |
| (9) | 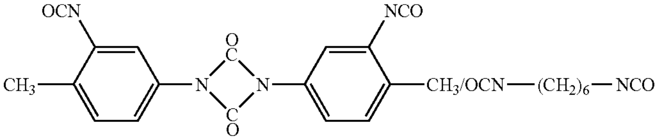<br>Compositional Ratio = 70 mol %/30 mol % | |
| (10) | 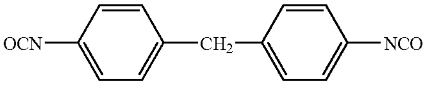 | |
| (11) | 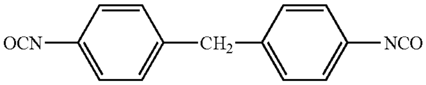 | |
| (12) | 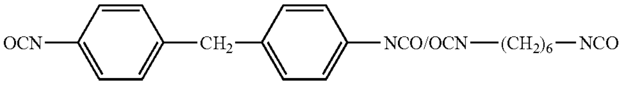<br>Compositional Ratio = 70 mol %/30 mol % | |
| (13) | 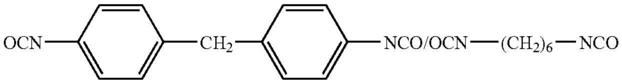<br>Compositional Ratio = 70 mol %/30 mol % | |
| (8) | 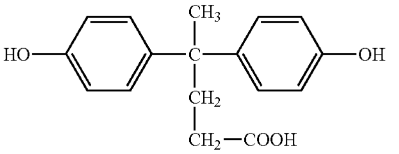 | 2.07 |
| (9) | 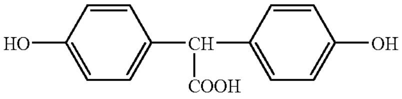 | 1.77 |
| (10) | 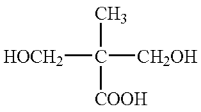 $HO—(CH_2)_3—OH$<br>Compositional Ratio = 60 mol %/40 mol % | 1.58 |
| (11) | 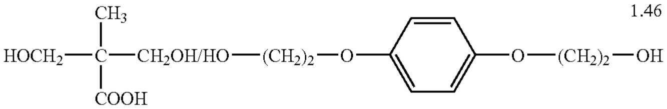<br>Compositional Ratio = 60 mol %/40 mol % | 1.46 |
| (12) | 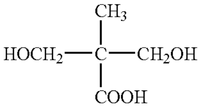 | 1.64 |

TABLE 2-continued

| | | |
|---|---|---|
| | 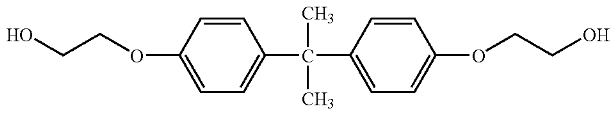 Compositional Ratio = 60 mol %/40 mol % | |
| (13) | 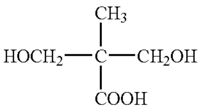 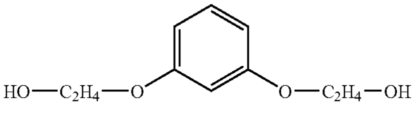 Compositional Ratio = 60 mol %/40 mol % | 1.56 |

Example 1

<Preparation of Support>

An aluminum plate (an aluminum alloy containing 0.06% by mass of Si, 0.30% by mass of Fe, 0.014% by mass of Cu, 0.001% by mass of Mn, 0.001% by mass of Mg, 0.001% by mass of Zn and 0.03% by mass of Ti with the balance of Al and unavoidable impurities) having a thickness of 0.24 mm was sequentially subjected to the following surface treatments.

An electrochemical surface roughening treatment was sequentially carried out by applying an alternating electric current of 60 Hz. An electrolytic solution used herein was a 10 g/L aqueous nitric acid solution (containing 5 g/L of aluminum ion and 0.007% by mass of ammonium ion), and the temperature was 80° C. After washing with water by spraying, the aluminum plate was subjected to an etching treatment by spraying a solution having a caustic soda concentration of 26% by mass and an aluminum ion concentration of 6.5% by mass at 32° C. to dissolve the aluminum plate by 0.20 g/$m^2$, followed by washing by spraying water. Thereafter, a desmutting treatment was carried out with an aqueous solution containing 25% by mass of sulfuric acid (containing 0.5% by mass of aluminum ion) at a temperature of 60° C., followed by washing with water by spraying.

An anodic oxidation treatment was carried out using an anodic oxidation apparatus of a two-step power supplying electrolysis procedure. Sulfuric acid was used as an electrolytic solution supplied to the electrolysis section. Thereafter, water washing was carried out by spraying. The amount of the oxidization film finally formed was 2.7 g/$m^2$.

The aluminum support thus obtained through the anodic oxidation treatment was immersed in a treating bath containing a 1% by mass aqueous solution of sodium silicate No. 3 at a temperature of 30° C. for 10 seconds to perform an alkali metal silicate salt treatment (silicate treatment). Thereafter, water washing was carried out by spraying.

The aluminum support having undergone the alkali metal silicate salt treatment was coated with an undercoating composition having the following formulation, followed by drying at 80° C. for 15 seconds, to thereby form a coated film. The coated amount of the coated film after drying was 15 mg/$m^2$.

| <Undercoating Composition> | |
|---|---|
| Compound having following structure | 0.3 g |
| Methanol | 100 g |
| Water | 1 g |
| 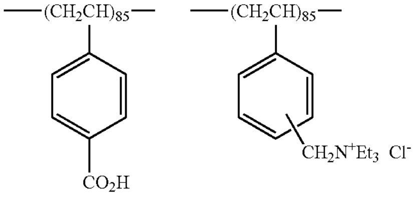 | |
| molecular weight: | 28,000 |

<Formation of Recording Layer>

The support in the form of a web was coated with a coating composition for lower layer 1 having the following formulation using a bar coater to give a coated amount of 0.85 g/$m^2$ and then dried at 160° C. for 44 seconds, and it was immediately cooled with cool blast at 17 to 20° C. until the temperature of the support was lowered to 35° C.

Thereafter, a coating composition for upper layer 1 having the following formulation was coated using a bar coater to give a coated amount of 0.22 g/$m^2$ and then dried at 148° C. for 25 seconds, and then it was gradually cooled with cool blast at 20 to 26° C., so as to obtain a planographic printing plate precursor of Example 1.

| <Coating Composition for Lower Layer 1> | |
|---|---|
| Polyurethane resin (1) obtained in Above Synthesis Example | 2.133 g |
| Cyanine dye A (having the following structure) | 0.134 g |
| 4,4'-Bishydroxyphenylsulfone | 0.126 g |
| Tetrahydrophthalic anhydride | 0.190 g |
| p-Toluenesulfonic acid | 0.008 g |
| 3-Methoxy-4-diazodiphenylamine hexafluorophosphate | 0.032 g |
| Ethyl violet with 6-hydroxynaphthalenesulfone as counter ion | 0.781 g |
| Polymer 1 (having the following structure) | 0.035 g |
| Methyl ethyl ketone | 25.41 g |
| 1-Methoxy-2-propanol | 12.97 g |

-continued

| | |
|---|---|
| γ-Butyrolactone | 13.18 g |
| <Coating Composition for Upper Layer 1> | |
| m,p-Cresol novolak (m/p ratio: 6/4, weight average molecular weight: 4,500, containing 0.8% by mass of unreacted cresol) | 0.3479 g |
| Cyanine dye A (having the foregoing structure) | 0.0192 g |
| Ethyl methacrylate/isobutyl methacrylate/acrylic acid copolymer (37/37/26 by % by mass) 30% MEK solution | 0.1403 g |
| Polymer 1 (having the foregoing structure) | 0.015 g |
| Polymer 2 (having the following structure) | 0.00328 g |
| Methyl ethyl ketone | 13.07 g |
| 1-Methoxy-2-propanol | 6.79 g |

Cyanine dye A

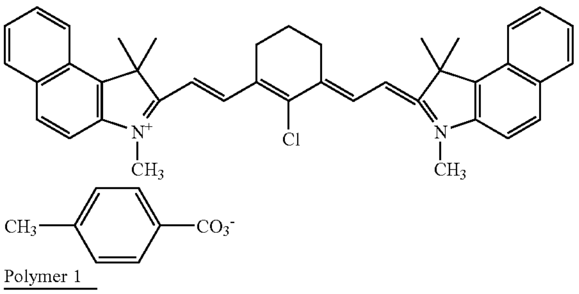

Polymer 1

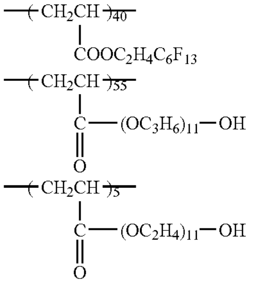

Polymer 2

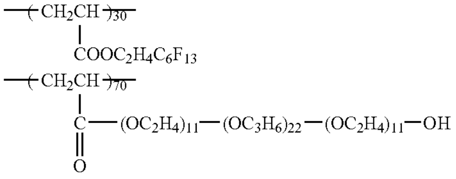

Examples 2-13

Planographic printing plate precursors of Examples 2 to 13 were produced in the same manner as in Example 1, except that the polyurethane resin (1) used in the coating composition for lower layer 1 employed in Example 1 was changed to the polyurethane resins (2) to (13) obtained in the synthesis examples, respectively.

Comparative Example 1

A planographic printing plate precursor of Comparative Example 1 was produced in the same manner as in Example 1, except that the polyurethane resin (1) used in the coating composition for lower layer 1 employed in Example 1 was changed to an N-(4-aminosulfonylphenyl)methacrylamide/acrylonitrile/ methyl methacrylate copolymer (copolymerization ratio: 36/34/30, weight average molecular weight: 50,000, acid value: 2.65).

Evaluation of Planographic Printing Plate Precursors (Evaluation of Printing Durability)

A test pattern was imagewise drawn on the planographic printing plate precursors of Examples 1 to 13 and the planographic printing plate precursor of Comparative Example 1, by applying different amounts of exposure energy using TRENDSETTER (produced by Creo Products, Inc.). Thereafter, development was carried out using an automatic developing machine, LP-940H (produced by Fuji Photo Film Co., Ltd.), charged with a developer, DT-2 (diluted to make an electroconductivity of 43 mS/cm), produced by Fuji Photo Film Co., Ltd., at a development temperature of 30° C. and a development time of 12 seconds. The resulting printing plates were subjected to continuous printing using a printing machine, LITHRONE (produced by Komori Corp.). The number of sheets that could be printed with a sufficient ink density maintained was visually measured to evaluate printing durability. The larger the number of sheets was, the better the evaluation of printing durability was. The results obtained are shown in Table 3 below.

(Evaluation of Chemical Resistance)

The planographic printing plate precursors of Examples 1 to 13 and the planographic printing plate precursor of Comparative Example 1 were subjected to exposure and printing processes in the same manner as above to evaluate printing durability. A step of wiping the plate surface with a cleaner (MULTICLEANER, produced by Fuji Photo Film Co., Ltd.) was added every 5,000 sheets of printing to evaluate chemical resistance. The larger the number of sheets was, the better the evaluation of chemical resistance was. The results obtained are shown in Table 3 below.

TABLE 3

| | Printing Durability/ Number of printed sheets | Chemical Resistance/Number of printed sheets (MULTICLEANER was used every 5,000 sheets of printing) |
|---|---|---|
| Example 1 | 200,000 | 180,000 |
| Example 2 | 120,000 | 100,000 |
| Example 3 | 180,000 | 150,000 |
| Example 4 | 100,000 | 80,000 |
| Example 5 | 250,000 | 230,000 |
| Example 6 | 180,000 | 160,000 |
| Example 7 | 170,000 | 160,000 |
| Example 8 | 170,000 | 160,000 |
| Example 9 | 200,000 | 200,000 |
| Example 10 | 200,000 | 160,000 |
| Example 11 | 190,000 | 170,000 |
| Example 12 | 200,000 | 170,000 |
| Example 13 | 260,000 | 250,000 |
| Comparative Example 1 | 80,000 | 60,000 |

As clear from the results shown in Table 3, the planographic printing plate precursors of Examples 1 to 13 produced using the polyurethane resin according to the invention as the component of the lower layer were revealed to be excellent in printing durability and chemical resistance. In particular, the polyurethane resins having an aromatic skeleton in the polymer provided better results in printing durability and chemical resistance as compared to the other Examples.

On the other hand, it was confirmed that the planographic printing plate precursor of Comparative Example 1 produced without using polyurethane resin according to the invention as the component of the lower layer was remarkably poor both in printing durability and chemical resistance as compared to the products of Examples.

Example 14

A planographic printing plate precursor of Example 14 was produced by providing an undercoating and a recording layer (including a lower layer and an upper layer) in the same manner as in Example 1, except that in preparation of the support in Example 1, the silicate treatment was not carried out after the anodic oxidation treatment.

Evaluation of Printing Durability and Chemical Resistance

Evaluation of printing durability and chemical resistance was carried out in the same manner as in Example 1, except that a 6-fold diluted solution of a silicate developer, DP-4 (produced by Fuji Photo Film Co., Ltd.) at 28° C. was used.

The obtained results were printing durability of 200,000 sheets and chemical resistance of 180,000 sheets, which were almost equial to the number of printed sheets obtained in Example 1. It was thus understood that even in Example 14, in which a planographic printing plate precursor produced using a support having not been subjected to a hydrophilic treatment with a silicate was developed with a silicate developer solution, excellent printing durability and chemical resistance, which are the effects of the invention, could be obtained similarly to the cases of Examples 1 to 13, in which a planographic printing plate precursor produced using a substrate having been subjected to a silicate treatment was developed with a non-silicate developer.

2. Synthesis of Particular Polyimide Precursor Resin

Synthesis Example 14

Using 8.826 g of 3,3',4,4'-biphenyltetracarboxylic dianhydride and 6.007 g of 4,4'-diaminodiphenyl ether in 70 g of 1,4-dioxane and 30 g of DMF, polymerization was effected under ordinary pressure at a temperature of 50° C. for 6 hours to prepare a particular polyimide precursor solution (1) containing a particular polyimide resin (1).

The concentration of the particular polyimide precursor in the particular polyimide precursor solution (1) was 13.0%, a logarithmic viscosity of the particular polyimide precursor was 1.91 (in 0.5 g/ 100 mL of N-methylpyrrolidone at 25° C.), a rotation viscosity of the particular polyimide precursor solution was 1,800 cps (at 25° C.), and the molecular weight thereof was 30,000. The molecular weight was determined using GPC by conversion in terms of the standard polystyrene.

Synthesis Example 15

Using 9.667 g of 3,3',4,4'-benzophenonetetracarboxylic dianhydride, 3.007 g of 4,4'-diaminodiphenyl ether and 1.32 g of tetraethylenediamine in 40 g of 1,4-dioxane, 20 g of DMF and 40 g of ethanol, polymerization was caused under ordinary pressure at a temperature of 25° C. for 14.5 hours to prepare a particular polyimide precursor solution (2) containing a particular polyimide resin (2).

The concentration of the particular polyimide precursor in the particular polyimide precursor solution (2) was 10.0%, a logarithmic viscosity of the particular polyimide precursor was 1.03 (in 0.5 g/100 mL of N-methylpyrrolidone at 25° C.), a rotation viscosity of the particular polyimide precursor solution was 12,000 cps (at 25° C.), and the molecular weight thereof was 70,000. The molecular weight was determined using GPC by conversion in terms of the standard polystyrene.

The structures of the particular polyimide precursor resins obtained in the Synthesis Examples 14 and 15 are shown below.

Particular Polyimide Precursor Resin (1)

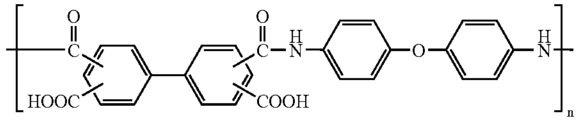

Particular Polyimide Precursor Resin (2)

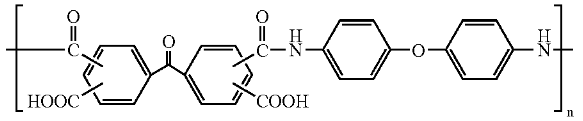

Example 15

A support was prepared in the same manner as in Example 1, which was subjected to an electrochemical surface roughening treatment and an anodic oxidation treatment using an anodic oxidation apparatus of a two-step power supplying electrolysis procedure. After a silicate treatment, the resultant support was washed with water by spraying. On the aluminum support having undergone an alkali metal silicate salt treatment, an undercoating composition having the same formulation as above was applied and dried at 80° C. for 15 seconds to form a coated film. The coated amount of the coated film after drying was 15 mg/$m^2$.

<Formation of Recording Layer (Multi-layer)>

The support in the form of a web was coated with a coating composition for lower layer 2 having the following formulation using a bar coater to give a coated amount of 0.85 g/$m^2$ and then dried at 160° C. for 44 seconds, and it was immediately cooled with cool blast at 17 to 20° C. until the temperature of the support was lowered to 35° C.

Thereafter, the coating composition for upper layer 1 having the same formulation as in Example 1 was coated using a bar coater to give a coated amount of 0.22 g/$m^2$ and dried at 148° C. for 25 seconds, and then it was gradually cooled with cool blast at 20 to 26° C., so as to obtain a planographic printing plate precursor of Example 15.

<Coating Composition for Lower Layer 2>

| | |
|---|---|
| Particular polyimide precursor solution (1) obtained in Above Synthesis Example | 21.33 g |
| Cyanine dye A (having the foregoing structure) | 0.134 g |
| 4,4'-Bishydroxyphenylsulfone | 0.126 g |
| Tetrahydrophthalic anhydride | 0.190 g |
| p-Toluenesulfonic acid | 0.008 g |
| 3-Methoxy-4-diazodiphenylamine hexafluorophosphate | 0.032 g |
| Ethyl violet with 6-hydroxynaphthalenesulfone as counter ion | 0.781 g |
| Polymer 1 (having the foregoing structure) | 0.035 g |
| γ-Butyrolactone | 38.50 g |
| 1-Methoxy-2-propanol | 12.97 g |

Example 16

A planographic printing plate precursor of Example 16 was produced in the same manner as in Example 15, except that the particular polyimide precursor solution (1) used in the coating composition for lower layer 2 employed in Example 15 was changed to the particular polyimide precursor solution (2) obtained in the above synthesis example.

Comparative Example 2

A planographic printing plate precursor of Comparative Example 2 was produced in the same manner as in Example 15, except that the coating composition for lower layer 2 used in Example 15 was changed to a coating composition for lower layer 3 having the following formulation containing no particular polyimide precursor resin.

| <Coating Composition for Lower Layer 3> | |
|---|---|
| N-(4-Aminosulfonylphenyl)methacrylamide/acrylonitrile/methyl methacrylate (copolymerization ratio: 36/34/30, weight average molecular weight: 50,000, acid value: 2.65) | 2.133 g |
| Cyanine dye A (having the foregoing structure) | 0.134 g |
| 4,4'-Bishydroxyphenylsulfone | 0.126 g |
| Tetrahydrophthalic anhydride | 0.190 g |
| p-Toluenesulfonic acid | 0.008 g |
| 3-Methoxy-4-diazodiphenylamine hexafluorophosphate | 0.032 g |
| Ethyl violet with 6-hydroxynaphthalenesulfone as counter ion | 0.781 g |
| Polymer 1 (having the foregoing structure) | 0.035 g |
| Methyl ethyl ketone | 25.41 g |
| 1-Methoxy-2-propanol | 12.97 g |
| γ-Butyrolactone | 13.18 g |

Evaluation of Planographic Printing Plate Precursors (Evaluation of Printing Durability)

A test pattern was imagewise drawn on the planographic printing plate precursors of Examples 15 and 16 and the planographic printing plate precursor of Comparative Example 2, by applying different amounts of exposure energy using TRENDSETTER (produced by Creo Products, Inc.). Thereafter, development was carried out using a PS processor, 900H (produced by Fuji Photo Film Co., Ltd.), charged with a developer, DT-2 (diluted to make an electroconductivity of 43 mS/cm), produced by Fuji Photo Film Co., Ltd., at a development temperature of 30° C. and a development time of 12 seconds. The resulting printing plates were subjected to continuous printing using a printing machine, LITHRONE (produced by Komori Corp.). The number of sheets that could be printed with a sufficient ink density maintained was visually measured to evaluate printing durability. The larger the number of sheets was, the better the evaluation of printing durability was. The results obtained are shown in Table 4 below.

(Evaluation of Chemical Resistance)

The planographic printing plate precursors of Examples 15 and 16 and the planographic printing plate precursor of Comparative Example 2 were subjected to exposure, development and printing processes in the same manner as above to evaluate printing durability. A step of wiping the plate surface with a cleaner (MULTICLEANER, produced by Fuji Photo Film Co., Ltd.) was added every 5,000 sheets of printing to evaluate chemical resistance. The larger the number of sheets was, the better the evaluation of chemical resistance was. The results obtained are shown in Table 4 below.

TABLE 4

| | Printing Durability/ Number of printed sheets | Chemical Resistance/Number of printed sheets (MULTICLEANER was used every 5,000 sheets of printing) |
|---|---|---|
| Example 15 | 300,000 | 280,000 |
| Example 16 | 400,000 | 390,000 |
| Comparative Example 2 | 80,000 | 60,000 |

As clear from the results shown in Table 4, the planographic printing plate precursors of Examples 15 and 16 produced using the particular polyimide precursor resin according to the invention as the component of the lower layer were revealed to be excellent in printing durability and chemical resistance.

On the other hand, it was confirmed that the planographic printing plate precursor of Comparative Example 2 produced without using the particular polyimide precursor resin according to the invention was remarkably poor both in printing durability and chemical resistance, as compared to the products of Examples.

Example 17

<Formation of Recording Layer>

The same support having been undercoated as in Example 15 was coated with a coating composition for recording layer 1 (single layer) having the following formulation to give a coated amount of 1.8 g/$m^2$ and dried to form a recording layer, to thereby a planographic printing plate precursor of Example 17.

| <Coating Composition for Recording Layer 1 (single layer)> | |
|---|---|
| Novolak resin (m/p-cresol ratio: 6/4, weight average molecular weight: 7,000, containing 0.5% by mass of unreacted cresol) | 1.0 g |
| Particular polyimide precursor solution (1) obtained in Above Synthesis Example | 3.9 g |
| Cyanine dye A (having the foregoing structure) | 0.1 g |
| Phthalic anhydride | 0.05 g |
| p-Toluenesulfonic acid | 0.002 g |
| Ethyl violet with 6-hydroxy-β-naphthalenesulfone as counter ion | 0.02 g |
| Fluorine-type polymer (Megafac F-176 (solid content: 20%), produced by Dainippon Ink and Chemicals, Inc.) | 0.015 g |
| Fluorine-type polymer (Megafac MCF-312 (solid content: 30%), produced by Dainippon Ink and Chemicals, Inc.) | 0.035 g |
| γ-Butyrolactone | 8.5 g |
| 1-Methoxy-2-propanol | 3.5 g |

Comparative Example 3

<Formation of Recording Layer>

The same support having been undercoated as in Example 15 was coated with a coating composition for recording layer 2 (single layer) having the following formulation to give a coated amount of 1.8 g/$m^2$ and dried to form a recording layer, to thereby obtain a planographic printing plate precursor of Comparative Example 3.

| <Coating Composition for Recording Layer 2 (single layer)> | |
|---|---|
| Novolak resin (m/p-cresol ratio: 6/4, weight average molecular weight: 7,000, containing 0.5% by mass of unreacted cresol) | 1.5 g |
| Cyanine dye A (having the foregoing structure) | 0.1 g |
| Phthalic anhydride | 0.05 g |
| p-Toluenesulfonic acid | 0.002 g |
| Ethyl violet with 6-hydroxy-β-naphthalenesulfone as counter ion | 0.02 g |
| Fluorine-type polymer (Megafac F-176 (solid content: 20%), produced by Dainippon Ink and Chemicals, Inc.) | 0.015 g |
| Fluorine-type polymer (Megafac MCF-312 (solid content: 30%), produced by Dainippon Ink and Chemicals, Inc.) | 0.035 g |
| γ-Butyrolactone | 8.5 g |
| 1-Methoxy-2-propanol | 3.5 g |

Evaluation of Planographic Printing Plate Precursors (Printing Durability and Chemical Resistance)

The planographic printing plate precursors of Example 17 and Comparative Example 3 were subjected to exposure, development and printing processes in the same manner as in Example 15. Evaluations of printing durability and chemical resistance thereof were also carried out in the same manner. The results obtained are shown in Table 5 below.

TABLE 5

| | Printing Durability/ Number of printed sheets | Chemical Resistance/Number of printed Sheets (MULTICLEANER was used every 5,000 sheets of printing) |
|---|---|---|
| Example 17 | 200,000 | 180,000 |
| Comparative Example 3 | 30,000 | 10,000 |

As clear from the results shown in Table 5, the planographic printing plate precursor of Example 17 was revealed to be excellent in printing durability and chemical resistance. On the other hand, the planographic printing plate precursor of Comparative Example 3 produced without using the particular polyimide precursor resin according to the invention was remarkably poor both in printing durability and chemical resistance, as compared to the product of Example. It was understood therefrom that the particular polyimide precursor resin according to the invention exhibited excellent printing durability and chemical resistance even in the case where it was used as a component of a recording layer having a single layer structure, similarly to the case where it was used as a component of a lower layer of a recording layer having a multi-layer structure.

Example 18

A planographic printing plate precursor of Example 18 was produced by providing an undercoating and a recording layer (including a lower layer and an upper layer) in the same manner as in Example 15, except that in preparation of the support in Example 15, the silicate treatment was not conducted after the anodic oxidation treatment.

(Evaluation of Printing Durability and Chemical Resistance)

The resulting planographic printing plate precursor was exposed in the same manner as in Example 15, and then developed using a PS processor, 900H (produced by Fuji Photo Film Co., Ltd.), charged with an alkali developer A having the following formulation at a developing temperature maintained at 28° C. for a developing time of 25 seconds. Thereafter, evaluations of printing durability and chemical resistance were carried out in the same manner as in Example 15.

The results obtained were printing durability of 300,000 sheets and chemical resistance of 280,000 sheets, which were almost equal to the number of printed sheets obtained in Example 15. It was thus understood that even in Example 18, in which a planographic printing plate precursor produced using a support having not been subjected to a hydrophilic treatment with a silicate was developed with a silicate developer solution, excellent printing durability and chemical resistance, which were the effects of the invention, could be obtained similarly to the cases of Examples 15 and 16, in which a planographic printing plate precursor produced using a support having been subjected to a silicate treatment was developed with a non-silicate developer.

| <Alkali Developer Solution A> | |
|---|---|
| $SiO_2.K_2O$ ($K_2O/SiO_2$ = 1/1 (molar ratio)) | 4.0% by mass |
| Citric acid | 0.5% by mass |
| Polyethylene glycol-modified sorbitol (30-unit adduct in average) | 1.0% by mass |
| Water | 50.0% by mass |

3. Synthesis of Particular Urea Bond Resin

Synthesis Example 16

13.4 g (0.10 mole) of 2,2-bis(hydroxymethyl)propionate, 7.1 g (0.060 mole) of 1,6-hexylene glycol and 2.4 g (0.040 mole) of ethylenediamine were poured in a three-neck round bottom flask equipped with a condenser and a stirrer, and dissolved in 120 mL of N,N-dimethylacetamide. 50.1 g (0.20 mole) of 4,4'-diphenylamine diisocyanate was added thereto, and the mixture was heated with stirring at 100° C. for 6 hours. Thereafter, the resultant mixture was diluted with 200 mL of N,N-dimethylformamide and 50 mL of acetic acid. The reaction mixture was added to 4 L of water with stirring to precipitate a white polymer. The polymer was filtrated, washed with water and dried under vacuum to obtain 75 g of a polymer (a particular urea bond resin (a) according to the invention). Determination of molecular weight by gel permeation chromatography (GPC) revealed that the polymer had a weight average molecular weight (polystyrene standard) of 42,000. Titration revealed that a carboxyl group content (acid value) was 1.22 meq/g.

Synthesis Example 17

The same reaction as in Synthesis Example 1 was carried out using 13.4 g (0.10 mole) of 2,2-bis(hydroxymethyl) propionate, 4.2 g (0.04 mole) of diethylene glycol, 17.8 g (0.060 mole) of 2,4-tolylene-bis(2-hydroxyethylcarbamide), 35.1 g (0.14 mole) of 4,4'-diphenylmethane diisocyanate and 10.1 g (0.060 mole) of hexamethylene diisocyanate, followed by carrying out the post-treatment, so as to obtain 76 g of a white polymer (a particular urea bond resin (b) according to the invention). GPC revealed that the polymer had a weight average molecular weight (polystyrene standard) of 37,000. Titration revealed that a carboxyl group content (acid value) was 1.20 meq/g.

Synthesis Examples 18-28

Particular urea bond resins (c) to (m) according to the invention were prepared in the same manner as in Synthesis Example 1, except that the diisocyanate compound, the diol compound and the compound having a primary or secondary amine or the urea compound were changed to those shown in Tables 6 to 8 below. Determinations of molecular weight using GPC and carboxyl group content via titration were carried out. The carboxyl group contents (acid values) found are also shown in Tables 6 to 8. The molecular weights thus determined were from 15,000 to 65,000 in terms of weight average (polystyrene standard).

The numerals in parentheses in the following tables indicate the compositional ratio (% by mole) in the respective particular urea bond resins.

TABLE 6

| Resin No | Diisocyanate Compound | Diol Compound | Compound capable of introducing urea bond | Acid Value (meq/g) |
|---|---|---|---|---|
| (c) | 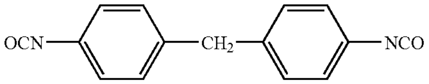 (25) | 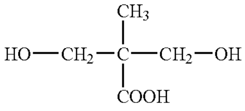 (23) | 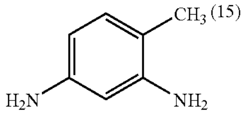 (15) | 1.33 |
| | OCN-13 $(CH_2)_6$—NCO (25) | HO—$(CH_2CH_2O)_2$—H (12) | | |
| (d) | OCN—$(CH_2)_6$—NCO (50) | 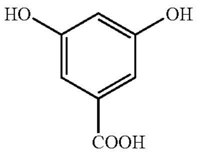 (20) | 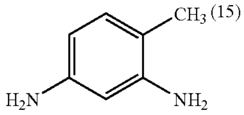 (15) | 1.26 |
| | | HO—$(CH_2)_6$—OH (15) | | |
| (e) | OCN—$(CH_2)_6$—NCO (50) | 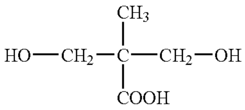 (20) | 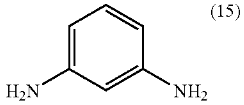 (15) | 1.25 |
| | | HO—$(CH_2)_2SO_2(CH_2)_2$—OH (15) | | |
| (f) | 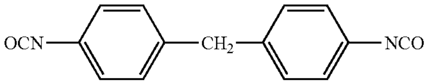 (50) | 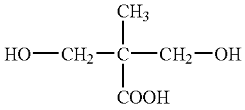 | 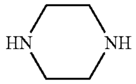 (5) | 1.30 |
| | | HO—$(CH_2CH_2O)_2$—H (25) | | |

TABLE 7

| | | | | |
|---|---|---|---|---|
| (g) | 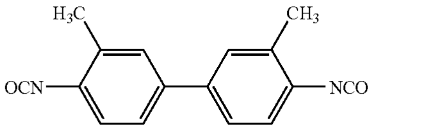 | (25) | 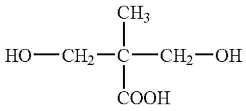 | (25) |
| | OCN—$(CH_2)_6$—NCO | (25) | HO—$(CHCH_2O)_2$—H | (20) |
| (h) | 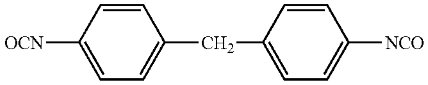 | (25) | 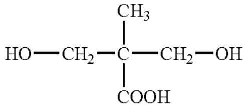 | (25) |
| | 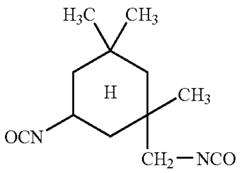 | (25) | | |

TABLE 7-continued
| | | | | | |
|---|---|---|---|---|---|
| (i) | 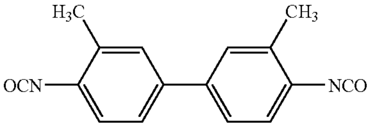 | (20) | 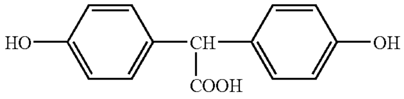 | (25) | |
| | $OCN—(CN_2)_6—NCO$ | | | | |
| (j) | 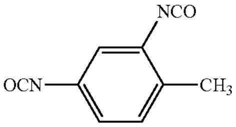 | (50) | 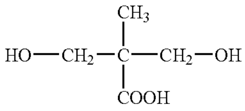 | (20) | |
| | | | $HO—(CH_2)_6—OH$ | (10) | |
| (g) | | | $H_2N—(CH_2)_{12}—NH_2$ | (5) | 1.37 |
| (h) | | | 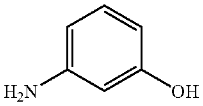 | (25) | 1.34 |
| (i) | | | $HO—(CH_2)_2O(CH_2)_2—NH_2$ | (25) | 1.26 |
| (j) | | | 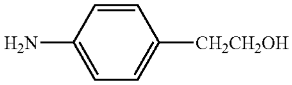 | (20) | 1.25 |
TABLE 8
| | | | | | |
|---|---|---|---|---|---|
| (k) | 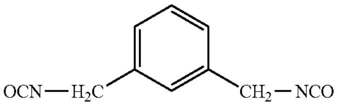 | (50) | 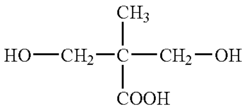 | (30) | |
| (l) | 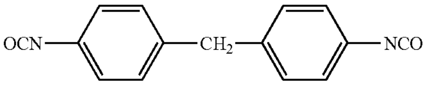 | (50) | 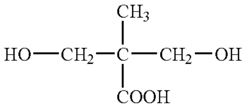 | (30) | |
| (m) | 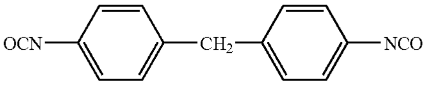 | (30) | 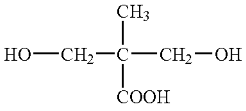 | (30) | |
| | $OCN—(CH_2)_6—NCO$ | (20) | | | |
| (k) | | | 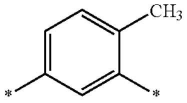 *: $—NHCONH—(CH_2)_2OH$ | (20) | 1.50 |
| (l) | | | $HO(CH_2)_2—NHCONH—(CH_2)_6—*$ *: $—NHCONH—(CH_2)_2OH$ | (20) | |
| (m) | | | 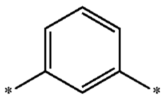 *: $—CH_2NHCONH—(CH_2)_2OH$ | (20) | 1.38 |

Example 19

A support was prepared the same manner as in Example 1, and subjected to an electrochemical surface roughening treatment and an anodic oxidation treatment using an anodic oxidation apparatus of a two-step power supplying electrolysis procedure. After a silicate treatment, the resultant support was washed with water by spraying. On the aluminum support having undergone an alkali metal silicate salt treatment, an undercoating composition having the same formulation as in Example 1 was applied and then dried at 80° C. for 15 seconds to form a coated film. The coated amount of the coated film after drying was 15 $mg/m^2$.

<Formation of Recording Layer (Multi-layer)>

The support in the form of a web was coated with a coating composition for lower layer 4 having the following formulation using a bar coater to give a coated amount of 0.85 $g/m^2$ and then dried at 160° C. for 44 seconds, and it was immediately cooled with cool blast at 17 to 20° C. until the temperature of the support was lowered to 35° C.

Thereafter, the coating composition for upper layer 4 having the following formulation was coated using a bar coater to give a coated amount of 0.22 $g/m^2$ and dried at 148° C. for 25 seconds, and then it was gradually cooled with cool blast at 20 to 26° C., so as to obtain a planographic printing plate precursor of Example 19.

| <Coating Composition for Lower Layer 4> | |
|---|---|
| Particular urea bond resin (a) obtained in Above Synthesis Example | 2.133 g |
| Cyanine dye A (having the foregoing structure) | 0.134 g |
| 4,4'-Bishydroxyphenylsulfone | 0.126 g |
| Tetrahydrophthalic anhydride | 0.190 g |
| p-Toluenesulfonic acid | 0.008 g |
| 3-Methoxy-4-diazodiphenylamine hexafluorophosphate | 0.032 g |
| Ethyl violet with 6-hydroxynaphthalenesulfone as counter ion | 0.781 g |
| Polymer 1 (having the foregoing structure) | 0.035 g |
| γ-Butyrolactone | 38.50 g |
| 1-Methoxy-2-propanol | 12.97 g |

Examples 20-31

Planographic printing plate precursors of Examples 20 to 31 were produced in the same manner as in Example 19, except that the particular urea bond resin (a) used in the coating composition for lower layer 4 employed in Example 19 was changed to the particular urea bond resins (b) to (m) obtained in the above synthesis examples.

Comparative Example 4

A planographic printing plate precursor of Comparative Example 4 was produced in the same manner as in Example 19, except that the coating composition for lower layer 4 used in Example 19 was changed to the foregoing coating composition for lower layer 3 containing no particular urea bond resin.

Evaluation of Planographic Printing Plate Precursors (Evaluation of Printing Durability)

A test pattern was imagewise drawn on the planographic printing plate precursors of Examples 19 to 31 and the planographic printing plate precursor of Comparative Example 4, by applying different amounts of exposure energy using TRENDSETTER (produced by Creo Products, Inc.). Thereafter, development was carried out using a PS processor, 900H (produced by Fuji Photo Film Co., Ltd.), charged with a developer, DT-2 (diluted to make an electroconductivity of 43 mS/cm), produced by Fuji Photo Film Co., Ltd., at a development temperature of 30° C. and a development time of 12 seconds. The resulting printing plates were subjected to continuous printing using a printing machine, LITHRONE (produced by Komori Corp.). The number of sheets that could be printed with a sufficient ink density maintained was visually measured to evaluate printing durability. The larger the number of sheets was, the better the evaluation of printing durability was. The results obtained are shown in Table 9 below.

(Evaluation of Chemical Resistance)

The planographic printing plate precursors of Examples 19 to 31 and the planographic printing plate precursor of Comparative Example 4 were subjected to exposure, development and printing processes in the same manner as above to evaluate printing durability. A step of wiping the plate surface with a cleaner (MULTICLEANER, produced by Fuji Photo Film Co., Ltd.) was added every 5,000 sheets of printing to evaluate chemical resistance. The larger the number of sheets was, the better the evaluation of chemical resistance was. The results obtained are shown in Table 9 below.

TABLE 9

| | Printing Durability/ Number of printed sheets | Chemical Resistance/Number of printed sheets (MULTICLEANER was used every 5,000 sheets of printing) |
|---|---|---|
| Example 19 | 250,000 | 230,000 |
| Example 20 | 200,000 | 180,000 |
| Example 21 | 200,000 | 180,000 |
| Example 22 | 180,000 | 170,000 |
| Example 23 | 170,000 | 170,000 |
| Example 24 | 240,000 | 230,000 |
| Example 25 | 230,000 | 210,000 |
| Example 26 | 200,000 | 180,000 |
| Example 27 | 200,000 | 190,000 |
| Example 28 | 210,000 | 200,000 |
| Example 29 | 200,000 | 190,000 |
| Example 30 | 230,000 | 200,000 |
| Example 31 | 250,000 | 220,000 |
| Comparative Example 4 | 80,000 | 60,000 |

As clear from the results shown in Table 9, the planographic printing plate precursors of Examples 19 to 31 produced using the particular urea bond resin according to the invention were revealed to be excellent in printing durability and chemical resistance.

On the other hand, it was confirmed that the planographic printing plate precursor of Comparative Example 4 produced without using the particular urea bond resin according to the invention was remarkably poor both in printing durability and chemical resistance, as compared to the products of Examples.

Example 32

<Formation of Recording Layer (single layer)>

The same support having been undercoated as in Example 19 was coated with a coating composition for recording layer 3 (single layer) having the following formulation to give a coated amount of 1.8 $g/m^2$ and dried to form a recording layer, to thereby obtain a planographic printing plate precursor of Example 32.

| <Coating Composition for Recording Layer 3 (single layer)> | |
|---|---|
| Novolak resin (m/p-cresol ratio: 6/4, weight average molecular weight: 7,000, containing 0.5% by mass of unreacted cresol) | 0.75 g |
| Particular urea bond resin (a) obtained in Above Synthesis Example | 0.75 g |
| Cyanine dye A (having the foregoing structure) | 0.1 g |
| Phthalic anhydride | 0.05 g |
| p-Toluenesulfonic acid | 0.002 g |
| Ethyl violet with 6-hydroxy-β-naphthalenesulfone as counter ion | 0.02 g |
| Fluorine-type polymer (Megafac F-176 (solid content: 20%), produced by Dainippon Ink and Chemicals, Inc.) | 0.015 g |
| Fluorine-type polymer (Megafac MCF-312 (solid content: 30%), produced by Dainippon Ink and Chemicals, Inc.) | 0.035 g |
| γ-Butyrolactone | 8.5 g |
| 1-Methoxy-2-propanol | 3.5 g |

Examples 33-44

Planographic printing precursors of Examples 33 to 44 were produced in the same manner as in Example 32, except that the particular urea bond resin (a) used in the coating composition of recording layer 3 (single layer) in Example 32 was changed to the particular urea bond resins (b) to (m) obtained in the synthesis examples.

Comparative Example 5

Formation of Recording Layer

The same support having been undercoated as in Example 19 was coated with a coating composition for recording layer 4 (single layer) having the following formulation to give a coated amount of 1.8 g/m$^2$ and dried to form a recording layer, to thereby obtain a planographic printing plate precursor of Comparative Example 5.

| <Coating Composition for Recording Layer 4 (single layer)> | |
|---|---|
| Novolak resin (m/p-cresol ratio: 6/4, weight average molecular weight: 7,000, containing 0.5% by mass of unreacted cresol) | 1.5 g |
| Cyanine dye A (having the foregoing structure) | 0.1 g |
| Phthalic anhydride | 0.05 g |
| p-Toluenesulfonic acid | 0.002 g |
| Ethyl violet with 6-hydroxy-β-naphthalenesulfone as counter ion | 0.02 g |
| Fluorine-type polymer (Megafac F-176 (solid content: 20%), produced by Dainippon Ink and Chemicals, Inc.) | 0.015 g |
| Fluorine-type polymer (Megafac MCF-312 (solid content: 30%), produced by Dainippon Ink and Chemicals, Inc.) | 0.035 g |
| γ-Butyrolactone | 8.5 g |
| 1-Methoxy-2-propanol | 3.5 g |

Evaluation of Planographic Printing Plate Precursors (Printing Durability and Chemical Resistance)

The planographic printing plate precursors of Examples 32 to 44 and Comparative Example 5 were subjected to exposure, development and printing processes in the same manner as in Example 19. Evaluations of printing durability and chemical resistance thereof were also carried out in the same manner. The results obtained are shown in Table 10 below.

TABLE 10

| | Printing Durability/Number of printed sheets | Chemical Resistance/Number of printed Sheets (MULTICLEANER was used every 5,000 sheets of printing) |
|---|---|---|
| Example 32 | 200,000 | 180,000 |
| Example 33 | 200,000 | 180,000 |
| Example 34 | 200,000 | 180,000 |
| Example 35 | 150,000 | 150,000 |
| Example 36 | 160,000 | 150,000 |
| Example 37 | 180,000 | 170,000 |
| Example 38 | 180,000 | 180,000 |
| Example 39 | 210,000 | 200,000 |
| Example 40 | 200,000 | 180,000 |
| Example 41 | 200,000 | 190,000 |
| Example 42 | 190,000 | 180,000 |
| Example 43 | 200,000 | 180,000 |
| Example 44 | 220,000 | 200,000 |
| Comparative Example 5 | 30,000 | 10,000 |

As clear from the results shown in Table 10, the planographic printing plate precursors of Examples 32 to 44 were revealed to be excellent in printing durability and chemical resistance. On the other hand, the planographic printing plate precursor of Comparative Example 5 produced without using the particular urea bond resin according to the invention was remarkably poor both in printing durability and chemical resistance, as compared to the products of Examples. It was understood therefrom that the particular urea bond resin according to the invention exhibited excellent printing durability and chemical resistance even in the case where it was used as a component of a recording layer having a single layer structure.

Furthermore, when comparing between the recording layers having the multi-layer structure and the recording layers having the single layer structure, it was confirmed that the recording layers having the multi-layer structure provided more excellent printing durability and chemical resistance in the case where the similar particular urea bond resin was used.

Example 45

A planographic printing plate precursor of Example 45 was produced by providing an undercoating and a recording layer (including a lower layer and an upper layer) in the same manner as in Example 19, except that in preparation of the support in Example 19, the silicate treatment was not conducted after the anodic oxidation treatment.

Evaluation of Printing Durability and Chemical Resistance

The produced planographic printing plate precursor was exposed in the same manner as in Example 19, and then developed using a PS processor, 900H (produced by Fuji Photo Film Co., Ltd.), charged with an alkali developer A having the following formulation at a developing temperature maintained at 28° C. for a developing time of 25 seconds. Thereafter, evaluation of printing durability and chemical resistance was carried out in the same manner as in Example 19.

The obtained results were printing durability of 250,000 sheets and chemical resistance of 190,000 sheets, which were almost equal to the number of printed sheets obtained in Example 19. It was thus understood that even in Example 45, in which a planographic printing plate precursor produced using a support having not been subjected to a hydrophilic treatment with a silicate was developed with a silicate developer, excellent printing durability and chemical resistance, which are the effects of the invention, could be obtained similarly to the case of Example 19, in which a planographic printing plate precursor produced using a support having been subjected to a silicate treatment was developed with a non-silicate developer.

| <Alkali Developer Solution A> | |
|---|---|
| $SiO_2$ .$K_2O$ ($K_2O/SiO_2$ = 1/1 (molar ratio)) | 4.0% by mass |
| Citric acid | 0.5% by mass |
| Polyethylene glycol-modified sorbitol (30-unit adduct in average) | 1.0% by mass |
| Water | 50.0% by mass |

4. Synthesis of Particular Alkali-soluble Resin

Synthesis Example 29

16.1 g (0.12 mole) of 2,2-bis(hydroxymethyl)propionate and 20.3 g (0.080 mole) of bis(2-hydroxyethyl)isophthalamide were poured in a three-neck round bottom flask equipped with a condenser and a stirrer, and dissolved in 120 mL of N,N-dimethylacetamide. 50.1 g (0.20 mole) of 4,4'-diphenylmethane diisocyanate was added thereto, and the mixture was heated with stirring at 100° C. for 6 hours. Thereafter, the resultant mixture was diluted with 200 mL of N,N-dimethylformamide and 50 mL of acetic acid. The reaction mixture was added to 4 L of water with stirring to precipitate a white polymer. The polymer was filtrated, washed with water and then dried under vacuum to obtain 82 g of a polymer having an amide bond in the main chain (a particular alkali-soluble resin (a) according to the invention). Gel permeation chromatography (GPC) revealed that the polymer had a weight average molecular weight (polystyrene standard) of 35,000. Titration revealed that a carboxyl group content (acid value) was 1.35 meq/g.

Synthesis Examples 30-39

Particular alkali-soluble resins (b) to (j) according to the invention were prepared in the same manner as in Synthesis Example 29, except that the diisocyanate compound and the diol compound were changed to those shown in Tables 11 to 13 below. Determinations of molecular weight by GPC and carboxyl group content via titration were carried out. The carboxyl group contents (acid values) found are also shown in Tables 11 to 13. The obtained molecular weights were from 25,000 to 60,000 in terms of weight average (polystyrene standard).

The numerals in parentheses in the following tables indicate the compositional ratio (% by mole) in the respective particular alkali-soluble resins.

TABLE 11

| Resin No. | Diisocyanate Compound (mol %) | | Diol Compound (mol %) | | Acid Value (meq/g) |
|---|---|---|---|---|---|
| (b) | 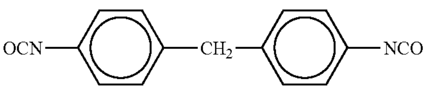 | (25) | 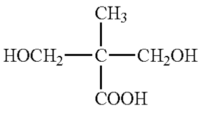 | (25) | 1.21 |
| | OCN—$(CH_2)_6$—NCO | (25) | 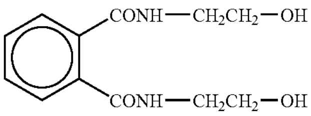 | (25) | |
| (c) | OCN—$(CH_2)_6$—NCO | (50) | 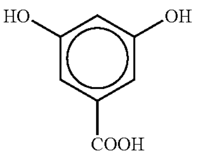 | (20) | 1.03 |
| | | | 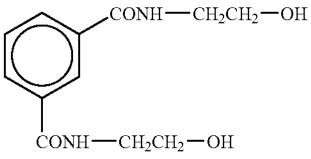 | (30) | |
| (d) | 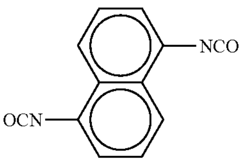 | (50) | 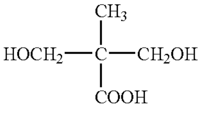 | (25) | 1.28 |
| | | | HO—$CH_2CH_2$—NHCO—CH=CH—CONH—$CH_2CH_2$—OH | (25) | |

TABLE 12
| Resin No. | Diisocyanate Compound (mol %) | |
|---|---|---|
| (e) | 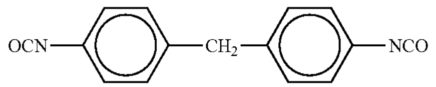 | (32) |
| | 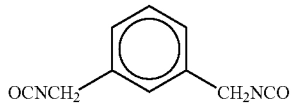 | (20) |
| (f) | 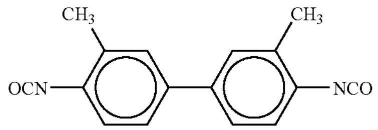 | (37) |
| | OCN—$(CH_2)_6$—NCO | (15) |
| (g) | 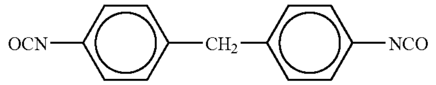 | (37) |
| | 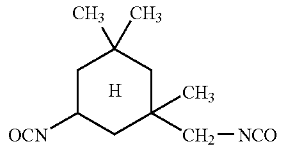 | (15) |
| Resin No. | Diol Compound (mol %) | | Acid Value (meq/g) |
|---|---|---|---|
| (e) | 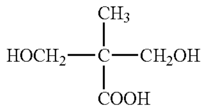 | (24) | 1.20 |
| | HO—$CH_2CH_2$—NHCO—$(CH_2)_4$—CONH—$CH_2CH_2$—OH | (24) | |
| (f) | 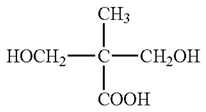 | (24) | 1.19 |
| | HO—$CH_2CH_2$—NHCO—$CH_2$—O—$CH_2$—CONH—$CH_2CH_2$—OH | (24) | |
| (g) | 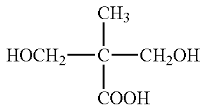 | (24) | 1.11 |
| | 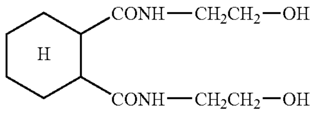 | (24) | |

TABLE 13

| Resin No. | Diisocyanate Compound (mol %) | | Diol Compound (mol %) | | Acid Value (meq/g) |
|---|---|---|---|---|---|
| (h) | 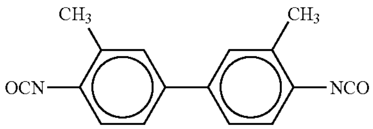 | (20) | 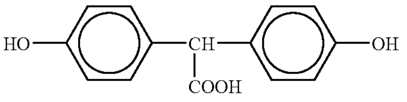 | (25) | 1.24 |
| | $OCN—(CH_2)_6—NCO$ | (30) | $HO—CH_2CH_2—CONH—CH_2CH_2—OH$ | (25) | |
| (i) | 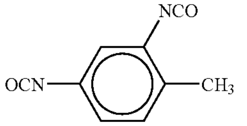 | (48) | 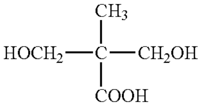 | (26) | 1.25 |
| | | | 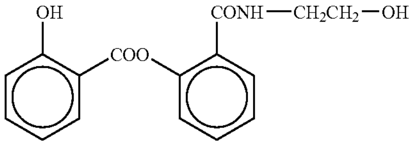 | (26) | |
| (j) | 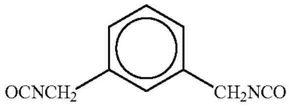 | (50) | 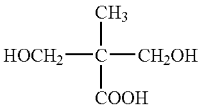 | (28) | 1.38 |
| | | | $HO—CH_2CH_2—NHCO—(CH_2)_3—CONH—CH_2CH_2—OH$ | (22) | |

Example 46

<Preparation of Support>

Aluminum Plate

A molten liquid was prepared using an aluminum alloy containing 0.06% by mass of Si, 0.30% by mass of Fe, 0.025% by mass of Cu, 0.001% by mass of Mn, 0.001% by mass of Mg, 0.001% by mass of Zn, 0.03% by mass of Ti and the balance of Al and unavoidable impurities, and after molten liquid processing and filtration, an ingot having a thickness of 500 mm and a width of 1,200 mm was produced by a DC casting method. The surface of the ingot of about 10 mm in average thickness was ground using a surface grinding machine, and the ingot was maintained at 550° C. for about 5 hours. After the temperature was lowered to 400° C., the ingot was rolled into a plate having a thickness of 2.7 mm using a hot rolling machine. Furthermore, it was subjected to a heat treatment at 500° C. using a continuous annealing machine to give a thickness of 0.24 mm through cold rolling, to thereby obtain an aluminum plate of a material according to JIS A1050. The average crystalline diameter of the resulting aluminum material was 50 μm (short diameter) and 300 μm (long diameter). The aluminum plate was made into a shape having a width of 1,030 mm, and subjected to the following surface treatment.

<Surface Treatment>

The surface treatment was carried out by continuously performing the following treatments (a) to (k). After the respective treatments and water washing, the solutions and water were drained using nip rollers.

(a) Mechanical Surface Roughening Treatment

A mechanical surface roughening treatment was carried out using an apparatus shown in FIG. 1 with rotating nylon brushes in the shape of a roller by supplying a suspension of an abrasive (pumice) having a specific gravity of 1.12 in water as a grinding slurry to the surface of the aluminum plate. In FIG. 1, numeral 1 denotes the aluminum plate, 2 and 4 denote the brushes in the shape of a roller, 3 denotes the grinding slurry, and 5, 6, 7 and 8 denote supporting rollers. The abrasive had an average particle diameter of 30 μm and a maximum particle diameter of 100 μm. Bristles of the nylon brush were formed with 6,10-nylon and had a length of 45 mm and a diameter of 0.3 mm. The nylon brush was formed by densely grafting bristles into holes made on a stainless steel cylinder having a diameter of 300 mm. Three rotating brushes were used herein. The two supporting rollers under the brush each had a diameter of 200 mm, and the distance between them was 300 mm. The brushes in the shape of a roller were pressed onto the aluminum plate to such an extent that the load of the driving motor for rotating the brush was increased by 7 kW relative to the load thereof before pressing the brush onto the aluminum plate. The rotating direction of the brush was the same as the conveying direction of the aluminum plate. The rotating number of the brush was 200 rpm.

(b) Alkali Etching Treatment

The aluminum plate thus treated was subjected to an etching treatment by spraying an aqueous solution containing 2.6% by mass of caustic soda and having an aluminum ion concentration of 6.5% by mass and a temperature of 70° C. to dissolve the aluminum plate by 10 $g/m^2$. Thereafter, the aluminum plate was washed with water by spraying.

(c) Desmutting Treatment

A desmutting treatment was carried out by spraying a 1% by mass aqueous nitric acid solution at a temperature of 30° C. (containing 0.5% by mass of aluminum ion), and thereafter, the aluminum plate was washed with water by spraying. The aqueous nitric acid solution used in the desmutting treatment was a waste solution generated upon carrying out an electrochemical surface roughening treatment by applying an alternating electric current in an aqueous nitric acid solution.

(d) Electrochemical Surface Roughening Treatment

Figure 2:
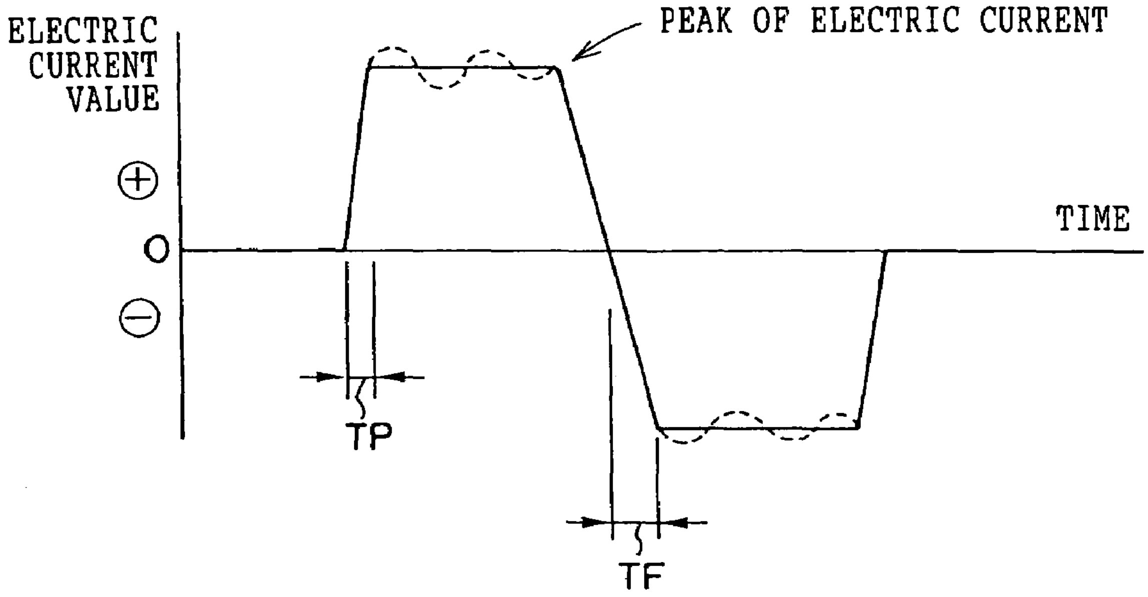
FIG. 2 is a graph showing an example of an electric current waveform chart of an alternating wave used in electrochemical surface-roughening for producing the support of the planographic printing plate precursor according to the invention.

An electrochemical surface roughening treatment was continuously carried out employing an alternating voltage at 60 Hz. An electrolytic solution used herein was a 10.5 g/ L aqueous nitric acid solution (containing 5 g/L of aluminum ion and 0.007% by mass of ammonium ion) at a liquid temperature of 50° C. The alternating electric power source had an electric current waveform shown in FIG. 2, and the electrochemical surface roughening treatment was carried out, by applying an alternating electric current of rectangular pulses having a period of time TP where the electric current value reached a peak value from zero of 0.8 msec and a duty ratio of 1/1 using a carbon electrode as a counter electrode. Ferrite was used as a supporting anode. An electrolytic bath used had a constitution shown in FIG. 3.

Figure 3:
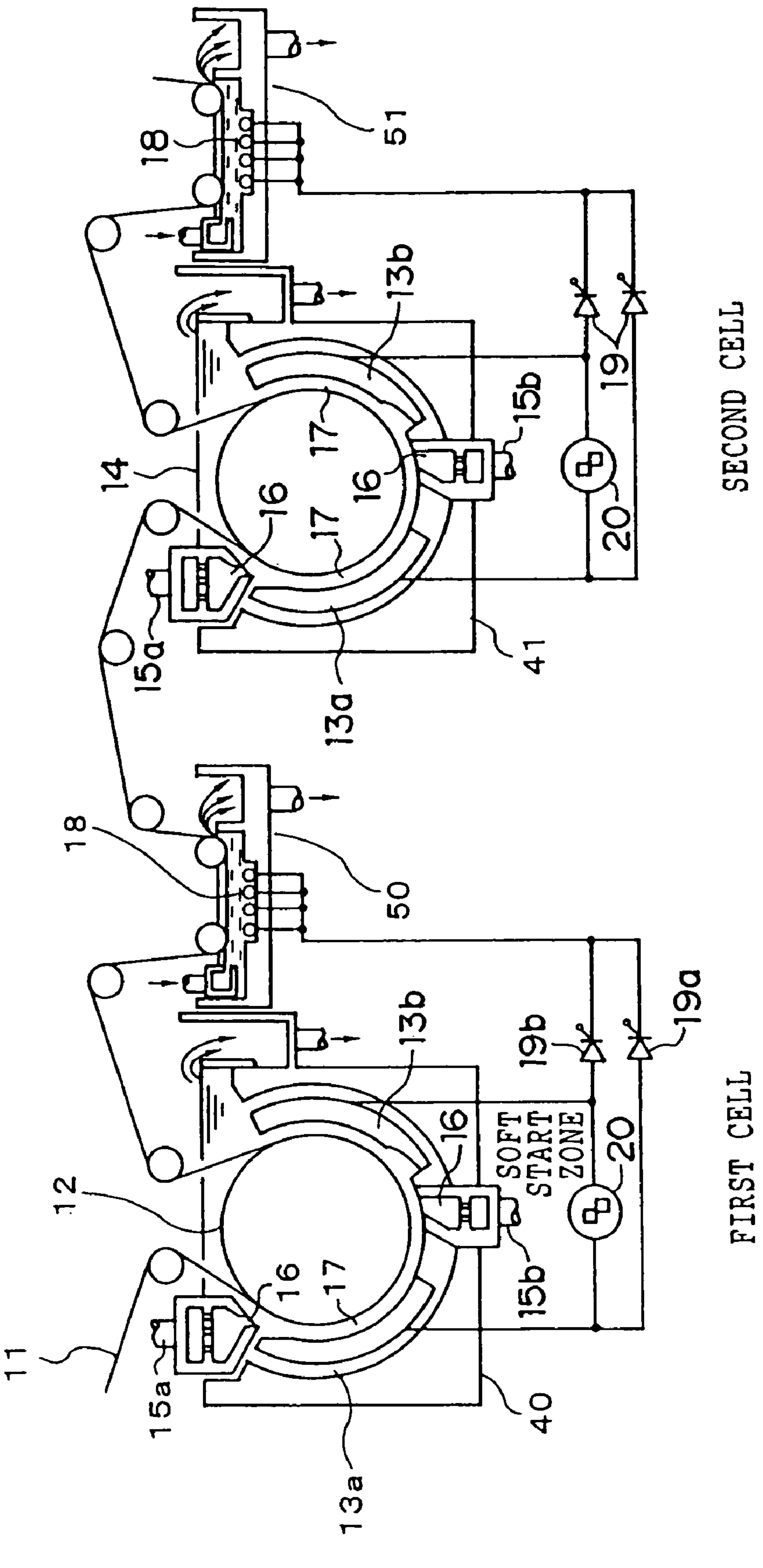
FIG. 3 is a schematic constitutional view showing an example of an apparatus having at least two radial drum rollers connected to each other for use in electrochemical surface-roughening to produce the support of the planographic printing plate precursor according to the invention.

In FIG. 3, numeral 11 denotes an aluminum web, 12 denotes a radial drum roller, 13*a* and 13*b* denote main electrodes, 14 denotes an electrolytic solution, 15*a* and 15*b* denote an electrolytic solution supplying inlets, 16 denotes a slit, 17 denotes an electrolytic solution path, 18 denotes a supporting anode, 19*a* and 19*b* denote thyristors, 20 denotes an alternating electric power source, 40 and 41 denote main electrolytic baths, and 50 and 51 denote supporting anode baths.

The electric current density was 30 A/$dm^2$ in terms of a peak value of electric current, and the electric charge was 220 C/$dm^2$ in terms of a total electric charge where the anode was the aluminum plate. An electric current of 5% of the total electric current from the electric power source was shunted to the supporting anode. Thereafter, the aluminum plate was washed with water by spraying.

(e) Alkali Etching Treatment

The aluminum plate was subjected to an etching treatment by spraying an aqueous solution containing 26% by mass of caustic soda and having an aluminum ion concentration of 6.5% by mass and a temperature of 32° C. to dissolve the aluminum plate by 0.50 g/$m^2$, whereby smut components mainly containing aluminum hydroxide formed through the electrochemical surface roughening by applying an alternating electric current was removed, and edge parts of pits thus formed was dissolved to smoothen the edge parts. Thereafter, the aluminum plate was washed with water by spraying.

(f) Desmutting Treatment

A desmutting treatment was carried out by spraying a 15% by mass aqueous nitric acid solution at a temperature of 30° C. (containing 4.5% by mass of aluminum ion), and thereafter, the aluminum plate was washed with water by spraying. The aqueous nitric acid solution used in the desmutting treatment was a waste solution generated upon carrying out an electrochemical surface roughening treatment by applying an alternating electric current in an aqueous nitric acid solution.

(g) Electrochemical Surface Roughening Treatment

An electrochemical surface roughening treatment was continuously carried out employing an alternating voltage at 60 Hz. An electrolytic solution used herein was a 5.0 g/L aqueous hydrochloric acid solution (containing 5 g/L of aluminum ion) at a temperature of 35° C. The alternating electric power source had an electric current waveform shown in FIG. 2, and the electrochemical surface roughening treatment was carried out, by applying an alternating electric current of rectangular pulses having a period of time TP where the electric current value reaches the peak value from zero of 0.8 msec and a duty ratio of 1/1 using a carbon electrode as a counter electrode. Ferrite was used as a supporting anode. An electrolytic bath used had the constitution shown in FIG. 3.

The electric current density was 25 A/$dm^2$ in terms of a peak value of electric current, and the electric charge was 50 C/$dm^2$ in terms of a total electric charge where the anode was the aluminum plate. Thereafter, the aluminum plate was washed with water by spraying.

(h) Alkali Etching Treatment

The aluminum plate was subjected to an etching treatment by spraying an aqueous solution containing 26% by mass of caustic soda and having an aluminum ion concentration of 6.5% by mass and a temperature of 32° C. to dissolve the aluminum plate to 0.10 g/$m^2$, whereby smut components mainly containing aluminum hydroxide formed through the electrochemical surface roughening by applying an alternating electric current was removed, and edge parts of pits thus formed was dissolved to smoothen the edge parts. Thereafter, the aluminum plate was washed with water by spraying.

(i) Desmutting Treatment

A desmutting treatment was carried out by spraying a 25% by mass aqueous nitric acid solution at a temperature of 60° C. (containing 0.5% by mass of aluminum ion), and thereafter, the aluminum plate was washed with water by spraying.

(j) Anodic Oxidation Treatment

Figure 4:
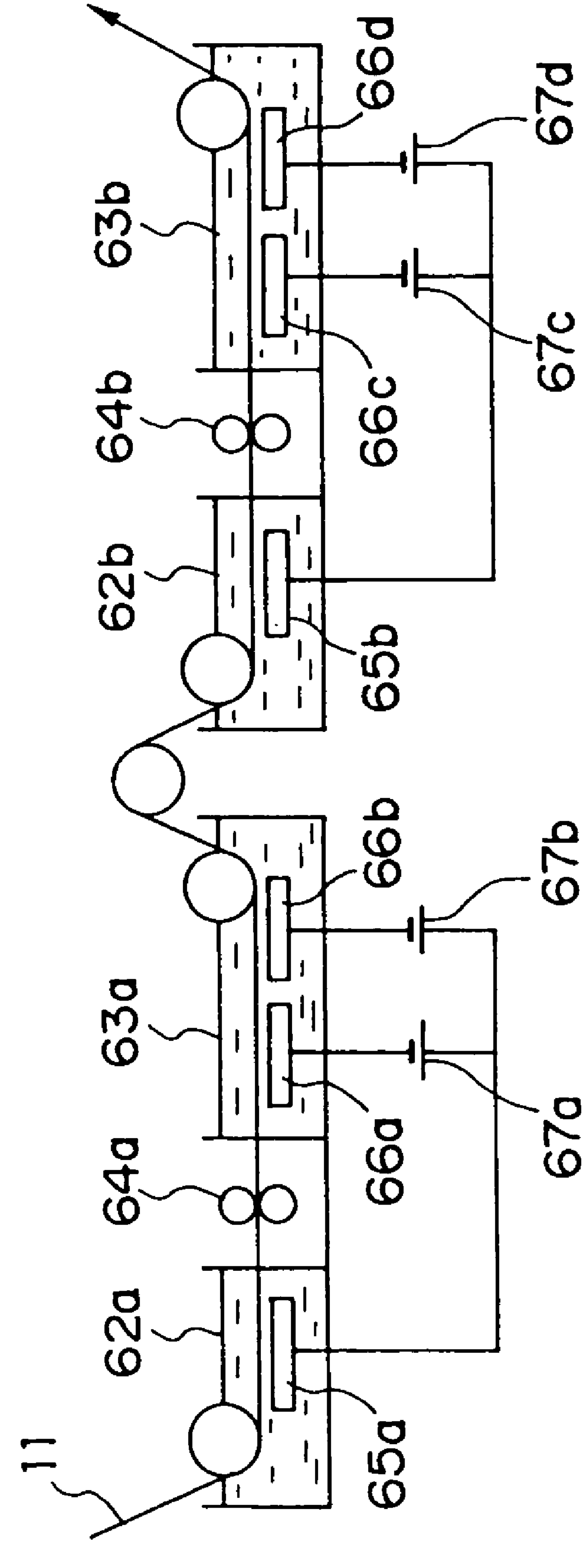
FIG. 4 is a schematic constitutional view showing an example of an electrolyzing apparatus in a two-step power supplying electrolytic process that is applicable to the production of the support of the planographic printing plate precursor according to the invention.

An anodic oxidation treatment was carried out using an anodic oxidation apparatus having a constitution shown in FIG. 4, which had first and second electrolysis sections each having a length of 6 m, first and second power supplying parts each having a length of 3 m, and first and second power supplying electrode portions each having a length of 2.4 m. An electrolytic solution supplied to the first and second electrolysis sections was sulfuric acid. The electrolytic solution had a sulfuric acid concentration of 50 g/L (containing 0.5% by mass of aluminum ion) and a temperature of 20° C. Thereafter, the aluminum plate was washed with water by spraying.

In the anodic oxidation apparatus, an electric current supplied from electric power sources 67*a* and 67*b* flew to a first power supplying electrode 65*a* placed at a first power supplying portion 62*a* and then to the aluminum plate 11 through the electrolytic solution, so as to form an anodic oxidization film on the surface of the aluminum plate 11 in a first electrolysis section 63*a*. The electric current then flew to electrolytic electrodes 66*a* and 66*b* placed in the first electrolysis section 63*a* and returned to electrodes of the electric power sources 67*a* and 67*b*.

Electric charges supplied from electric power sources 67*c* and 67*d* to a second power supplying portion 62*b* were the same as the electric charges supplied from the electric power sources 67*a* and 67*b* to the first power supplying portion 62*a*, and the electric current densities at the first electrolysis section 63*a* and a second electrolysis section 63*b* were about 30 A/$dm^2$. Accordingly, in the second power supplying portion 62*b*, the electric power was supplied through the surface of the oxidation film of 1.35 g/$m^2$ formed at the first electrolysis section 63*a*. The amount of the oxidation film finally formed was 2.7 g/$m^2$.

(k) Alkali Metal Silicate Salt Treatment

The aluminum support thus obtained through the anodic oxidation treatment was immersed in a bath containing an aqueous solution of No.3 sodium silicate of 1% by mass at a temperature of 30° C. to conduct an alkali metal silicate salt treatment (silicate treatment). Thereafter, the aluminum support was washed with water by spraying to thereby obtain an aluminum support for a planographic printing plate precursor having been subjected to a silicate hydrophilic treatment on the surface thereof. The resultant aluminum support having been subjected to the alkali metal silicate salt treatment was coated with an undercoating composition having the same formulation as in Example 1 and dried at 80° C. for 15 seconds to form a coated film. The coated amount of the coated film after drying was 15 mg/m$^2$.

<Formation of Recording Layer (Multi-layer)>

The support in the form of a web was coated with a coating composition for lower layer 5 having the following formulation using a bar coater to give a coated amount of 0.85 g/m$^2$ and then dried at 160° C. for 44 seconds, and it was immediately cooled with cool blast at 17 to 20° C. until the temperature of the support was lowered to 35° C.

Thereafter, the coating composition for upper layer 2 having the following formulation was coated using a bar coater to give a coated amount of 0.22 g/m$^2$ and dried at 148° C. for 25 seconds, and then it was gradually cooled with cool blast at 20 to 26° C., so as to obtain a planographic printing plate precursor of Example 46.

| <Coating Composition for Lower Layer 5> | |
|---|---|
| Particular alkali-soluble resin (a) obtained in Synthesis Example 29 | 2.133 g |
| Cyanine dye A (having the foregoing structure) | 0.134 g |
| 4,4'-Bishydroxyphenylsulfone | 0.126 g |
| Tetrahydrophthalic anhydride | 0.190 g |
| p-Toluenesulfonic acid | 0.008 g |
| 3-Methoxy-4-diazodiphenylamine hexafluorophosphate | 0.032 g |
| Ethyl violet with 6-hydroxynaphthalenesulfone as counter ion | 0.0781 g |
| Polymer 1 (having the foregoing structure) | 0.035 g |
| γ-Butyrolactone | 38.50 g |
| 1-Methoxy-2-propanol | 12.97 g |

| <Coating Composition for Upper Layer 2> | |
|---|---|
| m,p-Cresol novolak (m/p ratio: 6/4, weight average molecular weight: 4,500, containing 0.8% by mass of unreacted cresol) | 0.3479 g |
| Polymer 3 (having the following structure, MEK 30% solution) | 0.1403 g |
| Cyanine dye A (having the foregoing structure) | 0.0192 g |
| Polymer 1 (having the foregoing structure) | 0.015 g |
| Polymer 2 (having the following structure) | 0.00328 g |
| Quaternary ammonium salt of the following structural formula | 0.0043 g |
| Surfactant (Polyoxyethylene sorbit fatty acid ester, HLB8.5, GO-4, produced by Nikko Chemicals Co., Ltd.) | 0.008 g |
| Methyl ethyl ketone | 6.79 g |
| 1-Methoxy-2-propanol | 13.07 g |

Polymer 2

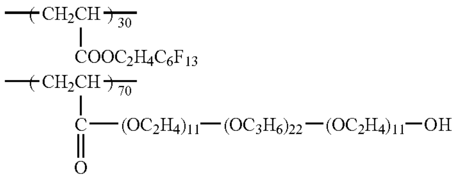

-continued

Polymer 3

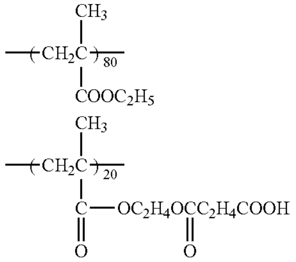

Weight Average Molecular Weight 70,000

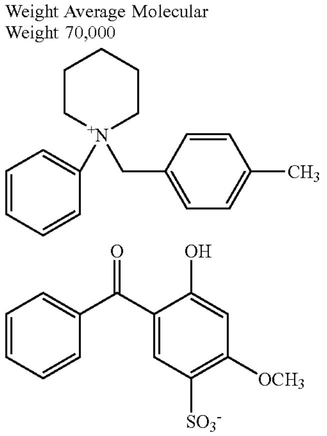

Quaternary ammonium salt

Examples 47-55

Planographic printing plate precursors of Examples 47 to 55 were produced in the same manner as in Example 46, except that the particular alkali-soluble resin (a) used in the coating composition for lower layer 5 used in Example 46 was changed to the particular alkali-soluble resins (b) to (j) obtained in Synthesis Examples 47 to 55.

Comparative Example 6

A planographic printing plate precursor of Comparative Example 6 was produced in the same manner as in Example 46, except that the coating composition for lower layer 5 used in Example 46 was changed to a coating composition for lower layer 6 having the following formulation containing no particular alkali-soluble resin.

| <Coating Composition for Lower Layer 6> | |
|---|---|
| N-(4-Aminosulfonylphenyl)methacrylamide/acrylonitrile/methyl methacrylate (copolymerization ratio: 36/34/30, weight average molecular weight: 50,000, acid value: 2.65) | 2.133 g |
| Cyanine dye A (having the foregoing structure) | 0.134 g |
| 4,4'-Bishydroxyphenylsulfone | 0.126 g |
| Tetrahydrophthalic anhydride | 0.190 g |
| p-Toluenesulfonic acid | 0.008 g |
| 3-Methoxy-4-diazodiphenylamine hexafluorophosphate | 0.032 g |
| Ethyl violet with 6-hydroxynaphthalenesulfone as counter ion | 0.0781 g |
| Polymer 1 (having the foregoing structure) | 0.035 g |
| Methyl ethyl ketone | 25.41 g |
| 1-Methoxy-2-propanol | 12.97 g |
| γ-Butyrolactone | 13.18 g |

Evaluation of Planographic Printing Plate Precursors (Evaluation of Printing Durability)

A test pattern was imagewise drawn on the planographic printing plate precursors of Examples 46 to 55 and the planographic printing plate precursor of Comparative Example 6, by applying different amounts of exposure energy using TRENDSETTER (produced by Creo Products, Inc.). Thereafter, development was carried out using a PS processor, LP 940H (produced by Fuji Photo Film Co., Ltd.), charged with a developer, DT-2 (diluted to make an electroconductivity of 43 mS/cm) produced by Fuji Photo Film Co., Ltd., at a development temperature of 30° C. and a development time of 12 seconds. The resulting printing plates were subjected to continuous printing using a printing machine, LITHRONE (produced by Komori Corp.). The number of sheets that could be printed with a sufficient ink density maintained was visually measured to evaluate printing durability. The larger the number of sheets was, the better the evaluation of printing durability was. The results obtained are shown in Table 14 below.

(Evaluation of Chemical Resistance)

The planographic printing plate precursors of Examples 46 to 55 and the planographic printing plate precursor of Comparative Example 6 were subjected to exposure, development and printing processes in the same manner as above to evaluate printing durability. A step of wiping the plate surface with a cleaner (MULTICLEANER, produced by Fuji Photo Film Co., Ltd.) was added every 5,000 sheets of printing to evaluate chemical resistance. The larger the number of sheets was, the better the evaluation of chemical resistance was. The results obtained are shown in Table 14 below.

TABLE 14

| | Printing Durability/ Number of printed sheets | Chemical Resistance/Number of printed sheets (MULTICLEANER was used every 5,000 sheets of printing) |
|---|---|---|
| Example 46 | 220,000 | 220,000 |
| Example 47 | 200,000 | 190,000 |
| Example 48 | 170,000 | 150,000 |
| Example 49 | 200,000 | 200,000 |
| Example 50 | 190,000 | 180,000 |
| Example 51 | 200,000 | 190,000 |
| Example 52 | 250,000 | 240,000 |
| Example 53 | 180,000 | 170,000 |
| Example 54 | 170,000 | 160,000 |
| Example 55 | 200,000 | 190,000 |
| Comparative Example 6 | 70,000 | 60,000 |

As clear from the results shown in Table 14, the planographic printing plate precursors of Examples 46 to 55 produced using the particular alkali-soluble resin as a component of the lower layer according to the invention were revealed to be excellent in printing durability and chemical resistance.

On the other hand, it was confirmed that the planographic printing plate precursor of Comparative Example 6 produced without using the particular alkali-soluble resin according to the invention was remarkably poor both in rinting durability and chemical resistance, as compared to the products of Examples.

Example 56

<Preparation of Support>

An aluminum plate (material: JIS A1050) having a thickness of 0.3 mm was subjected to an etching treatment using an aqueous solution having a caustic soda concentration of 30 g/L, an aluminum ion concentration of 10 g/L and a liquid temperature of 60° C. for 10 seconds. After washing with water, the resultant plate was neutralized with 10 g/L nitric acid, followed by washing with water. The aluminum plate was subjected to an electrochemical surface roughening treatment in an aqueous solution having a hydrogen chloride concentration of 15 g/L, an aluminum ion concentration of 10 g/L and a liquid temperature of 30° C., by applying an electric current having an alternating waveform of a sine wave under conditions of an applied voltage of 20 V with an electric charge of 500 $C/dm^2$, and after washing with water, subjected to etching treatment in an aqueous solution having a caustic soda concentration of 30 g/L, an aluminum ion concentration of 10 g/ L and a liquid temperature of 40° C. for 10 seconds, followed by washing with water. The aluminum plate was then subjected to desmutting treatment in a sulfuric acid aqueous solution having a sulfuric acid concentration of 15% by mass and a liquid temperature of 30° C., followed by washing with water. Furthermore, it was subjected to an anodic oxidation treatment in a 10% by mass aqueous sulfuric acid solution at a liquid temperature of 20° C. under conditions of an electric current density of direct current of 6 $A/dm^2$ to provide an anodic oxidization film corresponding to 2.5 $g/m^2$, followed by washing with water and drying. Thereafter, it was treated with a 2.5% by mass aqueous sodium silicate solution at 30° C. for 10 seconds to prepare a support. Measurement of the support for center line average roughness (Ra) using a needle having a diameter of 2 μm revealed that it was 0.48 μm. The aluminum support having undergone a silicate salt treatment was coated with an undercoating composition having the same formulation as in Example 1 and dried at 80° C. for 15 seconds to form a coated film. The coated amount of the coated film after drying was 17 $mg/m^2$.

<Formation of Recording Layer (Single Layer)>

The same support having been undercoated as above was coated with a coating composition for recording layer 5 (single layer) having the following formulation to give a coated amount of 1.8 $g/m^2$ and dried to form a recording layer, to thereby obtain a planographic printing plate precursor of Example 56.

| <Coating Composition for Recording Layer 5 (single layer)> | |
|---|---|
| Novolak resin (m/p-cresol ratio: 6/4, weight average molecular weight: 7,000, containing 0.5% by mass of unreacted cresol) | 0.05 g |
| Particular alkali-soluble resin (a) obtained in Synthesis Example 1 | 1.00 g |
| Cyanine dye A (having the foregoing structure) | 0.1 g |
| Phthalic anhydride | 0.05 g |
| p-Toluenesulfonic acid | 0.002 g |
| Ethyl violet with 6-hydroxy-β-naphthalenesulfone as counter ion | 0.02 g |
| Fluorine-type polymer (Megafac F-176 (solid content: 20%), produced by Dainippon Ink and Chemicals, Inc.) | 0.015 g |
| Fluorine-type polymer (Megafac MCF-312 (solid content: 30%), produced by Dainippon Ink and Chemicals, Inc.) | 0.035 g |
| γ-Butyrolactone | 8.5 g |
| 1-Methoxy-2-propanol | 3.5 g |

Examples 57-65

Planographic printing plate precursors of Examples 57 to 65 were produced in the same manner as in Example 56, except that the particular alkali-soluble resin (a) used in the coating composition of recording layer 5 (single layer) in Example 56 was changed to the particular alkali-soluble resins (b) to (j) obtained in Synthesis Examples 2 to 10.

Comparative Example 7

<Formation of Recording Layer>

The same support having been undercoated as in Example 56 was coated with a coating composition for recording layer 6 (single layer) having the following formulation to give a coated amount of 1.8 $g/m^2$ and dried to form a recording layer, to thereby obtain a planographic printing plate precursor of Comparative Example 7.

| <Coating Composition for Recording Layer 6 (single layer)> | |
|---|---|
| Novolak resin (m/p-cresol ratio: 6/4, weight average molecular weight: 7,000, containing 0.5% by mass of unreacted cresol) | 1.5 g |
| Cyanine dye A (having the foregoing structure) | 0.1 g |
| Phthalic anhydride | 0.05 g |
| p-Toluenesulfonic acid | 0.002 g |
| Ethyl violet with 6-hydroxy-β-naphthalenesulfone as counter ion | 0.02 g |
| Fluorine-type polymer (Megafac F-176 (solid content: 20%), produced by Dainippon Ink and Chemicals, Inc.) | 0.015 g |
| Fluorine-type polymer (Megafac MCF-312 (solid content: 30%), produced by Dainippon Ink and Chemicals, Inc.) | 0.035 g |
| γ-Butyrolactone | 8.5 g |
| 1-Methoxy-2-propanol | 3.5 g |

Evaluation of Planographic Printing Plate Precursors (Printing Durability and Chemical Resistance)

The planographic printing plate precursors of Examples 56 to 65 and Comparative Example 2 were subjected to exposure, development and printing processes in the same manner as in Example 46. Evaluation of printing durability and chemical resistance thereof was also carried out in the same manner. The results obtained are shown in Table 15 below.

TABLE 15

| | Printing Durability/ Number of printed sheets | Chemical Resistance/Number of printed sheets (MULTICLEANER was used every 5,000 sheets of printing) |
|---|---|---|
| Example 56 | 180,000 | 170,000 |
| Example 57 | 180,000 | 170,000 |
| Example 58 | 140,000 | 120,000 |
| Example 59 | 170,000 | 160,000 |
| Example 60 | 200,000 | 170,000 |
| Example 61 | 180,000 | 180,000 |
| Example 62 | 220,000 | 220,000 |
| Example 63 | 190,000 | 170,000 |
| Example 64 | 150,000 | 130,000 |
| Example 65 | 180,000 | 180,000 |
| Comparative Example 7 | 30,000 | 10,000 |

As clear from the results shown in Table 15, the planographic printing plate precursors of Examples 56 to 65 were revealed to be excellent in printing durability and chemical resistance. On the other hand, the planographic printing plate precursor of Comparative Example 7 produced without using the particular alkali-soluble resin according to the invention was remarkably poor both in printing durability and chemical resistance, as compared to the products of Examples. It was understood therefrom that the particular alkalisoluble resin according to the invention exhibited excellent printing durability and chemical resistance even in the case where it was used as a component of a recording layer having a single layer structure.

Furthermore, when comparing between the recording layers having the multi-layer structure and the recording layers having the single layer structure, it was confirmed that the recording layers having the multi-layer structure exhibited excellent printing durability and chemical resistance in the case where the particular alkali-soluble resin was used.

Example 66

A planographic printing plate precursor of Example 66 was produced by providing an undercoating and a recording layer (including a lower layer and an upper layer) in the same manner as in Example 46, except that in preparation of the support in Example 46, the silicate treatment was not performed after the anodic oxidation treatment.

Evaluation of Printing Durability and Chemical Resistance

The resulting planographic printing plate precursor was exposed in the same manner as in Example 46, and developed using a PS processor, LP 940H (produced by Fuji Photo Film Co., Ltd.), charged with an alkali developer A having the following formulation at a developing temperature maintained at 28° C. for a developing time of 25 seconds. Thereafter, evaluation of printing durability and chemical resistance was carried out in the same manner as in Example 46.

The obtained results were printing durability of 250,000 sheets and chemical resistance of 190,000 sheets, which were almost equal to the number of printed sheets obtained in Example 46. It was thus understood that even in Example 66, in which a planographic printing plate precursor produced using a support having not been subjected to a hydrophilic treatment with a silicate was developed with a silicate developer, excellent printing durability and chemical resistance, which are the effects of the invention, could be obtained similarly to the case of Example 46, in which a planographic printing plate precursor produced using a support having been subjected to a silicate treatment was developed with a non-silicate developer.

| <Alkali Developer Solution A> | |
|---|---|
| $SiO_2.K_2O$ ($K_2O/SiO_2$ = 1/1 (molar ratio)) | 4.0% by mass |
| Citric acid | 0.5% by mass |
| Polyethylene glycol-modified sorbitol (30-unit adduct in average) | 1.0% by mass |
| Water | 50.0% by mass |

Example 67

<Formation of Recording Layer (Single Layer)>

The support having been undercoated in the same manner in Example 56 was coated with a coating composition for recording layer 7 (single layer) having the following formulation to give a coated amount of 1.8 g/$m^2$ and dried to form a photosensitive layer (a recording layer), to thereby obtain a planographic printing plate precursor of Example 67.

| <Coating Composition for Recording Layer 7 (single layer)> | |
|---|---|
| Novolak resin | 0.9 g |
| (m/p-cresol ratio: 6/4, weight average molecular weight: | 0.10 g |
| 7,500, containing 0.5% by mass of unreacted cresol) | |
| Particular alkali-soluble resin (a) obtained in Synthesis Example 1 | |
| Cyanine dye A (having the foregoing structure) | 0.04 g |
| 2,4,6-tris(hexyloxy)benzenediazonium-2-hydroxy-4-methoxybenzophenone-5-sulfonate | 0.01 g |
| 4,4'-bishydroxyphenylsulfone | 0.002 g |
| Tetrahydrophthalic anhydride | 0.05 g |
| Ethyl violet | 0.015 g |
| Megafac F780-F (20% by mass) | 0.02 g |
| (fluorine-type surfactant for improving surface property, produced by Dainippon Ink and Chemicals, Inc.) | |
| Methyl ethyl ketone | 15 g |
| 1-Methoxy-2-propanol | 7 g |

The resulting planographic printing plate precursor was evaluated in the same manner as in Example 66. The obtained results were printing durability of 150,000 sheets and chemical resistance of 140,000 sheets. Accordingly, it was revealed that a good planographic printing plate precursor was obtained.

As detailed above, the present invention provides a positive-type planographic printing plate precursor that can directly form a printing plate by scanning exposure based on digital data and is excellent both in printing durability and chemical resistance.

What is claimed is:

1. A planographic printing plate precursor comprising a support having disposed thereon a recording layer that contains a polyimide precursor resin containing a structural unit represented by the following formula (1) and exerting water-insolubility and alkali-solubility, a development inhibitor and an infrared absorber, and exhibits enhanced solubility in an aqueous alkali solution through light exposure:

Formula (1)

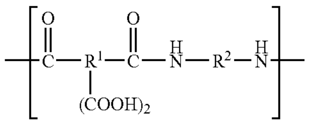

wherein $R^1$ represents a linking group containing at least one aromatic ring to which a —COOH group directly bonds; and $R^2$ represents an alkylene group, an arylene group or an aralkylene group.

2. The planographic printing plate precursor according to claim 1, wherein the polyimide precursor resin has a weight average molecular weight of from 3,000 to 100,000.

3. The planographic printing plate precursor according to claim 1, wherein the polyimide precursor resin is contained in an amount of from 20 to 90% by mass based on the total solid content of the recording layer.

4. A planographic printing plate precursor comprising a support having disposed thereon a recording layer including:

a lower layer containing a polyimide precursor resin having a structural unit represented by the following formula (1) and exerting water-insolubility and alkali-solubility; and an upper layer containing a water-insoluble and alkali-soluble resin and a development inhibitor and exhibiting enhanced solubility in an aqueous alkali solution through light exposure, wherein at least one of the lower layer and the upper layer of the recording layer contains an infrared absorber, Formula (1)

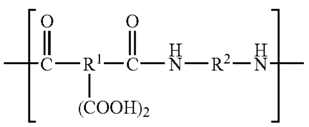

wherein $R^1$ represents a linking group containing at least one aromatic ring to which a —COOH group directly bonds; and $R^2$ represents an alkylene group, an arylene group or an aralkylene group.

5. The planographic printing plate precursor according to claim 4, wherein the polyimide precursor resin has a weight average molecular weight of from 3,000 to 100,000.

6. The planographic printing plate precursor according to claim 4, wherein the polyimide precursor resin is contained in an amount of from 40 to 90% by mass based on the total solid content of the lower layer.

7. A planographic printing plate precursor comprising a support having disposed thereon a recording layer that contains a water-insoluble and alkali-soluble resin having, as a basic skeleton, a reaction product formed using at least one kind of a diisocyanate compound represented by the following formula (I), at least one kind of a diol compound having a carboxylic group represented by the following general formulae (II), (III), and (IV), and a compound having a primary or secondary amine, a development inhibitor and an infrared absorber, and exhibits enhanced solubility in an aqueous alkali solution through light exposure:

Formula (I)

$OCN—R^1—NCO$

Formula (II)

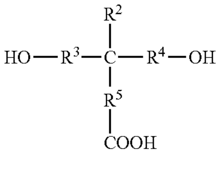

Formula (III)

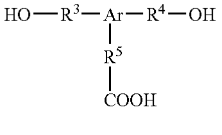

Formula (IV)

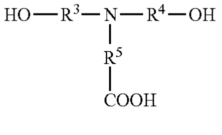

wherein $R^1$ represents a divalent linking group, $R^2$ represents a hydrogen atom, an alkyl group, an aralkyl group, an aryl group, an alkoxy group, or an aryloxy group, and $R^3$, $R^4$, and $R^5$, which may be the same or different, each represent a single bond or a divalent linking group.

8. The planographic printing plate precursor according to claim 7, wherein the resin has a weight average molecular weight of from 3,000 to 200,000.

9. The planographic printing plate precursor according to claim 7, wherein the resin is contained in an amount of 10% by mass or more relative to a total alkali-soluble resin in the recording layer.

10. A planographic printing plate precursor comprising a support having disposed thereon a recording layer including:

a lower layer containing a water-insoluble and alkali-soluble resin having a urea bond in a polymer main chain; and an upper layer containing a water-insoluble and alkali-soluble resin and a development inhibitor and exhibiting enhanced solubility in an aqueous alkali solution through light exposure, wherein at least one of the lower layer and the upper layer of the recording layer contains an infrared absorber.

11. The planographic printing plate precursor according to claim 10, wherein the resin having a urea bond in a polymer main chain has a weight average molecular weight of from 3,000 to 200,000.

12. The planographic printing plate precursor according to claim 10, wherein the resin having a urea bond in a polymer main chain is contained in an amount of 10% by mass or more relative to a total alkali-soluble resin in the lower layer of the recording layer.

13. A planographic printing plate precursor comprising a support having disposed thereon a recording layer that contains a water-insoluble and alkali-soluble resin having, as a basic skeleton, a reaction product formed using at least one kind of a diisocyanate compound represented by the following formula (I), at least one kind of a diol compound having a carboxylic group represented by the following formulae (II), (III) and (IV), and at least one kind of a diol compound represented by the following formulae (V) and (VI), a development inhibitor and an infrared absorber, and exhibits enhanced solubility in an aqueous alkali solution through light exposure:

Formula (I)

$$OCN—R^1—NCO$$

Formula (II)

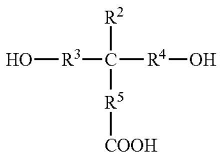

-continued

Formula (III)

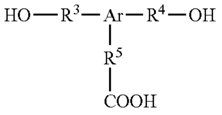

Formula (IV)

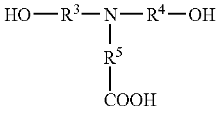

Formula (V)

$$HO—R^6—HNOC—R^7—CONH—R^6—OH$$

Formula (VI)

$$HO—R^7—CONH—R^6—OH$$

wherein $R^1$ represents a divalent linking group, $R^2$ represents a hydrogen atom, an alkyl group, an aralkyl group, an aryl group, an alkoxy group, or an aryloxy group, $R^3$, $R^4$, and $R^5$, which may be the same or different, each represent a single bond or a divalent linking group, and $R^6$ and $R^7$, which may be the same or different, each represent a divalent linking group and may be bonded to each other to form a cyclic structure.

14. The planographic printing plate precursor according to claim 13, wherein the resin has a weight average molecular weight of from 5,000 to 200,000.

15. The planographic printing plate precursor according to claim 13, wherein the resin is used in combination with a novolak resin.

16. A planographic printing plate precursor comprising a support having disposed thereon a recording layer including:

a lower layer containing a water-insoluble and alkali-soluble polyurethane resin; and an upper layer containing a water-insoluble and alkali-soluble resin and a development inhibitor and exhibiting enhanced solubility in an aqueous alkali solution through light exposure, wherein at least one of the lower layer and the upper layer of the recording layer contains an infrared absorber, wherein the polyurethane resin is contained in the lower layer in an amount of 55 to 95% by mass.

* * * * *